(12) United States Patent  
Yager et al.

(10) Patent No.: US 6,904,073 B2  
(45) Date of Patent: Jun. 7, 2005

(54) HIGH POWER DEEP ULTRAVIOLET LASER WITH LONG LIFE OPTICS

(75) Inventors: Thomas A. Yager, Encinitas, CA (US); William N. Partlo, Poway, CA (US); Richard L. Sandstrom, Encinitas, CA (US); Xiaojiang Pan, San Diego, CA (US); John T. Melchior, San Diego, CA (US); John Martin Algots, San Diego, CA (US); Matthew Ball, Escondido, CA (US); Alexander I. Ershov, San Diego, CA (US); Vladimir Fleurov, Escondido, CA (US); Walter D. Gillespie, Poway, CA (US); Holger K. Glatzel, San Diego, CA (US); Leonard Lublin, Concord, MA (US); Elizabeth Marsh, Melrose, MA (US); Richard G. Morton, San Diego, CA (US); Richard C. Ujazdowski, Poway, CA (US); David J. Warkentin, Boston, MA (US); R. Kyle Webb, Escondido, CA (US)

(73) Assignee: Cymer, Inc., San Diego, CA (US)

( * ) Notice: Subject to any disclaimer, the term of this patent is extended or adjusted under 35 U.S.C. 154(b) by 186 days.

(21) Appl. No.: 10/384,967

(22) Filed: Mar. 8, 2003

(65) Prior Publication Data

US 2003/0219056 A1 Nov. 27, 2003

Related U.S. Application Data

(63) Continuation-in-part of application No. 10/233,253, filed on Aug. 30, 2002, now Pat. No. 6,704,339, which is a continuation-in-part of application No. 10/141,216, filed on May 7, 2002, now Pat. No. 6,693,939, which is a continuation-in-part of application No. 10/036,676, filed on Dec. 21, 2001, which is a continuation-in-part of application No. 10/036,727, filed on Dec. 21, 2001, which is a continuation-in-part of application No. 10/006,913, filed on Nov. 29, 2001, now Pat. No. 6,535,531, which is a continuation-in-part of application No. 10/000,991, filed on Nov. 14, 2001, now Pat. No. 6,795,474, which is a continuation-in-part of application No. 09/943,343, filed on Aug. 29, 2001, now Pat. No. 6,567,450, which is a continuation-in-part of application No. 09/854,097, filed on May 11, 2001, now Pat. No. 6,757,316, which is a continuation-in-part of application No. 09/848,043, filed on May 3, 2001, now Pat. No. 6,549,551, which is a continuation-in-part of application No. 09/829,475, filed on Apr. 9, 2001, now Pat. No. 6,765,945, which is a continuation-in-part of application No. 09/771,789, filed on Jan. 29, 2001, now Pat. No. 6,539,042.

(60) Provisional application No. 60/445,715, filed on Feb. 7, 2003, provisional application No. 60/443,673, filed on Jan. 28, 2003, provisional application No. 60/442,579, filed on Jan. 24, 2003, provisional application No. 60/426,888, filed on Nov. 15, 2002, and provisional application No. 60/412,349, filed on Sep. 20, 2002.

(51) Int. Cl.$^7$ .................................................. H01S 3/223  
(52) U.S. Cl. ..................................... 372/57; 372/55  
(58) Field of Search ..................................... 372/55, 57

(56) References Cited

U.S. PATENT DOCUMENTS

| | | |
|---|---|---|
| 4,223,279 A | 9/1980 | Bradford, Jr. et al. ..... 331/94.5 |
| 4,455,658 A | 6/1984 | Sutter .......................... 372/38 |
| 4,959,840 A | 9/1990 | Akins et al. .................. 372/57 |
| 5,023,884 A | 6/1991 | Akins et al. .................. 372/57 |
| 5,025,445 A | 6/1991 | Anderson et al. ............. 372/20 |
| 5,025,446 A | 6/1991 | Kuizenga ..................... 372/21 |
| 5,189,678 A | 2/1993 | Ball et al. ..................... 372/28 |
| 5,313,481 A | 5/1994 | Cook et al. ................... 372/37 |
| 5,315,611 A | 5/1994 | Ball et al. ..................... 372/56 |
| 5,359,620 A | 10/1994 | Akins ......................... 372/58 |
| 5,448,580 A | 9/1995 | Birx et al. .................... 372/38 |
| 5,471,965 A | 12/1995 | Kapich ....................... 123/565 |
| 5,771,258 A | 6/1998 | Morton et al. ................ 372/57 |
| 5,852,621 A | 12/1998 | Sandstrom .................... 372/25 |
| 5,863,017 A | 1/1999 | Larson et al. ............. 248/176.1 |
| 5,953,360 A | 9/1999 | Vitruk et al. ................. 372/87 |
| 5,978,394 A | 11/1999 | Newman et al. .............. 372/32 |
| 5,982,800 A | 11/1999 | Ishihara et al. ............... 372/57 |
| 5,991,324 A | 11/1999 | Knowles et al. .............. 372/57 |
| 6,005,879 A | 12/1999 | Sandstrom et al. ........... 372/25 |
| 6,014,398 A | 1/2000 | Hofmann et al. ............. 372/60 |
| 6,016,325 A | 1/2000 | Ness et al. .................... 372/38 |
| 6,018,537 A | 1/2000 | Hofmann et al. ............. 372/25 |
| 6,028,880 A | 2/2000 | Carlesi et al. ................ 372/58 |

| | | |
|---|---|---|
| 6,067,311 A | 5/2000 | Morton et al. .................. 372/57 |
| 6,094,448 A | 7/2000 | Fomenkov et al. .......... 372/102 |
| 6,104,735 A | 8/2000 | Webb ............................ 372/37 |
| 6,128,323 A | 10/2000 | Myers et al. ................... 372/38 |
| 6,151,349 A | 11/2000 | Gong et al. .................... 372/58 |
| 6,164,116 A | 12/2000 | Rice et al. .................... 73/1.72 |
| 6,188,710 B1 | 2/2001 | Besaucele et al. ............. 372/60 |
| 6,192,064 B1 | 2/2001 | Algots et al. ................... 372/99 |
| 6,208,674 B1 | 3/2001 | Webb et al. .................... 372/57 |
| 6,208,675 B1 | 3/2001 | Webb ............................ 372/58 |
| 6,212,211 B1 | 4/2001 | Azzola et al. .................. 372/33 |
| 6,219,368 B1 | 4/2001 | Govorkov ..................... 372/59 |
| 6,240,117 B1 | 5/2001 | Gong et al. .................... 372/58 |
| 6,317,447 B1 | 11/2001 | Partlo et al. .................... 372/57 |
| 6,330,261 B1 | 12/2001 | Ishihara et al. ............. 372/38.1 |
| 6,359,922 B1 | 3/2002 | Partlo et al. .................... 372/58 |
| 6,414,979 B2 | 7/2002 | Ujazdowski et al. .......... 372/87 |
| 6,466,365 B1 | 10/2002 | Maier et al. ................. 359/355 |
| 6,477,193 B2 | 11/2002 | Oliver et al. .................. 372/58 |
| 6,768,762 B2 * | 7/2004 | Sparrow ....................... 372/57 |
| 2002/0021728 A1 | 2/2002 | Newman et al. .............. 372/55 |
| 2002/0105994 A1 | 8/2002 | Partlo et al. .................... 372/57 |
| 2002/0122450 A1 * | 9/2002 | Sparrow ....................... 372/57 |

OTHER PUBLICATIONS

J. H. Burnett, et al. "Symmetry of spatial–dispersion–induced birefringence and its implication for CaF$_2$ ultraviolet optics," *JM*, vol. 1(3), Oct. 2002.

* cited by examiner

*Primary Examiner*—Don Wong
*Assistant Examiner*—Hung Tran Vy
(74) *Attorney, Agent, or Firm*—William C. Cray; Cymer, Inc.

(57) ABSTRACT

The present invention provides long life optics for a modular, high repetition rate, ultraviolet gas discharge laser systems producing a high repetition rate high power output beam. The invention includes solutions to a surface damage problem discovered by Applicants on CaF$_2$ optics located in high pulse intensity sections of the output beam of prototype laser systems. Embodiments include an enclosed and purged beam path with beam pointing control for beam delivery of billions of output laser pulses. Optical components and modules described herein are capable of controlling ultraviolet laser output pulses with wavelength less than 200 nm with average output pulse intensities greater than $1.75 \times 10^6$ Watts/cm$^2$ and with peak intensity or greater $3.5 \times 10^6$ Watts/cm$^2$ for many billions of pulses as compared to prior art components and modules which failed after only a few minutes in these pulse intensities. Techniques and components are disclosed for minimizing the potential for optical damage and for reducing the pulse energy density to less than $100 \times 10^{-6}$ J/cm$^3$. Important improvements described in this specification have been grouped into the following subject matter categories: (1) Solution to CaF$_2$ surface damage discovered by Applicants, (2) description of a high power ArF MOPA laser system, (3) description of beam delivery units, (4) polarization considerations (5) a high speed water-cooled auto shutter energy detector module and (6) other improvements.

87 Claims, 46 Drawing Sheets

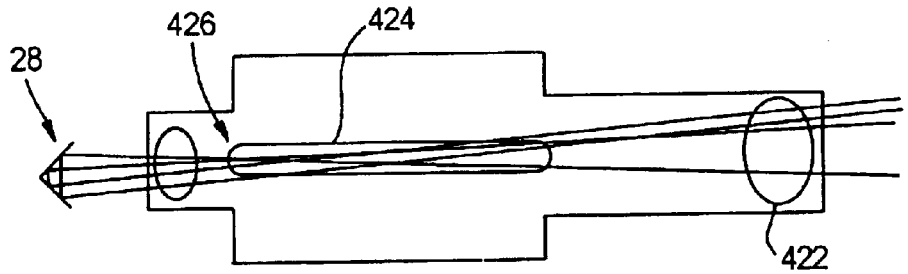
FIG. 1B(1)
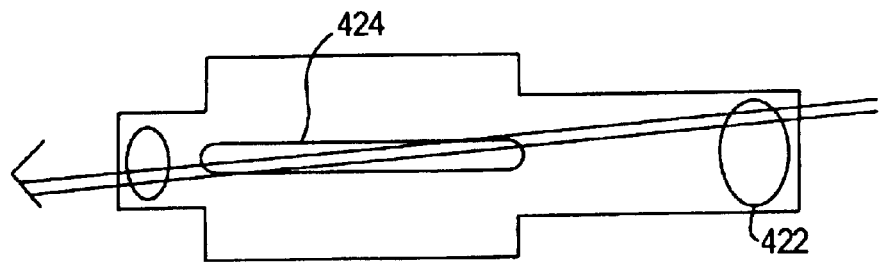
FIG. 1B(2)
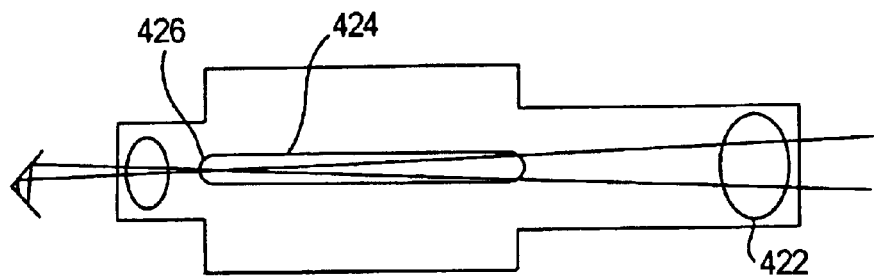
FIG. 1B(3)

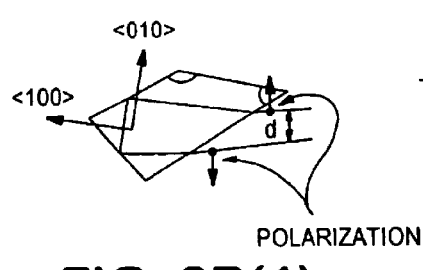
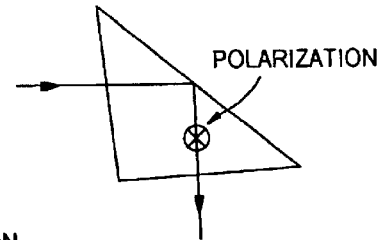
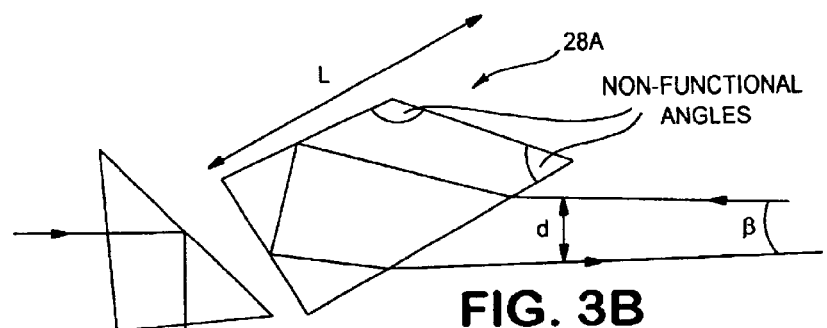
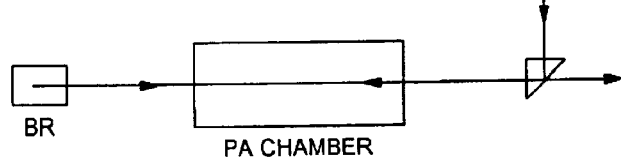
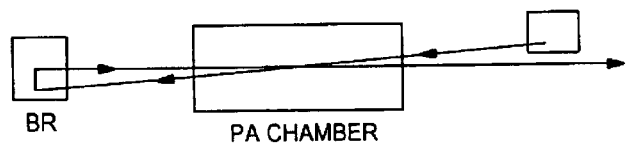

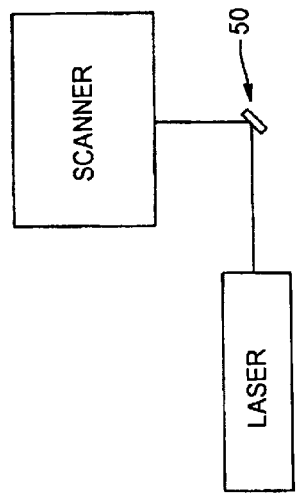
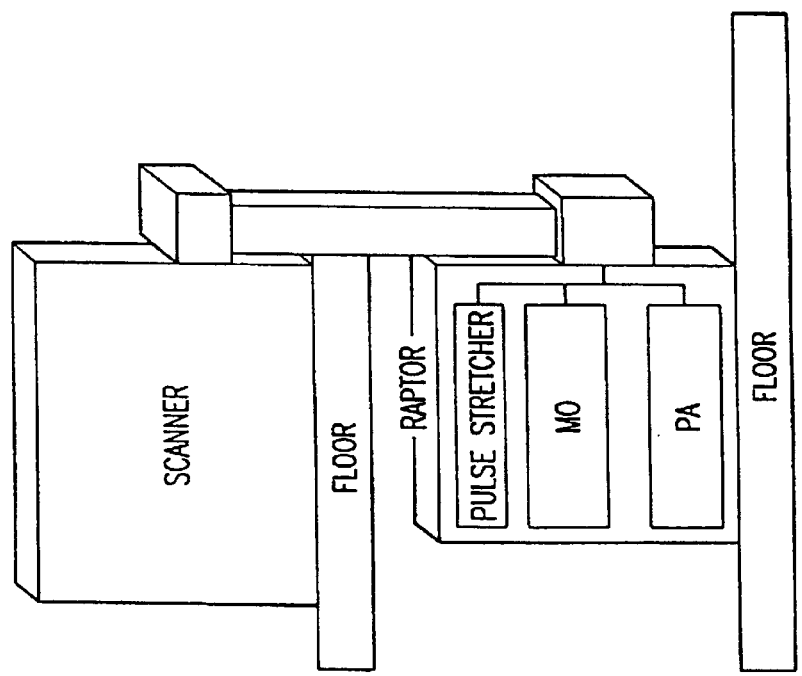
FIG. 4D
FIG. 4C

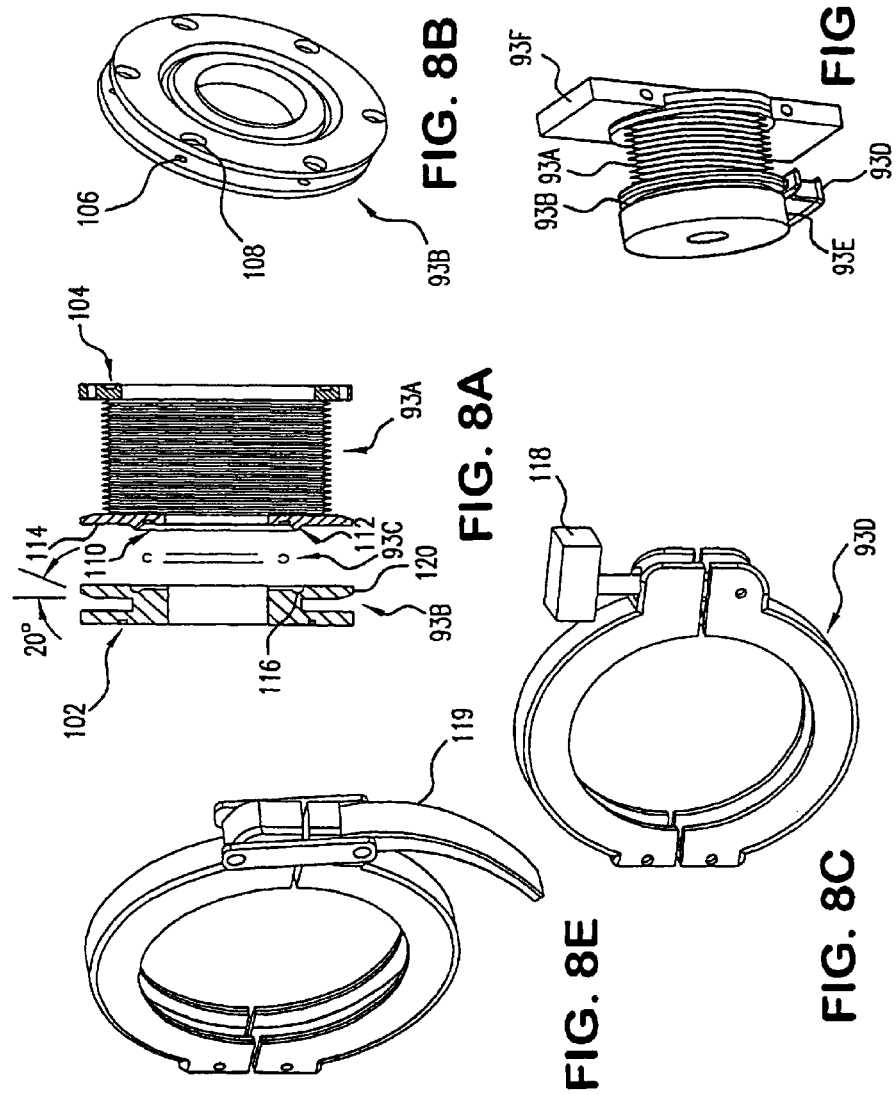

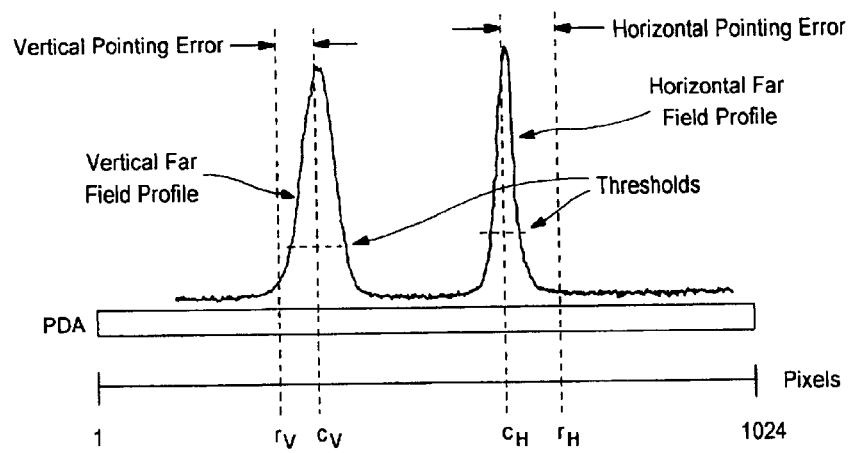
FIG. 10C
FIG. 10D2
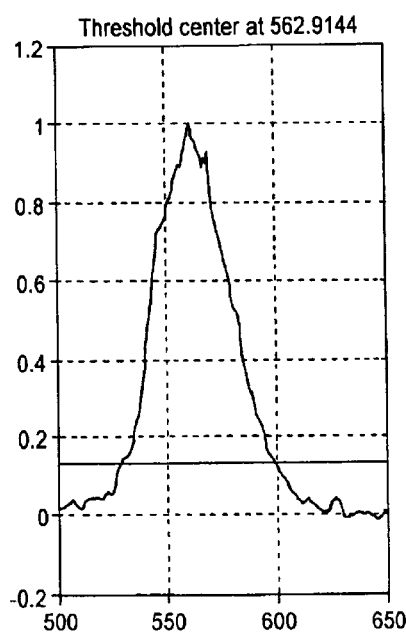
FIG. 10D1
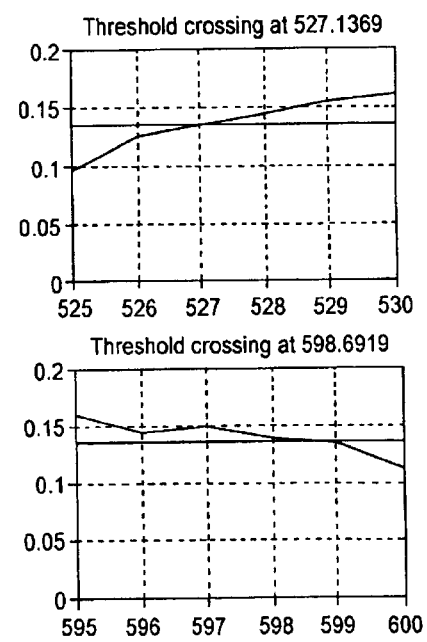
FIG. 10D3

Fast Steering Motor

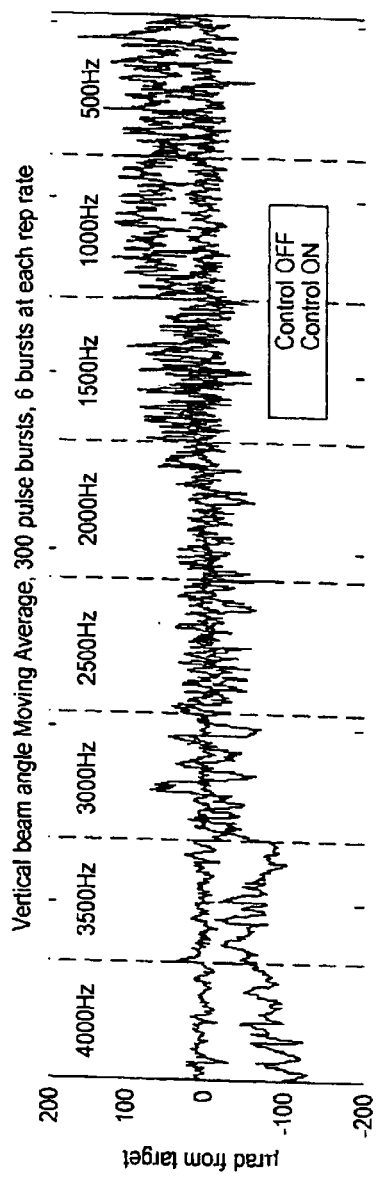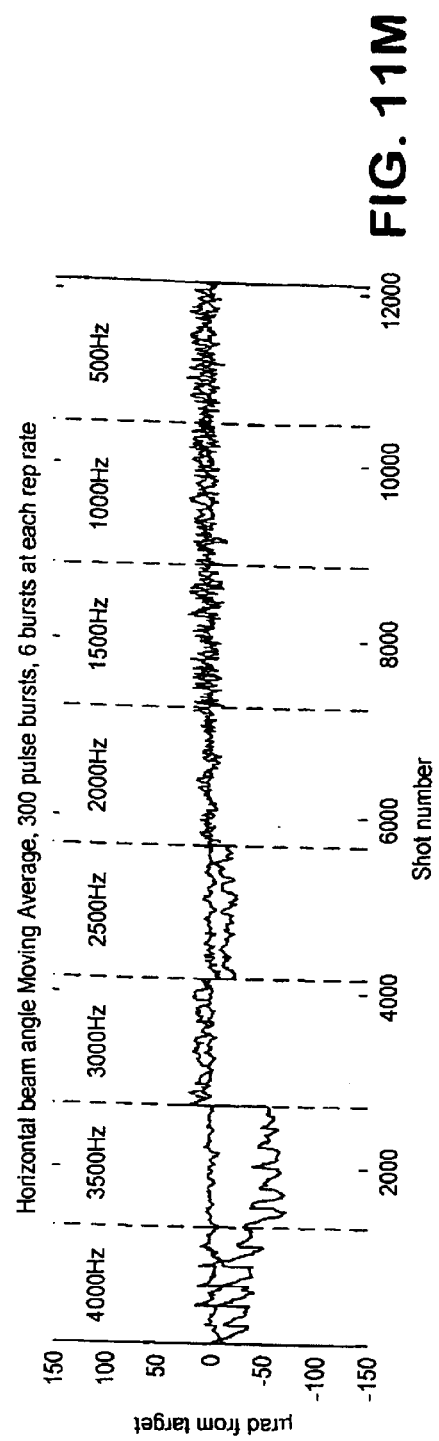
FIG. 11M

Changing incident angle does not change state of polarization

US 6,904,073 B2

HIGH POWER DEEP ULTRAVIOLET LASER WITH LONG LIFE OPTICS

The present invention is a continuation-in-part of Ser. No. 10/233,253 filed Aug. 30, 2002, now U.S. Pat. No. 6,704,339, which is a CIP of Ser. No. 10/141,216 filed May 7, 2002, now U.S. Pat. No. 6,693,939 Ser. No. 10/036,676, filed Dec. 21, 2001, Ser. No. 10/036,727 filed Dec. 21, 2001, Ser. No. 10/006,913 filed Nov. 29, 2001 now U.S. Pat. No. 6,535,531, Ser. No. 10/000,991 filed Nov. 14, 2001, now U.S. Pat. No. 6,795,474, Ser. No. 09/943,343, filed Aug. 29, 2001, now U.S. Pat. No. 6,567,450, Ser. No. 09/854,097, filed May 11, 2001, now U.S. Pat. No. 6,757,316, Ser. No. 09/848,043, filed May 3, 2001, now U.S. Pat. No. 6,549,551, and Ser. No. 09/829,475 filed Apr. 9, 2001 now U.S. Pat. No. 6,765,945, and Ser. No. 09/771,789 filed Jan. 29, 2001, now U.S. Pat. No. 6,539,042, (all of which are incorporated herein by reference) and claims priority based on Ser. No. 60/445,715 filed Feb. 7, 2003, Ser. No. 60/443,673 filed Jan. 28, 2003, Ser. No. 60/442,579 filed Jan. 24, 2003, Ser. No. 60/426,888 filed Nov. 15, 2002, and Ser. No. 60/412,349 filed Sep. 20, 2002. This invention relates to high power short pulse deep ultraviolet lasers and in particular to output beam optical components for such lasers capable of long-life service.

BACKGROUND OF THE INVENTION

Electric Discharge Gas Lasers

Electric discharge gas lasers are well known and have been available since soon after lasers were invented in the 1960s. A high voltage discharge between two elongated electrodes excites a laser gas to produce a gaseous gain medium. The laser gas determines the type of laser. Krypton and fluorine are the active gases in the KrF laser; argon and fluorine are the active gases in the ArF lasers and fluorine is the active gas in the $F_2$ laser. These lasers typically also include a buffer gas such as helium and/or neon. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric discharge gas laser and they have been known since the mid 1970s. A description of an excimer laser, useful as an ultraviolet light source for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser.

These excimer lasers, when used for integrated circuit lithography, are typically operated in an integrated circuit fabrication line "around-the-clock" producing many thousands of valuable integrated circuits per hour; therefore, downtime can be very expensive. For this reason most of the components are organized into modules which can be replaced within a few minutes. Excimer lasers currently used for lithography typically must have its output beam reduced in bandwidth to a fraction of a picometer. This "line-narrowing" is typically accomplished in a line-narrowing module (called a "line narrowing package" or "LNP" for KrF and ArF lasers) which forms the back of the laser's resonant cavity (A line selection unit "LSU" is often used for selecting a narrow spectral band in the $F_2$ laser). Electric discharge gas lasers of the type described in Patent '884 utilize an electric pulse power system to produce the electrical discharges, between the two elongated electrodes. In such prior art systems, a direct current power supply charges a capacitor bank called a "charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

Major Advances in Lithography Light Sources

Excimer lasers such as described in the '884 patent, during the period 1989 to the present, have become the primary light source for integrated circuit lithography. More than 1000 of these lasers are currently in use in the most modern integrated circuit fabrication plants. Almost all of these lasers have the basic design features described in the '884 patent.

These are:

(1) a single, pulse power system for providing electrical pulses across the electrodes at pulse rates of about 100 to 4000 pulses per second;

(2) a single resonant cavity comprised of a partially reflecting mirror-type output coupler and a line narrowing unit consisting of a prism beam expander, a tuning mirror and a grating;

(3) a single discharge chamber containing a laser gas (either krypton, fluorine and neon for KrF laser or argon, fluorine and neon for ArF), two elongated electrodes separated by a discharge region and a tangential fan for circulating the laser gas between the two electrodes fast enough to clear the discharge region between pulses, and (4) a beam monitor for monitoring pulse energy, wavelength and bandwidth of output pulses with a feedback control system for controlling pulse energy, energy dose and wavelength on a pulse-to-pulse basis.

During the 1989–2002 period, output power of these lasers has increased gradually and beam quality specifications for pulse energy stability, wavelength stability and bandwidth have become increasingly tighter. Operating parameters for a popular 248 nm KrF lithography laser model used widely in integrated circuit fabrication include pulse energy at about 8 mJ, pulse rate at 2,500 pulses per second (providing an average beam power of up to about 20 watts), bandwidth at about 0.5 pm full width half maximum (FWHM) and pulse energy stability at +/−0.35%. A 193 nm ArF laser system is currently in use operates at 4000 Hz with pulse energies of about 5 mJ. The beam cross-section is about 0.27 $cm^2$ so that the average fluence is about 18.5 $mJ/cm^2$ and the time average pulse intensity for 20 ns pulses is about $1 \times 10^6$ Watts/$cm^2$. $CaF_2$ optical elements are typically used for windows, beam splitters and for controlling output beam.

Injection Seeding

A well-known technique for reducing the bandwidth of gas discharge laser systems (including excimer laser systems) involves the injection of a relatively low energy narrow band "seed" beam into a gain medium for amplification. In some of these systems a laser producing the seed beam called a "master oscillator" is designed to produce a very narrow bandwidth beam in a first gain medium at relatively low pulse energy, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated to build and operate than comparable single chamber laser systems. Therefore, commercial application of these two chamber laser systems in production line applications has been limited.

Separation of Lithography Machine from Light Source

For integrated circuit fabrication the lithography machine is typically located separate from the lithography laser light source. The separation is typically 2 to 20 meters. Sometimes the laser and the lithography machine are located in separate rooms. A typical practice is to locate the laser in a room one floor below the lithography machine. The laser beam is ultraviolet at wavelengths of about 248 nm for KrF lasers, 193 nm for ArF lasers and 157 nm for $F_2$ lasers. Ultraviolet light especially at the shorter wavelengths of the ArF and $F_2$ lasers is absorbed by oxygen, therefore there is a well-known practice of enclosing the laser beam path between the laser and the lithography machine in an enclosure and purging the enclosure with a gas such as nitrogen which provides much lower beam attenuation than air. Included within the enclosure also are a variety of optical components including mirrors and lenses for directing the laser beam to a desired beam entrance port in the lithography machine and providing any needed modification to the beam, such as changes in cross-sectional profile. The equipment for delivering the laser beam from the laser system to the lithography machine is called a beam delivery unit or "BDU" for short. In the past the BDU has typically been designed and supplied separate from the laser light source.
Pulse Intensity and Pulse Energy Density, Pulse Energy, Pulse Fluence, Pulse Power Only a very few materials are available for use as transmissive optical elements for the ultraviolet light produced by the KrF, ArF and $F_2$ lasers. As the output pulse energy of the laser beam increases and the frequency of the ultraviolet light increases providing optical components (such as windows prisms and beam splitters) capable of high quality performance for billions of pulses becomes more difficult. For KrF lasers operating at 248 nm, fused silica was used extensively for optical components. Beginning in the mid to late 1990's, ArF lasers operating at 193 nm began to replace 248 nm KrF lasers and $CaF_2$ optics began to replace the fused silica optics, at the present time most of the refractive optics used in new laser lithography light sources are $CaF_2$ optics. Typical maximum output pulses for ArF lasers have pulse energies of about 5 mJ and a typical beam cross-section is about 3 mm×9 mm (i.e., 0.27 cm$^2$). The effective pulse duration (called the integral square pulse duration $t_{IS}$ as described later) of about 25 ns which at the speed of light corresponds to a pulse about 7500 mm long. With this example we can define by example several technical phrases (for purposes of this specification and the claims of this application) which are important in terms of potential damage to optical components.

The "pulse energy" in the above example is 5 mJ. The "pulse fluence" would be 18.5 mJ/cm$^2$ (i.e., 5 mJ/3 mm×9 mm). The "pulse power" would be 0.2×10$^6$ Watts (i.e., 5 mJ/25×10$^{-9}$ sec). The "average pulse intensity" or "pulse intensity" would be 0.74×10$^6$ Watts/cm$^2$, i.e., (18.5 mJ/cm$^2$)/(25×10$^{-9}$ sec). The "pulse energy density" would be 25×10$^{-6}$J/cm$^3$ (i.e., 18.5 mJ/3 mm×9 mm×7500 mm). Another way of describing the pulse energy density would be as an 18.5 mJ/cm$^2$ pulse divided by the $t_{IS}$ pulse duration of 25 ns, which would give us 0.74×10$^6$ J/cm$^2$-s. If this number is then divided by the speed of light we get our 25×10$^{-6}$ J/cm$^3$.

We can also refer to the pulse photon density or "average pulse photon density" since we know that the energy of a 193 nm photon is about 1×10$^{-18}$ J. Therefore, in these prior art 5 mJ, 25 ns, 3 mm×9 mm pulses the density of the photons or the average pulse photon density is about 91×10$^{12}$ photons/cm$^3$. Because of the spatial and temporal variations within pulses, "peak" values of pulse intensity, pulse energy density and photon density are at least about 2–4 times the "average" values. For prior art ArF lasers $CaF_2$ optics have handled very satisfactorily beam fluences averaging up to about 20 to 44 mJ/cm$^2$.

$CaF_2$ Optics-Surface Coatings

High quality uncoated $CaF_2$ crystal optical elements are capable of operation with these output pulses for billions of pulses without substantial degradation. Coatings may be applied to the surfaces of the $CaF_2$ optical elements to manipulate the laser beam. For example, one or more thin layers may be applied to reduce surface reflections or to increase surface reflections or to split the beam based on the polarization of the light in the beam. Most of the available materials used in the past for these coating layers (such as $Al_2O_3$, $MgF_2$, $AlF_3$, $GdF_3$ and $LaF_3$) will not survive billions of the very high output pulses referred to in the previous section.

A special coating material has recently been developed by Corning, Inc. (Corning, N.Y.) for manipulating the laser beam such as by decreasing reflection or to provide a polarizing beam splitter. This coating is comprised of silicon oxyfluoride and is applied as a manipulating film to $CaF_2$ optics using one of the several techniques disclosed in U.S. Pat. No. 6,466,365 which is incorporated by reference herein. According to the teachings of this patent this silicon oxyfluoride coating also functions as a protective coating to protect the underlying $CaF_2$ material from scratches and moisture damage since the silicon oxyfluoride has a hardness greater than $CaF_2$ and is non-hydroscopic whereas $CaF_2$ is hydroscopic.

There is a need for 193 nm ArF and 157 nm $F_2$ lithography lasers that are capable of providing output beams with pulse energies about twice or three times as large as prior art pulse energies and for optical elements to direct the output beam to lithography equipment of the future. Pulses such as 20 ns pulses with average energies of about 15 mJ per pulse (with a 0.27 cm$^2$ cross-section) produce average pulse fluences of about 56 mJ/cm$^2$ at the output of the laser with peak values of pulse fluences a few times larger and pulse intensities of about 2.8×10$^6$ W/cm$^2$. Lifetime specifications for the optical equipment for these lasers are in the range of at least several billion pulses.

What is needed is a better laser design for a pulse gas discharge laser producing ultraviolet laser pulses at wavelengths less than 200 nm and with average pulse intensities greater than $2.8 \times 10^6$ W/cm$^2$, and with a capability of trouble-free operations at pulse repetitions rates greater than 2000 pulses per second for billions of pulses while maintaining or improving laser beam quality parameters (including wavelength, bandwidth, pulse energy, beam pointing angle, beam position and cross-sectional profile) needed by the lithography machine. Associated requirements are long-life components for conveying the laser light from the laser output to the entrance port of lithography machines.

SUMMARY OF THE INVENTION

The present invention provides long life optics for a modular, high repetition rate, ultraviolet gas discharge laser systems producing a high repetition rate high power output beam. The invention includes solutions to a surface damage problem discovered by Applicants on $CaF_2$ optics located in high pulse intensity sections of the output beam of prototype laser systems. Embodiments include an enclosed and purged beam path with beam pointing control for beam delivery of billions of output laser pulses. Optical components and modules described herein are capable of controlling ultraviolet laser output pulses with wavelength less than 200 nm with average output pulse intensities greater than $1.75 \times 10^6$ Watts/cm$^2$ and with peak intensity or greater $3.5 \times 10^6$ Watts/cm$^2$ for many billions of pulses as compared to prior art components and modules which failed after only a few minutes in these pulse intensities. Techniques and components are disclosed for minimizing the potential for optical damage and for reducing the pulse energy density to less than $100 \times 10^{-6}$ J/cm$^3$. Important improvements described in this specification have been grouped into the following subject matter categories: (1) Solution to $CaF_2$ surface damage discovered by Applicants, (2) description of a high power ArF MOPA laser system, (3) description of beam delivery units, (4) polarization considerations (5) a high speed water-cooled auto shutter energy detector module and (6) other improvements.

$CaF_2$ Surface Damage Problem and Solutions

Applicants have tested $CaF_2$ optical components with 20 ns ArF laser pulses at fluences up to about 300 mJ/cm$^2$ and have discovered that at average fluences in the range of about 44 mJ/cm$^2$ to 260 mJ/cm$^2$ both front and back surfaces of $CaF_2$ optical elements (even with very high quality control of the optical environment) are destroyed after only a few minutes or hours of laser operation. This was a great surprise to Applicants since $CaF_2$ optics performs very well for billions of pulses at fluences below about 16 mJ/cm$^2$. Applicants believe that the cause of the destruction is fluorine removal from the $CaF_2$ crystal surfaces caused by the high intensity ultraviolet pulses. Applicants' suspect that the damage is due a process known as a multi-photon process in which the combined energy of two photons is sufficient to dislodge an atom of fluorine from the surface $CaF_2$ crystal structure. Applicants have developed several solutions to this problem which may be utilized individually or in combination. These solutions have resulted from Applicants important discovery that the surface damage results from fluorine removal by the ultraviolet pulses.

Thus, a first preferred technique for avoiding $CaF_2$ surface damage is to provide an $F_2$ gas-containing environment at the optical surfaces of all at-risk optical components. Applicants' experiments have shown that this eliminates the surface destruction. Applicants suspect that fluorine atoms or molecules (1) collect on the surface of the components forming a protective layer to prevent the destroying of fluorine atoms which form part of the $CaF_2$ crystal surface of the optical components and/or (2) quickly replace any fluorine atom which is dislodged from the surface.

A second preferred solution is to focus the seed beam near the upstream edge of the power amplifier discharge region for its final pass through the discharge region. Thus, the seed beam will grow in cross-section as it is amplified on its last pass through the PA and will continue to grow in cross-section after it exits the discharge region. By elongating the PA chamber window unit to place the output window about 55 cm downstream of the discharge, the beam will diverge enough that its fluence in reduced to less than 16 mJ/cm$^2$ at the output so that surface damage to the window is avoided.

A third preferred solution is to allow the output beam from the laser system to diverge naturally until its peak pulse fluence (mJ/cm$^2$) for approximately 20 ns pulses is reduced to fluence levels (about 20-44 mJ/cm$^2$) so that prior art $CaF_2$ optical elements can handle the fluences without damage. The natural divergence of prior art excimer lasers about 0.6 milliradians in the horizontal and 1.0 milliradians in the vertical. At these rates the cross-section of the beam is approximately double after 4 meters. In a preferred embodiment, a beam expansion tube extending out from the output aperture of the laser for a few meters which results in a 50 percent or more reduction in the pulse intensity of the beam. Several techniques are available for increasing the divergence of the output beam.

A fourth solution preferred (which is a subset of the first solution) is to provide beam expansion optics immersed in an $F_2$ environment at the output of the laser. The optics could be within the laser chamber $F_2$ environment of just outside the chamber environment in a separate chamber containing sufficient $F_2$ gas. In a preferred embodiment a two-prism beam expander replaces the chamber output window. By the time the beam reaches the only surface of the two-prism beam expander which is not protected by chamber F2 at the beam cross-section has expanded sufficiently so that the unprotected surface can handle the fluence.

A fifth solution is to use $CaF_2$ optical elements coated with films of silicon oxyfluoride for protection of the substrate $CaF_2$. Applicants have proved these coatings, previously developed for manipulating laser beams, are useful for providing some protection of the surface of the $CaF_2$ damage caused by double photon fluorine ejection. These oxyfluoride coated $CaF_2$ elements have been shown to extend the life of the $CaF_2$ optics.

In a sixth solution, $CaF_2$ optical elements are first exposed to fluorine gas to produce a fluorine film on the surface. Then that surface is coated with a thin hard coating layer such as $SiO_2$ to trap the fluorine layer against the surface of $CaF_2$ substrate. Preferably, the coating process is carried out in the same chamber in which the fluorine film was applied so that the fluorine film is trapped between the $CaF_2$ substrate and the coating layer as well as within the $SiO_2$ protective layer.

Another potential solution to the $CaF_2$ surface problem is to switch to $MgF_2$ optics which can handle higher fluences than $CaF_2$. The $MgF_2$ optics may also be coated with coatings referred to above or utilized in an $F_2$ environment. In preferred embodiments combinations of two or more of the above solutions are utilized.

MOPA Laser System

In a preferred laser system two separate discharge chambers are provided, one of which is a part of a master oscillator producing a very narrow band seed beam which is amplified in the second discharge chamber, a power amplifier. This MOPA system is capable of greatly improved beam quality and with output pulse energies more than double typical prior art single chamber laser system. A pulse stretcher more than doubles the output pulse length resulting in a reduction in peak pulse power (mJ/ns) during the pulse. The beam is also expanded in cross-section to reduce the peak fluence (mJ/cm$^2$). This preferred embodiment is capable of providing illumination at a lithography system wafer plane which is approximately constant throughout the operating life of the lithography system, despite substantial degradation of optical components. The greater power output capabilities of the laser system permit operators to operate at partial power output early in system life and to increase output power later in life to compensate for optics degradation.

Beam Delivery Unit

A preferred beam delivery unit for converging the high pulse energy beams from the above MOPA system to a lithography machine.

Polarization Considerations

A switch from CaF$_2$ to MgF$_2$ optics means that the MgF$_2$ optics must be designed and used in a manner such that the well-known birefringence of MgF$_2$ is properly dealt with. Applicants have also discovered that at the high pulse energy output of the above MOPA systems, CaF$_2$ optics develop birefringence properties. Techniques are disclosed for fabrication of the optics and for orienting the optics to minimize the birefringent effects.

Shutter Energy Monitor

A novel water-cooled high-speed combination shutter energy monitor is described

Other Optical Improvements

Also, described herein are other optical features of a modular MOPA ultraviolet laser systems including (1) techniques for providing constant power and beam quality for the useful life of a lithography system, (2) improved beam path purge techniques, (3) a beam path quality monitoring (4) coherence scrambling (5) pulse energy detection at wafer plane and (6) an optics monitoring technique.

BRIEF DESCRIPTION OF THE DRAWINGS

FIGS. 3A, 3B, 3C, 3D, 3E, 3F, 3G and 3H show features of a relay optics for the FIG. 1 laser system.

FIGS. 4A, 4B, 4C and 4D show beam delivery configurations.

FIGS. 8A–8F show an easily sealing bellows seal.

FIGS. 10C and 10D1-3 show techniques for monitoring pointing error.

DETAILED DESCRIPTION OF PREFERRED EMBODIMENTS

CAF$_2$ Optical Surface Damage

Discovery of Surface Damage Problem

Applicants' testing with ArF MOPA systems described herein has revealed that prior art CaF$_2$ optics can suffer severe surface degradation when subjected to 20 ns pulses of 193 nm ultraviolet radiation at the average pulse fluence levels in the range of about 44 mJ/cm$^2$ to about 130 mJ/cm$^2$. The damage occurs at both the beam entrance surface and the exit surface even when the optics are purged with high quality purge gases such as nitrogen and helium. With 20 ns pulses and with average fluences below 20 mJ/cm$^2$ and with a good purge, the CaF$_2$ optics performs very well for billions of pulses. In the range between 20 mJ/cm$^2$ to 100 mJ/cm$^2$ lifetime is uncertain and hard to predict. At fluences greater than 100 mJ severe damage to the surfaces of the optics occurs almost immediately. Applicants discovered to their surprise that no damage occurs on the inside surface of the laser chamber output window at high pulse fluences in the above ranges. The inside surface is exposed to a 0.1% F$_2$ laser gas environment at about 3 atm pressure, whereas the outside surface is exposed to a nitrogen purge gas. The outside surface is damaged at fluences in ranges described above.

Optics at Risk in MOPA Laser System

Figure 1:
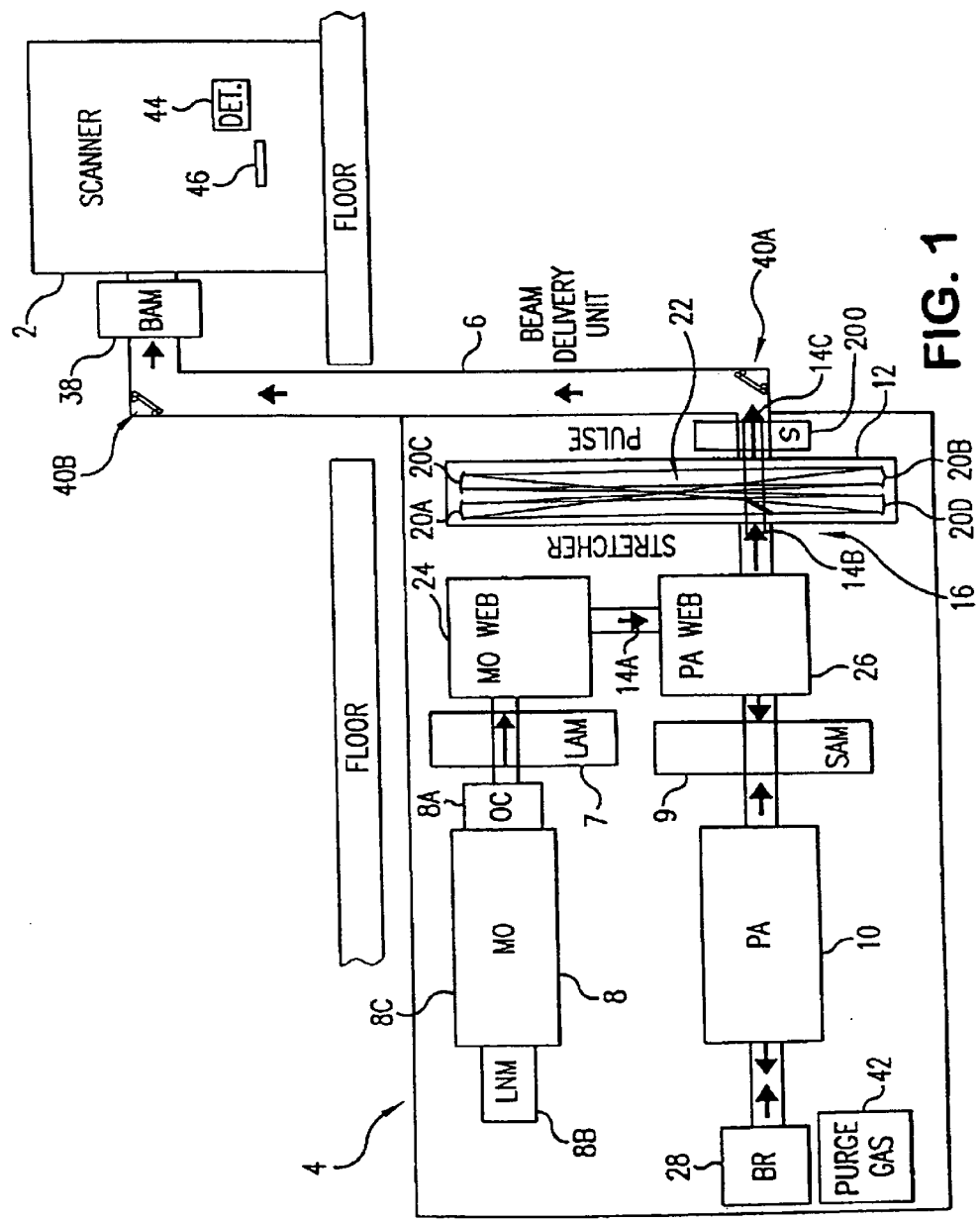
FIGS. 1 through 1B(3) is a layout of a lithography laser system with a beam delivery unit.

There are several optical elements in the MOPA System shown in FIG. 1 which are subject to fluences which could be large enough to produce damage. At 15 mJ per pulse and with a 3 mm×9 mm beam cross-section, the average fluence (i.e., pulse energy divided by beam cross-section) is 55 mJ/cm$^2$. The time average pulse intensity (i.e., pulse fluence divided by pulse duration) is about 2.75×10$^6$ W/cm$^2$. (This average pulse intensity is about a factor of three greater than the average pulse intensity of the output pulses of the prior art 5 mJ ArF lasers). (The reader should understand however, that laser pulses produced by these types of lasers are not completely uniform. There are spatial variations in the cross-section of the beam and there are temporal variations over the 20 ns duration of the pulse). Because of these spatial and temporal variations, the peak values of fluence and pulse intensity are expected to be two or four time the above values. These at risk optical elements include chamber window at the output of the PA chamber, a beam splitter located in spatial analysis module 9 through which the output beam passes, and a two-prism beam expander located in the PA WEB module 26. Other optics downstream of the beam expander are potentially at risk but the fluence and intensity will be reduced in inverse proportion to the beam expansion. Optics downstream of the pulse stretcher will be exposed to much longer pulses (as well as larger cross-sections) which together will reduce the risk of damage to less than prior art systems. As explained above these prior art systems have operated without substantial optical damages for billions of pulses.

Factors Influencing Damage

Applicants have identified several factors that influence the damage threshold of the optical material. These factors include (1) the fluence ($mJ/cm^2$) including variations (spatial and temporal) to which an optic is subjected (2) the orientation of the optic surface with respect to the beam propagation direction (3) the number of pulses, (4) the cleanliness of the surface of the optic (5) the pulse duration, (6) the environment in which the optic is immersed, (7) whether or not the surface of the optic is exposed to $F_2$ gas (8) polishing processes and (9) the repetition rate.

Overlapping Photons

Prior art ArF lithography lasers recently (during 2001 and 2002) incorporated into integrated circuit production lines have output beams of about 5 mJ with pulse durations of about 20 ns and beam cross-sections of 3 mm (wide) and 9 mm (high). For these units the average fluence of the output pulses is about 18 $mJ/cm^2$ and the time averaged pulse intensity is $1 \times 10^6$ $Watts/cm^2$. Optical elements comprised of uncoated $CaF_2$ have been used as windows, beam splitters and prisms operating without significant deterioration for billions of pulses over many months. Applicant's discovery (discussed above) of serious surface failures almost immediately (within a few minutes or hours) as a result of an increase in output pulse energy to 15 mJ was a complete surprise. Applicants suspect that the surprising "step change" in damage potential has resulted from a process known as a "multi-photon" process which is the consequences of overlapping photons in output beam. An increase from 5 mJ to 15 mJ in the output beam increases the number of photons per pulse by a factor of three. Since, there is a substantial degree of non-uniformity both spatial and temporal, Applicants expect that there is a substantial degree of photon overlapping in the 15 mJ output pulses as they leave the master oscillator chamber. Applicants' suspects that it is this overlapping of photons that is the cause of the $CaF_2$ optical surface damage which Applicants have discovered. As indicated above, Applicants tests show surface failure within a few hours of operation when the average fluence is increased to 60 $mJ/cm^2$ with these 20 ns pulses. As indicated above a 20 ns, a 15 mJ pulse with a 3 mm×9 mm cross-section represents an average fluence of 55 $mJ/cm^2$ and a time average pulse intensity of about $2.7 \times 10^6$ $W/cm^2$, with peak values much higher. Applicants have identified three basic solutions to this problem (1) find some way to protect the optical elements from this surface damage or to improve the optical elements to decrease their risk of damage, (2) increase the beam cross-section and (3) increase the pulse length.

Causes and Description of the Surface Damage

Although the above numbers suggest that overlapping photons are responsible for the damage threshold at about 20–60 $mJ/cm^2$. Applicants are not certain of the exact cause of the surface damage. Applicants have determined for certain that pits and a white fuzz develops on the beam footprint at the two surfaces rendering the optics useless within a few minutes or hours. Applicants believe that these overlapping photons produce double excitations of fluorine atoms which cause fluorine atoms to be ejected from $CaF_2$ molecules. This produces a fluorine deficiency at the surface of the optic, which destroys the $CaF_2$ bond and producing a small degradation region. Subsequent irradiation causes an expansion of the degraded region so that within a short time the optic is no longer functional.

Discovery of Surface Protection by Fluorine Emersion

As discussed above, Applicants have in the course of their investigation noticed that the inside surface of the window at the output side of the power amplifier chamber does not experience surface damage while at fluences above about 60 $mJ/cm^2$ the outside surface suffers extensive damage in relatively short time periods. Based on this observation Applicants have conducted experiments in which $CaF_2$ optics are immersed in a gas comprising small quantities of fluorine in to a noble gas or nitrogen. The surfaces so exposed do not suffer damage at pulse fluences up to 300 $mJ/cm^2$ and possibly higher. Applicants have speculated that the fluorine gas may retard ejection and/or it may quickly replace any fluorine which is ejected from the $CaF_2$ crystal structure. Specifically, Applicants tests have shown that $F_2$ in very small concentrations in the range of 1 to 10 parts per million prevent damage at pulse fluences up to 300 $mJ/cm^2$. A recommended concentration is about 1 ppm; however, Applicants believe that any quantity of $F_2$ in the environment to which the surface is exposed (even less than 1 ppm) will tend to minimize damage and extend optics lifetime.

Example of Optics Testing in $F_2$ Environment

A new chamber window (S1-02-863) was tested in various $F_2$ concentrations at various fluence levels up to 297 $mJ/cm^2$ peak fluence at exposure centers for 10 million pulses. The test position shifts 4 mm in each run in a focused beam to vary the fluence. The test is listed in order of when it was executed, and the chamber was not opened during all eight runs.

| F-Concentration | Time after N2 purge | Damaged? |
| --- | --- | --- |
| 100 ppm | N/A | No |
| 500 ppm | N/A | No |
| 0 ppm | 14-hour | Yes (this tells there is no cleaning effect). |
| 4000 ppm (0.4%) | N/A | No |
| 0 ppm | 38-hour | Yes |
| 187 ppm | N/A | No |
| 4 ppm | N/A | No |
| 0.8 ppm | N/A | No (fluorine concentration measurements are not reliable at this level.) |

Improvements to Reduce Optical Surface Damage

Applicants have identified several solutions to the $CaF_2$ optics surface damage referred to above. These solutions are generally described in the following paragraphs:

Immerse At-Risk Optics in a Fluorine Containing Gas

As stated above, optics immersed in a $F_2$ containing gas does not experience the damage at least up to fluences of 300 mJ/cm². Confirming tests have been performed with a $F_2$ percentage of about 0.4% in a noble gas or nobles gases and nitrogen. Applicants' tests indicate that the $F_2$ percentage could be reduced to extremely low concentrations after an initial treatment at relatively high concentrations. For example, after an initial exposure with 0.4% of $F_2$ the chamber was evacuated and filled with noble gases five times then purged with nitrogen and then exposed to high fluence 193 nm radiation in the range of 67 to 173 mJ/cm² without damage. In their tests (after 5 purges) the $F_2$ concentration was obviously very low. However, when the laser was allowed to set idle overnight so that all of the $F_2$ in the gas had disappeared, the optics failed very soon at high pulse fluences.

Thus, one solution is to immerse the at-risk $CaF_2$ optics in a gas containing a small percentage of $F_2$ gas, even at the parts per million levels. This can be accomplished in a number of ways. For example, a separate $F_2$ source could be provided to add $F_2$ to sections of the beam line containing the at-risk optics. Small quantities of laser gas from one of the laser chambers could be used or some of the gas regularly discharged from the laser chamber could be used. The beam train is already enclosed in a vacuum tight beam enclosure. However, exhaust from the section of the beam enclosure containing $F_2$ will probably need to be treated to trap or neutralize the $F_2$ gas before the exhaust is exhausted to the atmosphere. Also, as discussed in detail below, some at-risk optics (such as the prism beam expanders shown in FIGS. 3F and 3G) could be located inside the $F_2$ containing chamber environment.

$F_2$ Containing Purge Gas

In preferred embodiments all optics in the beam path downstream of the power amplifier output window are contained in an $F_2$ environment. This will provide protection to all $CaF_2$ optics even those that are not subject to the clearly damaging pulse intensities. Optics could include stepper optics all the way to the reticle. One technique for doing this is to put the $F_2$ in the purge gas purging these sections of the beam train. In such event it may be desirable to utilize re-circulated purge system rather than discharging the purge gas after one pass as is the typical current practice.

Figure 12:
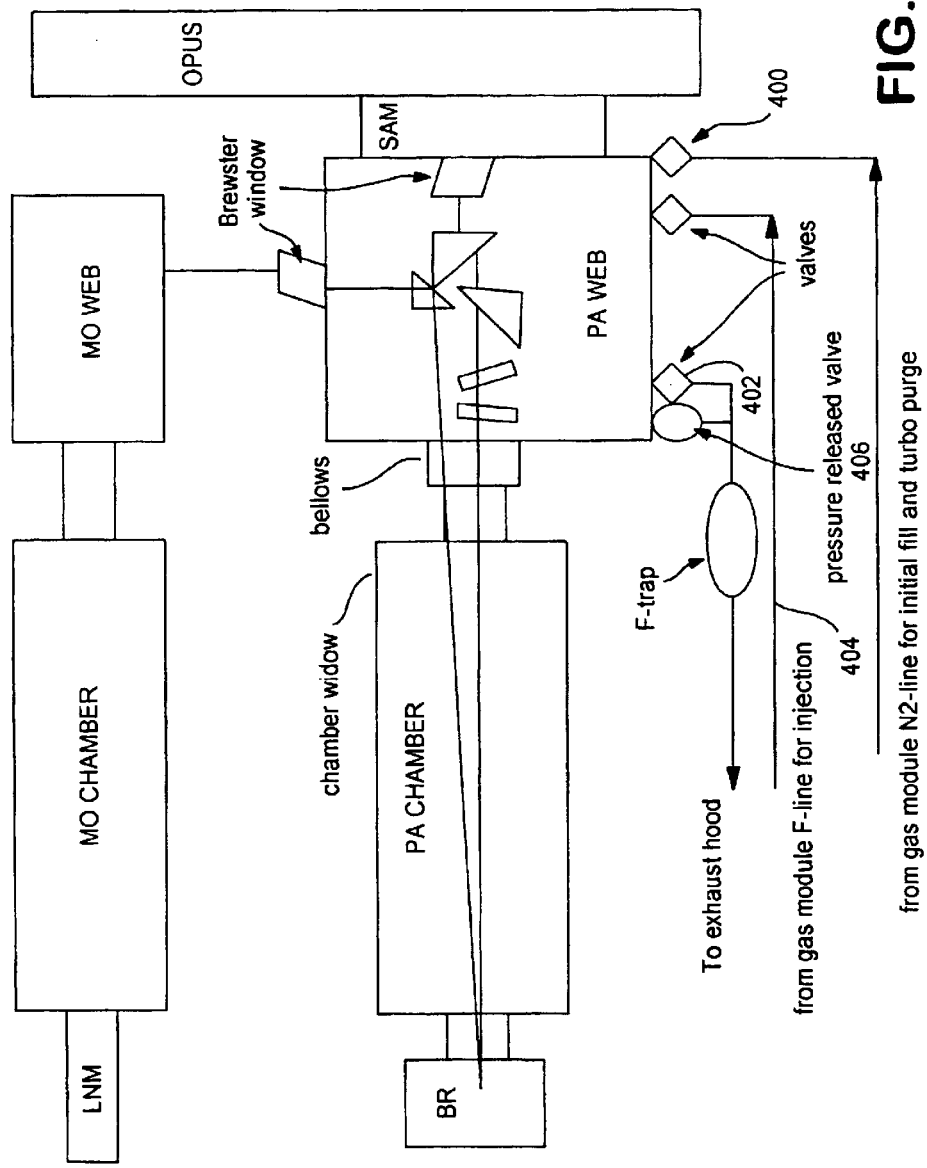
FIGS. 12 shows a technique for providing an F$_2$ environment in an enclosure downstream of the power amplifier.

Based on these tests Applicants' have developed a preferred embodiment which incorporates the following changes to the FIG. 1 layout. These changes are shown in FIG. 12.
1. After the PA WEB sealed. tested it is initially filled with N2 with the N2 line valve 400 open and turbo N2 valve (exhaust) 402 open.
2. Close both N2 line valve 400 and the turbo N2 line valve 402, and inject a known amount of fluorine two to three times through line 404. The pressure release valve 406 (setting at 100 kPa) will automatically releases extra gas to keep the module slightly above the atmosphere pressure.
3. Periodically F-inject once per billion pulses or per three months or as necessary to keep the fluorine concentration above 1 ppm.
4. In the case of replacing chamber window, open both N2 turbo valve and N2-line valve for 10-minute before disconnecting the bellows next chamber window. The fluorine concentration is much less than 0.01 ppm at the time.
5. After a new PA chamber window is replaced, using the N2 turbo purge for 10-minute, and then close both N2 valves.
6. Give two or three F-injections to PA WEB to complete the chamber window service.

Non-Hazardous $F_2$ Sources $F_2$ gas is a hazardous gas and has to be carefully controlled. However, many gases containing fluorine, are non-hazardous and are a source of $F_2$ when irradiated with high energy ultraviolet radiation. Therefore, Applicants propose (as an alternative technique for protecting the surfaces of the $CaF_2$ optics) to immerse the $CaF_2$ at risk optics in one of these fluorine containing gases. Potential fluorine containing gases include any gas which releases fluorine on exposure to the 193 nm ultraviolet light, which does not appreciably absorb the ultraviolet light at the concentration used. Also, the chosen gas should not under UV radiation produce products which will deposit on the optics to degrade their performance. Potential gases are:

$NH_4F.HF$
$SF_6$
$CCl_3F$
$C_2Cl_2F_4$
$SiF_4$
$CF_4$
$NF_3$
$COF_2$

Tests with Silicon Tetrafluoride

Applicants conducted tests in which the two surfaces of $CaF_2$ optics are exposed to a gas mixture containing $SiF_4$ which is much less of a potential hazard than $F_2$. Applicants believe that the ultraviolet light releases fluorine ions or atoms from the $SiF_4$ molecule and then the free fluorine can protect the optical surface in the same manner as the $F_2$ gas has done. Also the silicon tetrafluoride molecules may form a protective mono-layer on the surfaces of the optic. The following table shows the result of subjecting a $CaF_2$ optic to 20 ns ArF 193 nm pulses at fluence levels of 297 mJ/cm² for 10 million pulses.

| Run Number | Portion of $SiF_4$ In Helium | Damage? |
| --- | --- | --- |
| 1 | 14.2 ppm | No |
| 2 | 1.4 ppm | No |
| 3 | 0.01 ppm | Yes |
| 4 | 0.4 ppm | Yes |
| 5 | 0.6 ppm | Yes |
| 6 | 0.9 ppm | No |
| 7 | 0.7 ppm | No |
| 8 | 0.6 ppm | No |

Based on these results Applicants believe good protection is provided by $SiF_4$ gas in helium where the $SiF_4$ concentration is about 1.0 ppm or greater.

Applicants have tested the gases listed in the following table in the concentrations listed and the results are described in the table. The gases are also ranked.

Explore the CaF₂ protection effect by other fluoride gases

| Gas | Concentration | Damage threshold (mJ/cm^2) over 10 Mp | Note | | Choice rank |
|---|---|---|---|---|---|
| N₂ | 100% | 60–120 | <1 ppm O2 | | |
| F₂ | ~0.9 ppm | >300 | Balanced with He | The concentration was estimated | 1 |
| SiF₄ | 0.7 ppm | >300 | Balanced with He | The threshold of 300 mJ/cm^2 at 0.5~0.6 ppm SiF4 | 2 |
| NF3 | 13.7 ppm | >300 | Balanced with He | The threshold is lower in 1.4 ppm NF3 | 3 |
| COF₂ | 18.6 ppm | 270~300 | Balanced with He | The threshold is lower for a lower concentration | 4 |
| CF4 | 1% | <190 | Balanced with He | The threshold is slightly higher in 1% CF4 than in N2 | 5 |

Also, some solid fluorine containing materials will emit fluorine under ultraviolet irradiation. For example, teflon is known to emit fluorine when exposed to UV irradiation. These solid materials could be used as $F_2$ sources. In addition, fluorine can be ion implanted or other forms of doping can be used to add fluorine to the $CaF_2$ crystal. Another potential technique is to replace Ca++ ions at the crystal surface with La+++ ions which have a similar ionic radius as Ca++ but an additional charge. This will cause the surface of $CaF_2$ to become positively charged and reduce the tendency of fluorine ions to ablate.

Coatings for CaF₂ Optics

Another technique for avoiding (or reducing the potential for) surface damage in the at-risk $CaF_2$ optics is to provide a protective coating on the $CaF_2$ optics surface. The coatings should preferably be designed to minimize electric fields at the $CaF_2$ crystal surface. Typically for transmission optics this is accomplished by providing a coating thickness equivalent to one-fourth wavelength of the light. Also, multiple layers can further reduce the electric field at the $CaF_2$ surface. These coatings should be selected from coatings known for long life in an intense ultraviolet laser beam.

Examples of coatings which provide surface protection include $SiO_2$ and $Al_2O_3$. Other standard fluoride (including $CaF_2$) and oxide coating materials used in deep ultraviolet systems can be used. Preferably, these coatings are applied in a manner in which fluorine is trapped on or very near the surface of the optical element. For example, a preferred technique is to subject both surfaces of the optical element to a fluorine gas environment to permit a fluorine layer to build up on the surface of the optic. This preferably is done within a deposition chamber. After the layer has built up on the surface, the surface is coated with a $SiO_2$ layer using one of the well-known coating techniques such as those described in Corning Patent referred to in the Background section. The coating may be carried out with a small amount of $F_2$ gas maintained in the deposition chamber so that additional fluorine atoms are trapped in the coating layer as well as between the $CaF_2$ surface and the inside of the coating layer. Preferably, the optical surfaces are initially exposed to about 0.4% $F_2$ (with remainder argon) at atmospheric pressure for about 1 hour then the chamber is pumped down to about $10^{-3}$ atm with about $10^{-6}$ atm of $F_2$ maintained in the chamber with a needle valve control. A preferred $SiO_2$ optical thickness of $\frac{1}{4}\lambda$ is preferred although other thicknesses could be used but the thickness preferably should not exceed 4 $\lambda$.

Silicon Oxyfluoride

The optical elements can also be coated with silicon oxyfluoride using one of the techniques described in the Corning Patent referred to above (U.S. Pat. No. 6,466,365) which was developed as a coating for manipulating high fluence ultraviolet beams.

These coatings serve two purposes in addition to trapping the $F_2$ on the substrate crystal surface. First, the coatings reduce the electric field at $CaF_2$ crystal surface. Second, they assure that the $CaF_2$ surface will remain free of contamination.

Applicants have tested $CaF_2$ optics coated with silicon oxyfluoride layers and have determined that they these coatings can improve the performance of the $CaF_2$ optics. However, these early samples did suffer damage at fluences greater than 104 mJ/cm² after 180 million pulses. Applicants believe that improved quality of these coatings will improve performance even more.

Magnesium Fluoride Optics

Another solution to the $CaF_2$ surface damage problem is to replace the $CaF_2$ at-risk optics with magnesium fluoride crystal optics. Magnesium fluoride is known to have a damage threshold (in terms of mJ/cm²) several times larger than $CaF_2$. Applicants' preliminary tests with $MgF_2$ optics at high fluences (above 60 mJ/cm²) produced a surface fluorescence which got worse with pulse count resulting in transmission loss. Recently the quality of $MgF_2$ has been improved. By controlling fluence on the $MgF_2$, the transmission loss may be manageable to acceptable levels.

Increase Cross-Section of Beam

Another technique for reducing the surface damage potential of the at-risk optics is to increase the cross-section of the output beam thus reducing the fluence proportionately. Several techniques are available for expanding the beam cross-section.

Beam Expanding Optics

The beam cross-section can be expanded with a variety of well known optical components including reflective and refractive telescopes. Also, prism beam expanders which have been used for several years in line narrowing modules to increase grating spectral dispersion. The MOPA laser system shown in FIG. 1 includes a prism beam expander located in the PA WEB 26 for expanding the PA output beam. This beam expander is shown in FIGS. 3F and 3G. This beam expander doubles the beam cross-section greatly reducing the potential for damage downstream of the beam expander. However, upstream optics in the SAM module and the beam expander prisms are still at risk and so appropriate alternate protection must be provided for them. One solution is to put the beam expanding prism inside the laser chamber $F_2$ environment as explained in the following section.

Beam Expander within Laser Chamber Window Housing

Figure 11:
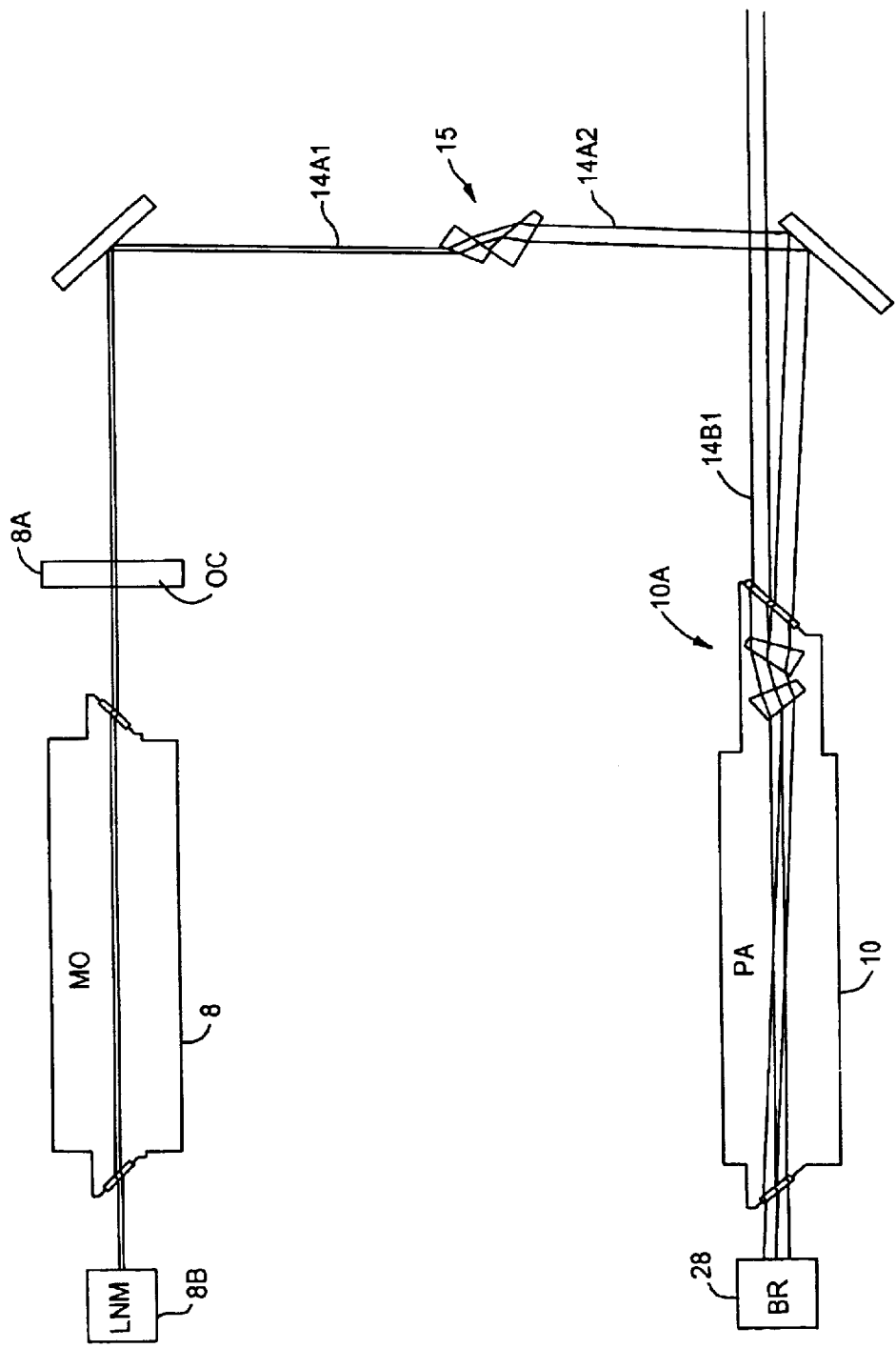
FIG. 11 shows a technique for enclosing a beam expander in a power amplifier output window structure.

FIG. 11 is a drawing showing a two-prism beam expander built into the laser chamber output window unit. Preferably, the two prisms expand the output beam by a factor of two thus reducing the peak fluence levels of output beam 14B1 to less than 60 mJ/cm$^2$. Other magnitudes of expansion from 50% to a factor of 4 can be easily accomplished with the two-prism beam expansion arrangement. If additional expansion is needed, a three or four prism expansion configuration could be used. In the preferred embodiment shown in FIG. 11 the beam is expanded in the horizontal direction increasing the output beam cross-section from about 5 mm×9 mm to about 10 mm×9 mm to double the beam cross-section. The beam could also be expanded in the vertical direction if needed. In this configuration the seed beam from the MO passes through the beam expander and as a result it is shrunk by a factor of two. To compensate a separate factor of two beam expander 15 pre-expands beam 14A1 to produce expanded seed beam 14A2 so that the seed beam is the same size as the one shown in the FIG. 1 embodiment. The window unit 10A containing the output beam expander could be constructed as a part of chamber 10 or it could be treated as a separate replaceable module. The reader should note that the downstream prism in window unit could be used as the output chamber window if sealed to the chamber window structure, eliminating the output window shown in FIG. 1. By the time the beam exits the exit surface of the downstream prism, the beam cross-section has been doubled so fluorine is not needed to protect that exit surface.

Natural Beam Expansion

Figure 1A:
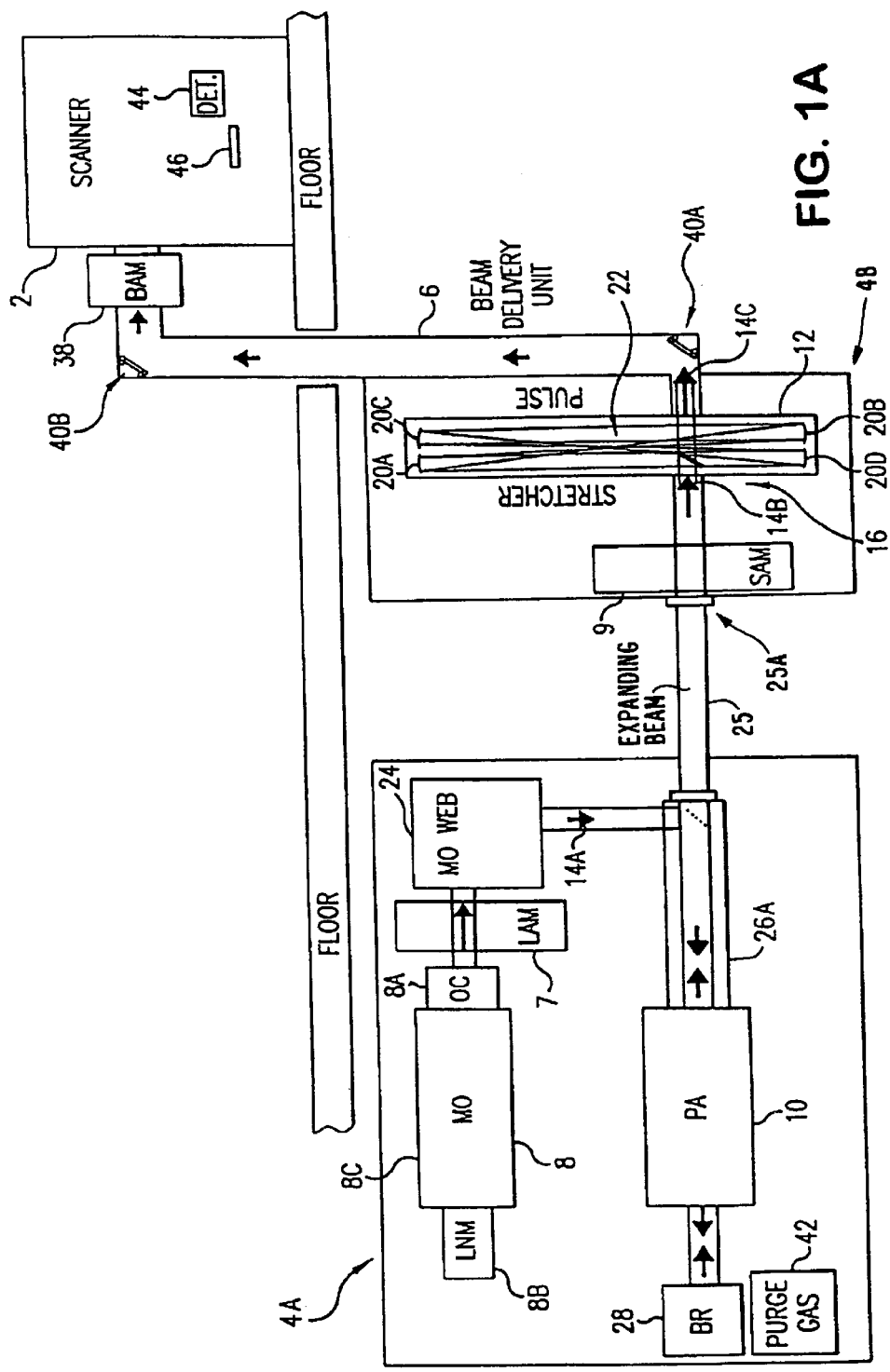

FIG. 1A shows a technique for allowing the PA output beam to expand naturally by a factor of about two before it encounters any optics. This reduces the fluence substantially below the output fluence of prior art ArF excimer lithography light sources so that downstream optics should be able to handle the fluence. As is indicated in FIG. 1A (as compared to FIG. 1), the SAM 9, the output components of the PA WEB 26 and the pulse stretcher 12 are displaced about 4 meters further downstream of the output from the PA chamber 10. The natural divergence of the output beam of the power amplifier 10 is about 1 milliradian in the vertical direction and about 0.6 milliradian in the horizontal. As a result after four meters a 11 mm×5 mm output beam will have expanded to about 15 mm×7.4 mm or from a cross-section of about 0.55 cm$^2$ to about 1.11 cm$^2$. Thus, the average fluence of a 15 mJ pulse is reduced from about 27 mJ/cm$^2$ to about 13.5 mJ/cm$^2$, below the damage threshold of uncoated CaF$_2$ optics in a well purged environment. The laser system as shown in FIG. 1A is preferably separated into two enclosures 4A and 4B connected with beam expansion pipe 25. Preferably beam expansion pipe 25 is purged with clean PA chamber gas which exits the PA electrostatic filter, enters at the far end of beam expansion pipe 25 and flows through the pipe counter to the laser beam. A chamber window is now located at the far end 25A of beam expansion pipe 25 and is kept clean by the clean gas flow.

The PA WEB 26A contains optics directing seed beam 14A into the PA chamber at an angle with the output beam as described above. It contains a chamber window which contains the laser gas and permits the entrance of seed beam 14A.

Beam Expansion through PA Discharge Region

Figure 1B:
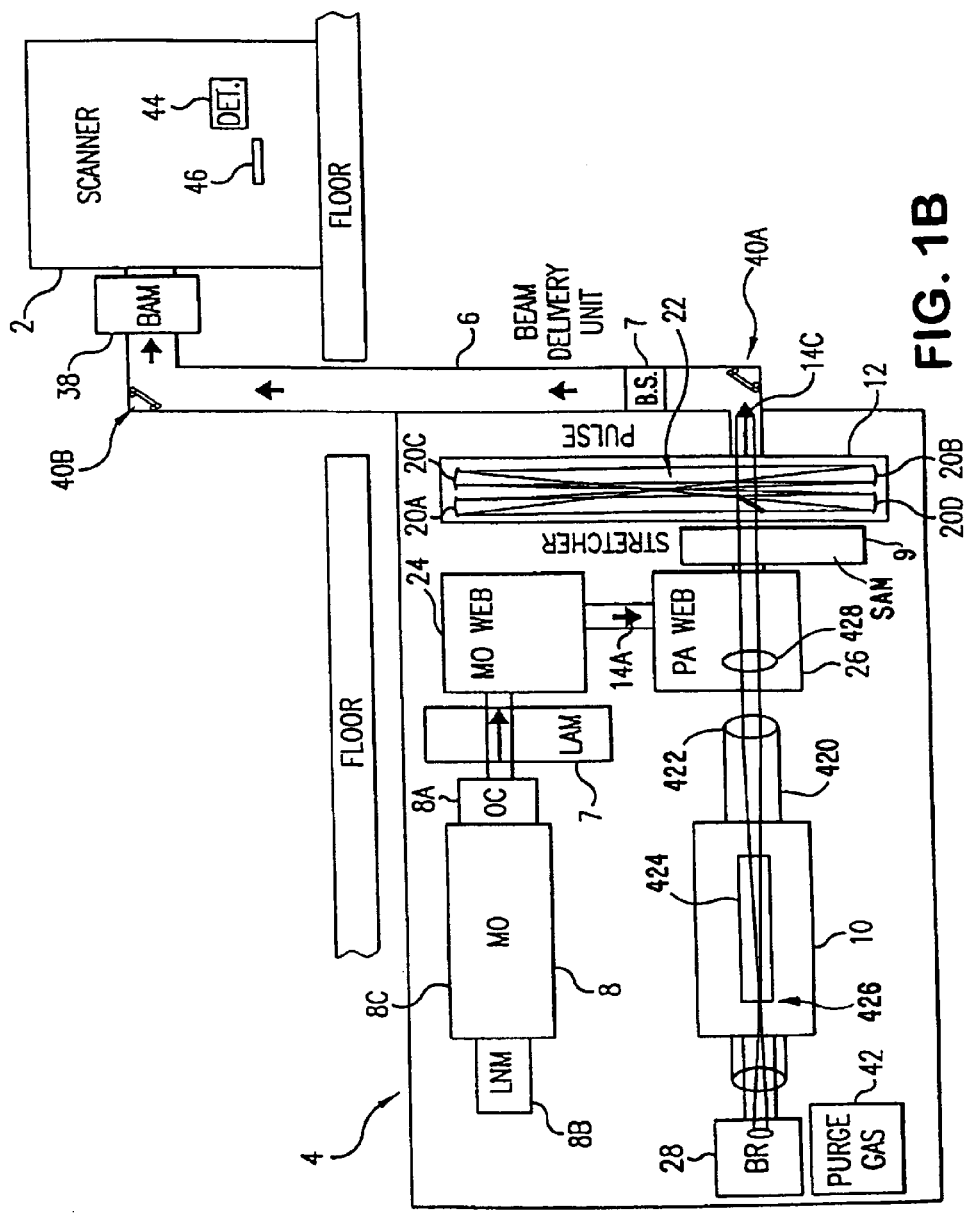

In another preferred embodiment shown in FIGS. 1B(1) 1B(2) and 1B(3), the PA chamber output window unit 420 is elongated so that the chamber output window 422 is located 55 cm beyond the output edge of the discharge region 424. The SAM 9 is moved to the downstream side of PA WEB 26 to make room for the elongated window unit. The optics of the beam reverser module 28 are modified to focus the seed beam (after its first pass through the discharge region of PA 10) in the horizontal direction at a focal point 426 just upstream of the location where the seed beam enters the discharge region 424 for its final pass through the discharge region. Thus, the beam will expand as it makes its final pass through the discharge region and will continue to expand at a divergent angle of about 5 milliradians. The reader should note that the expansion angle shown in FIG. 1B(1), 1B(2) and 1B(3) is exaggerated. The expansion direction is rotated from that shown in FIG. 1B (i.e., the expansion is in the horizontal direction not vertical as shown in FIG. 1B). FIGS. 1B(1), (2), and (3) are top views. By the time the output beam reaches window 422 it has expanded in the horizontal direction to 5.4 mm. With a vertical cross-section dimension of 11.8 the beam cross-section is about 0.64 cm$^2$ compared with a cross-section of 0.33 cm$^2$ with the baseline configuration described above in this specification referring to the FIG. 1 layout. The result is compared to the baseline configuration in the table below (for 10 mJ output pulse energy):

|  | Baseline Configuration | Expanding Beam Configuration |
| --- | --- | --- |
| Fluence at Output Window | 16.8 mJ/cm$^2$ | 8.5 mJ/cm$^2$ |
| Fluence at SAM Beam Splitter | 15.2 mJ/cm$^2$ | 5.6 mJ/cm$^2$ |
| Fluence at Prism Beam Expander | 13.2 mJ/cm$^2$ | 7.0 mJ/cm$^2$ |

The values presented in the above table are consistent with the fact, that the larger beam cross-section of the FIG. 1B configuration requires less magnification of the beam and therefore, losses in the prism beam expander will be lower. For example, the 4× beam expander used in the FIG. 1 configuration (as shown in FIG. 3F) will introduce about 15% losses while the 1.6× expander needed for the FIG. 1B configuration will have about 8% losses. The 1.6× beam expander is preferably located in the SAM module shown at 9 in FIG. 1B.

The beam exiting the laser will have a horizontal divergence of about 5 mrad. This divergence may be removed in the beam-shaping telescope of the beam delivery unit shown at 7 in FIG. 1B. Another alternative is to introduce a collimating lens somewhere between the chamber window 422 and the output laser. For lower pulse energies the window unit would not need to be so long (for example at 7.5 mJ the unit might shorten to place the output window at about 20 cm from the edge of the discharge) and for higher pulse energies the unit might need to be longer.

Applicants' have determined that having the beam expand as it makes its final pass through the PA discharge region does not significantly reduce the pulse energy of the beam. Furthermore, any reduction which does result can be easily compensated for by any one or more of several techniques such as increasing the F$_2$ concentration, increasing the gas pressure, increasing the discharge voltage or increasing the energy in the seed beam. Also, Applicants have determined that a second very important advantage of expanding the beam on its final pass through the discharge region is that the gain portion of the discharge region is fully saturated throughout the final passage of the beam through the discharge region. This means that substantially all of the available photons within the gain path of the final passage of the beam join the output beam. Full saturation results in an increase in the pulse energy stability of the output beam as compared to the base case which for the first portion of the last passage the gain region is not fully saturated.

Angle the Optic

Another technique for minimizing surface damage is to angle the at-risk optics so that the surface area over which the beam is distributed is increased. For example the output window is set at 47° in the prior art lasers of this type. Applicants propose to change this angle to 70°. This reduces the surface fluence by a factor of two.

Polishing Techniques

Applicants believe that at least some of the surface damage experienced with these $CaF_2$ optics is attributable to techniques used to polish the crystal surfaces. Persons skilled in the art of polishing optics are familiar with various techniques to minimize surface damage that might result from the polishing process. For example, the polishing compounds used, the polishing forces used, the polishing tools and the final roughness of the surface all should be chosen to reduce potential surface damage for the at-risk optics. Also the crystal orientation at the surface should be carefully considered as a potential source of damage minimization. For example, a [100] surface orientation may be preferable to a [111] surface orientation.

High Power MOPA Arf MOPA Laser Systems

An ArF MOPA laser system which utilizes the techniques equipment and concepts described above is shown in FIG. 1. In fact, early prototype versions of ArF MOPA systems operating at pulse energies of about 15 mJ produced the surface damage which prompted Applicants to develop the improvements described herein. The ArF MOPA laser system produces 193 nm pulse laser beams with pulse energies at the output of the power amplifier in the range of about 10 to 40 mJ, with pulse durations of about 20 ns and beam cross-sections of about 3 mm×9 mm. Thus, these pulses at the output of the power amplifier have pulse energies up to 40 mJ, average pulse fluence of to about 150 $mJ/cm^2$ average pulse intensities of up to $7.5 \times 10^6$ $Watts/cm^2$ and average pulse energy densities of up to about 0.25 $J/cm^3$. In embodiments of this invention, the pulses are expanded in cross-section and stretched in time and delivered at the input port of a stepper lithography machine 2 such as the one of those supplied by Canon and Nikon with facilities in Japan and ASML with facilities in the Netherlands. Prior art laser optics failed almost immediately in the output beam of this laser when pulse energy was increased above about 10 mJ. Techniques are described for protection of the optics located in high pulse intensity sections of the beam. In this case the main components of the laser system 4 are installed below the deck on which the scanner is installed. This laser system includes a beam delivery unit 6 which provides an enclosed beam path for delivering the laser beam to the input port of the scanner. The cross-section of the output beam is increased and pulse length is increased so that at the scanner the average pulse energy density is low enough so that the beam can be manipulated with prior art optical materials.

MOPA

This particular laser system includes a master oscillator 8 and a power amplifier 10. This MOPA arrangement represents an important advancement in integrated circuit light sources over the prior art technique of using a single laser oscillator to provide the laser light. The master oscillator and the power amplifier each comprise a discharge chamber similar to the discharge chamber of prior art single chamber lithography laser systems. These chambers contain two elongated electrodes, a laser gas, a tangential for circulating the gas between the electrodes and water-cooled finned heat exchangers. Both chambers include an electrostatic filter through which a small portion of the laser gas flow. This portion which is cleaned of debris in the filter is directed into the front and rear window chambers to keep the windows clean and to prevent electrode debris from entering the window chambers. Details of construction of the chambers are very similar prior art lasers described in the above identified patent and in more recent designs in the parent patent application referred to in the first section of this specification. (However, the output window chamber shown in FIGS. 1A and 1B are substantially longer than the prior art window chambers. Also, the rear window chamber of FIG. 1B may be increased in length). The master oscillator produces a first laser beam 14A which is amplified by two passes through the power amplifier to produce laser beam 14B. The master oscillator is very similar to the prior art single chamber lasers discussed in the background section except that the output energy requirements are substantially lower permitting Applicants to lower laser gas pressure and fluorine concentration which results in much lower bandwidth and other beam quality improvements. The master oscillator 8 comprises a resonant cavity formed by output coupler 8A and line narrowing package 8B both of which are described generally in the background section and in detail in the referenced prior art patents. The gain medium for master oscillator 8 is produced between two 50 cm long electrodes contained within master oscillator discharge chamber 8C. Power amplifier 10 is basically a discharge chamber and in this preferred embodiment the chamber is almost exactly the same as the master oscillator discharge chamber 8C providing a gain medium between two elongated electrodes but it has no resonant cavity. This MOPA configuration permits the master oscillator to be designed and operated to maximize beam quality parameters such as wavelength stability and very narrow bandwidth; whereas the power amplifier is designed and operated to maximize and stabilize pulse energy. For example, the current state of the art light source available from Cymer, Inc. Applicants' employer, is a 5 mJ per pulse, 4 kHz, ArF laser system. The system shown in FIG. 1 is a 10 to 30 mJ per pulse (or more, up to about 40 mJ/pulse, if desired) 4 kHz ArF laser system producing at least twice the average ultraviolet power with substantial improvement in beam quality. For this reason the MOPA system represents a much higher quality and much higher power lithography laser light source as compared with prior art laser light sources.

Pulse Stretcher

Figure 2:
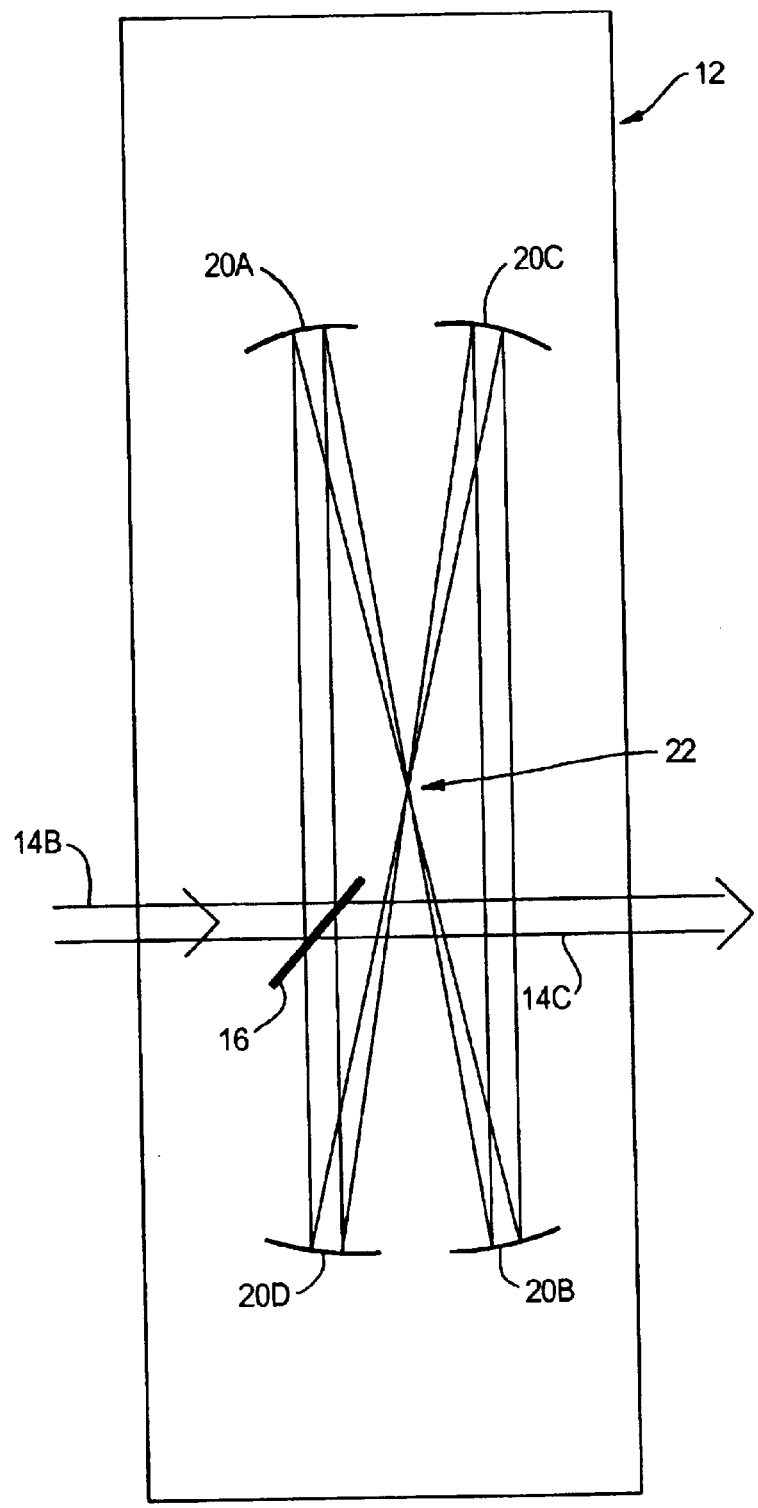
FIGS. 2, 2A and 2B show features of a pulse stretching unit.
Figure 2A:
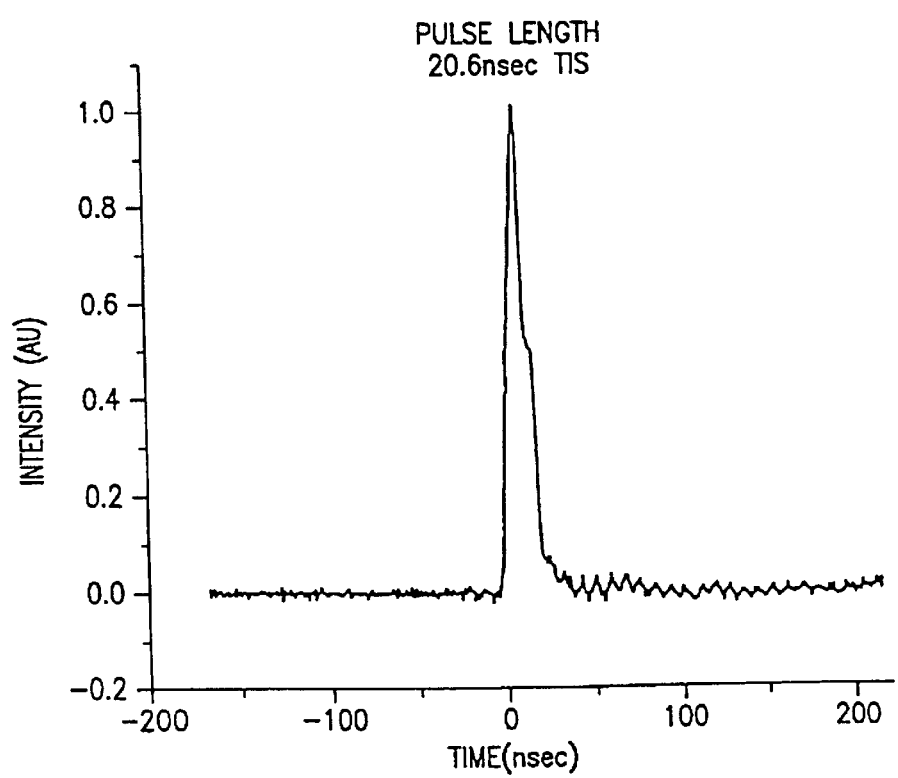
Figure 2B:
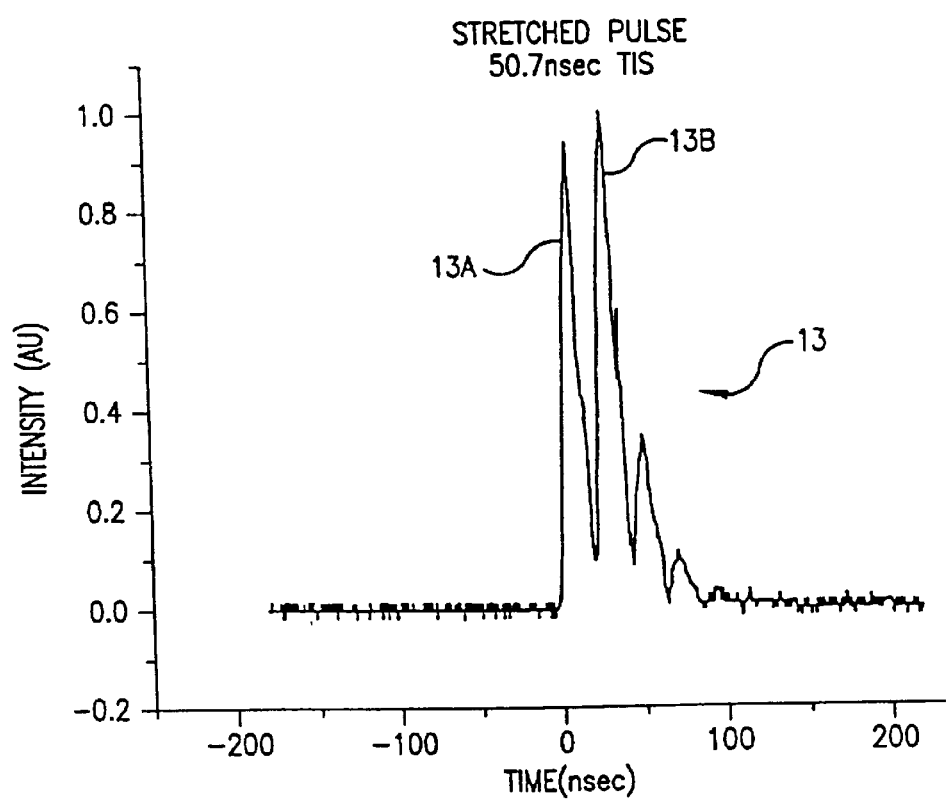

Integrated circuit scanner machines comprise large lenses which are difficult to fabricate and costs millions of dollars. These very expensive optical components are subject to degradation resulting from billions of high intensity and ultraviolet pulses. The typical pulse length of the laser beam from these lasers is about 25 ns so a 5 mJ beam would have a pulse power of about 0.2 mJ/ns or $0.2 \times 10^6$ Watts. Increasing the pulse energy to 10 mJ without changing the pulse duration would result a doubling of the power of the pulses to about $0.4 \times 10^6$ Watts which could significantly shorten the usable lifetime of these expensive optical components as compared to prior art ArF laser systems. The Applicants have minimized this problem by increasing substantially the pulse length from about 20 ns to more than 50 ns providing a reduction in the rate of scanner optics degradation. Stretching of the pulse also reduces the potential for damage to optics of the beam delivery unit 6 and BAM unit 38. This pulse stretching is achieved with pulse stretcher unit 12 as shown in FIG. 1. An enlarged view showing the beam paths through pulse stretcher 12 is shown in FIG. 2. A beam splitter 16 reflects about 60 percent of the power amplifier output beam 14B into a delay path created by four focusing mirrors 20A, 20B, 20C and 20D. The 40 percent transmitted portion of each pulse of beam 14B becomes a first hump 13A of a corresponding stretched pulse 13 shown in FIG. 2B of beam 14C. The first reflected portion of beam 14C is directed by beam splitter 16 to mirror 20A which focuses the reflected portion to point 22. The beam then expands and is reflected from mirror 20B which converts the expanding beam into a parallel beam and directs it to mirror 20C which again focuses the beam again at point 22. This beam is then reflected by mirror 20D which like mirror 20B changes the expanding beam to a parallel beam and directs it back to beam splitter 16 where 60 percent of the first reflected light is reflected perfectly in line with the first transmitted portion of this pulse in output beam 14C to become most of hump 13B in pulse 13 as shown in FIG. 2B. The 40 percent of the reflected beam transmits beam splitter 14 and follows exactly the path of the first reflected beam producing additional smaller humps in stretched pulse 13. The result is stretched pulse 14C which is stretched in pulse length from about 20 ns to about 50 ns. The stretch pulse 14C is plotted as intensity vs. time in FIG. 2B and can be compared with the shape of the power amplifier output pulse 14B which is similarly plotted in FIG. 2A. Thus, the pulse stretcher reduces the pulse intensity of 10 mJ to 15 mJ pulses to approximately the intensity of the prior art 5 mJ pulses.

The stretched pulse shape with this embodiment has two large approximately equal peaks 13A and 13B with smaller diminishing peaks following in time the first two peaks. The shape of the stretched pulse can be modified by using a beam splitter reflecting more or less than 60%. Applicants' have determined that a beam splitter reflecting about 60 percent produces the maximum stretching of the pulse as measured by a parameter known as the "time integrated square" pulse length or "$t_{IS}$". Use of this parameter is a technique for determining the effective pulse duration of pulses having oddly shaped power vs. time curves. The $t_{IS}$ defined as:

$$t_{IS} = \frac{\left(\int I(t)dt\right)^2}{\int I^2(t)dt}$$

Where I(t) is the intensity as a function of time.

In order to maintain the beam profile and divergence properties, the mirrors that direct the beam through the delay propagation path must create an imaging relay system that also should act as a unity magnification, a focal telescope. The reason for this is because of the intrinsic divergence of the excimer laser beam. If the beam were directed through a delay path without being imaged, the delayed portion of the beam would be a different size than the original beam when it is recombined at the beam splitter. To create the imaging relay and afocal telescope functions of the pulse stretcher the mirrors are designed with a specific radius of curvature which is determined by the length of the delay path. The separation between mirrors 20A and 20D is equal to the radius of curvature of the concave surfaces of the mirrors and is equal to ¼ the total delay path.

As indicated above the relative intensities of the first two peaks in the stretched pulse can be modified by changing the reflectivity of the beam splitter. The output $t_{IS}$ of the pulse stretcher is also dependent upon the efficiency of the beam relay system. The output $t_{IS}$ is dependent upon the amount of reflectivity of the imaging relay mirrors and the amount of loss at the beam splitter. For an imaging relay mirror reflectivity of 97% and a loss of 2% at the beam splitter, the maximum $t_{IS}$ magnification occurs when the reflectivity of the beam splitter is about 63%.

The alignment of the pulse stretcher requires that two of the four imaging relay mirrors be adjustable. Each of the two adjustable mirrors would have tip/tilt adjustment creating a total of four degrees of freedom. It is necessary that the two adjustable mirrors be located at opposite ends of the system because of the confocal design of the system. This embodiment is manually aligned. To create a self-aligning pulse stretcher would require automated adjustment of the necessary four degrees of freedom and a diagnostic system which could provide feedback information to characterize the alignment. The design of such a diagnostic system, which could qualify the alignment performance, would require an imaging system capable of imaging both the near field and far field output of the pulse stretcher. By examining the overlay of the sub-pulses with the original pulse at two planes (near field and far field) one would have the necessary information to automatically adjust the mirrors to produce an output where each of the sub-pulses propagate in a co-linear manner with the original pulse.

Relay Optics

In this preferred embodiment the output beam 14A of the master oscillator 8 is amplified by two passes through power amplifier 10 to produce output beam 14B. The optical components to accomplish this are contained in three modules which Applicants have named: master oscillator wave front engineering box, "MO WEB" 24, power amplifier wavefront engineering box, "PA WEB" 26 and beam reverser, "BR" 28. These three modules along with line narrowing module 8B and output coupler 8A are all mounted on a single vertical optical table independent of discharge chamber 8C and the discharge chamber of power amplifier 10. Chamber vibrations caused by acoustic shock from the discharge and fan rotation must be isolated from the optical components.

The optical components in the master oscillator line narrowing module and output coupler are in this embodiment substantially the same as those of prior art lithography laser light sources referred to in the background section and described in detail in some of the parent applications. The line narrowing module includes a three or four prism beam expander, a very fast response tuning mirror and a grating disposed in Litrow configuration. The output coupler is a partially reflecting mirror reflecting 20 percent of the output beam for KrF systems and about 30 percent for ArF and passing the remainder. The output of master oscillator 8 is monitored in line center analysis module, LAM, 7 and passes into the MO WEB 24. The MO WEB contains a total internal reflection (TIR) prism and alignment components for precisely directing the output beam 14A into the PA WEB. TIR prisms such as the one shown in FIG. 3A can turn a laser beam 90 degrees with more than 90 percent efficiency without need for reflective coatings which typically degrade under high intensity ultraviolet radiation. Alternatively, a first surface mirror with a durable high reflection coating could be used in place of the TIR prism as shown in FIG. 3E.

The PA WEB 26 contains a TIR prism 26A as shown in FIGS. 3C–F and alignment components (not shown) for directing laser beam 14A into a first pass through power amplifier gain medium. Alternatively, as above, a first surface mirror with a high reflection coating could be substituted for the TIR prism. The beam reverser module 28 contains a two-reflection beam reversing prism 28A shown in FIG. 3B that like the one-reflection prism shown in FIG. 3A relies on total internal reflection and therefore requires no optical coatings. The face where the P-polarized beam enters and exits the prism is oriented at Brewster's angle to minimize reflection losses, making the prism almost 100% efficient.

After reversal in the beam reversing module 28, partially amplified beam 14A makes another pass through the gain medium in power amplifier 10 and exits through spectral analysis module 9 and PA WEB 26 as power amplifier output beam 14B. In this embodiment the second pass of beam 14A through power amplifier 10 is precisely in line with the elongated electrodes within the power amplifier discharge chamber. The first pass follows a path at an angle of about 6 milliradians relative to the path of the second pass and the first path of the first pass crosses the center line of the gain medium at a point half way between the two ends of the gain medium. FIGS. 3C and 3D show side and top views of the path of beam 14A through the power amplifier. The reader should note that the design and positioning of beam reversing prism 28A must accommodate an angle $\beta$ and a spatial offset of d as shown in FIG. 3B. In this embodiment $\beta$=6 milliradians and d is equal to 5 mm.

Figure 3E:
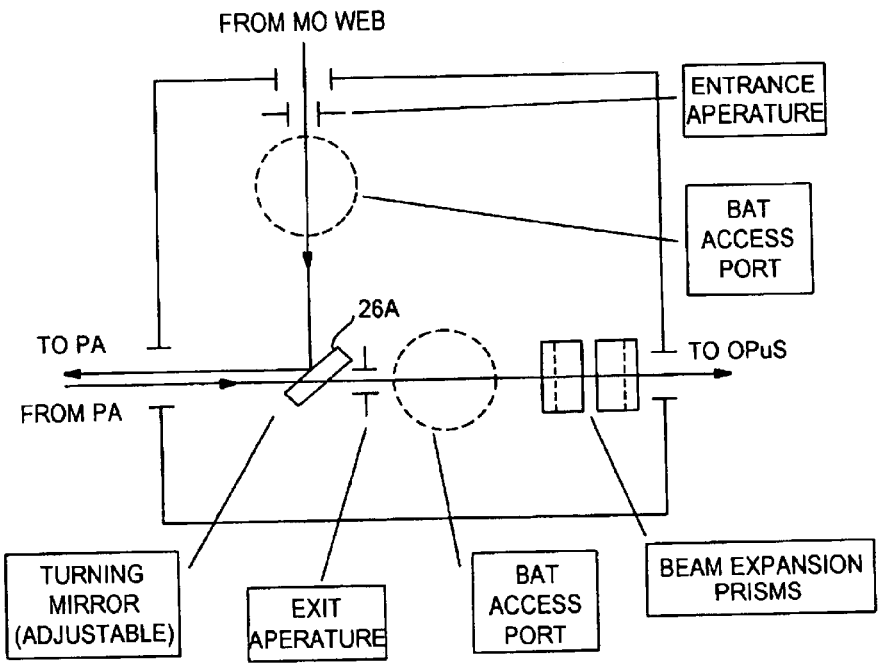
Figure 3F:
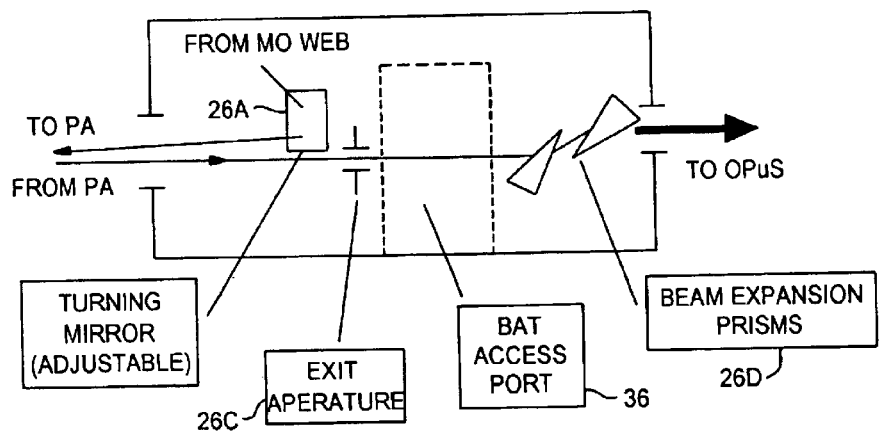
Figure 3G:
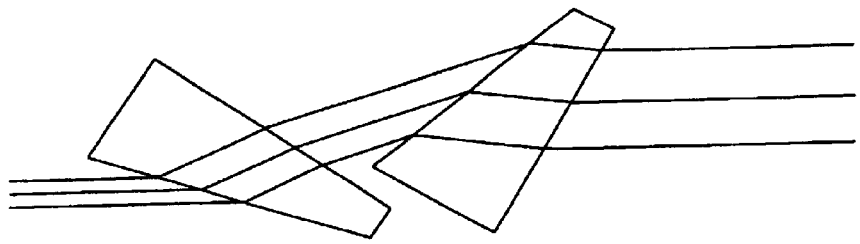

FIGS. 3E (side view) and 3F (top view) show some additional important features of optics in power amplifier WEB module. Note that in the side view, the beam "to" the PA is shown above the beam "from" the PA. This is done so that both beams can be shown in the side view drawing. (Actually both beams are at the same elevation so that the "from" beam would block the "to" beam if the from beam were shown at the correct elevation.). As shown in FIG. 3F the from beam passes close to TIR prism 26A passes through exit aperture 26C, and is expanded by a factor of 4 in the horizontal direction with two prism beam expander 26D and exits the WEB module to pulse stretcher module 22 (called by Applicants' "OPUS", for optical pulse stretcher). Exit aperture 26C as well as other apertures in the relay optics should be considered optional and they may be replaced by temporary alignment targets.

Other TIR Prism and Mirror Considerations

TIR prisms in the MO WEB and PA WEB are preferred over dielectric-coated first surface mirrors because they have no optical coatings, which tend to degrade with extended exposure to high fluence UV radiation. One disadvantage of the TIR prisms is unwanted Fresnel reflections that occur at the entrance and exit faces. For calcium fluoride material at 193 nm, each face reflects about 4% of the incident beam. If the incident beam is normal to the surface, the unwanted reflections will propagate back along the path of the incident beam and re-enter the MO. This could interfere with the stable operation of the MO. The problem is avoided by tilting the entrance and exit faces of the TIR prisms by approximately 1 degree relative to the incident beam. This can be accomplished by rotation a 45°-45°-90° TIR prism by 1 degree, in which case the deviation angle of the primary beam will change from 90° to either 88° or 92° (depending on the direction of the 1 degree rotation). Alternatively, a 90° deviation angle and 1 tilted faces can be achieved by using a TIR prism with angles 44°-44°-92° or 46°-46°-88° or 44.33°-45.67°-90°.

The TIR prism 26A in the PA WEB is used very close to an edge of each of the three optical faces. The optical faces of these prisms must be accurately polished to within 1 mm or less of the critical edges.

The TIR prisms in the MO WEB and PA WEB will each be alignable in two degrees of freedom (2 rotations, "tip-tilt"). The MO WEB TIR prism is aligned so that the primary reflected beam is directed to the appropriate location in the PA WEB. The PA WEB TIR prism is aligned so that the primary reflected beam is directed to the appropriate location in the Beam Reverser. Each TIR prism is secured in a mechanical mount which allows the tip-tilt adjustments from outside the sealed module.

The maximum reflected wavefront error is specified as 0.20 wave peak-valley at 633 nm (i.e., 127 nm) across the clear aperture (13 mm×21 mm). The wavefront error across the much smaller beam will be significantly less, though the exact amount depends on the type of aberrations present. If simple curvature is the dominant error (as it generally is with polished flats), the maximum divergence angle error introduced to beam would be about 0.02 mrad in the vertical direction (and much less in the horizontal direction).

If mirrors are used degradation of the optical coating over life (especially at 193 nm) is a concern, high reflection dielectric coatings that are more damage resistant than partial reflection or AR coatings. Also aiding the goal of long lifetime for this mirror is the fact that the pulse energy is much lower coming out of the MO than coming out of the PA. Because the mirror will be used very close to the edge, the coating may be more susceptible than usual to damage. There may be surface roughness or coating irregularities near the edge that contribute to coating failure. The edge of the mirror preferably is tested to avoid these potential problems. FIG. 3F shows the spacing issues. In order to direct the beam to the appropriate location in the Beam Reverser module, the turning mirror will be aligned in two degrees of freedom (2 rotations, "tip-tilt"). The mirror mount must include adjustments, accessible from outside the sealed module, for aligning the mirror to the required accuracy. Silicon oxyfluoride coatings discussed in the Background section which are available from Corning, Inc. are a preferred coating material for manipulating the seed beam.

Alignment Features for Relay Optics

For this tilted double-pass geometry, the beams reflecting from the MO WEB and the Beam Reverser are precisely positioned in the PA WEB. Alignment features are provided within the PA WEB for proper alignment of the MO WEB mirror and the Beam Reverser. The features would need to reference to the edge of the TIR prism. Preferably the alignment features are apertures, one at the entrance to the PA WEB (for alignment the MO WEB prism) and one at the exit (for aligning the beam reverser). The apertures might be permanent or removable. The system should be alignable in the field from outside the beam enclosures with the beam path sealed. Preferably the location of the beam with respect to the apertures will be made visible with some type of 2-D detector array (digital camera). A Beam Analysis Tool called BAT (perhaps with an aperture built-in) may be inserted into the module to inspect the alignment as shown at 36 in FIG. 3F.

Beam Expansion Prisms

Coming out of the PA, the fluence of the beam is higher than anywhere else in the system (due to small beam size and high pulse energy). To avoid having such high fluence incident on the optical coatings in the pulse stretcher module 12, where coating damage could result, beam expansion prisms were designed into the PA WEB. By expanding the horizontal beam width by a factor of 4, the fluence is reduced to ¼ its previous level. The beam expansion is accomplished using a pair of identical prisms with 20° apex angle as shown in FIG. 3G. The orientation of the prisms and beam path is also shown FIG. 3G.

The prisms are made of ArF-grade calcium fluoride. Techniques for protecting the prism from surface damage are discussed in detail elsewhere in this specification. (For example, it may be necessary to provide a fluorine environment for the prisms and all other optical components between the prisms and the output of the power amplifier (including the downstream side of the chamber output window). By utilizing an incidence angle of 68.6° on each prism, anamorphic magnification of 4.0 is achieved, and the nominal deviation angle of the pair is zero. The total Fresnel reflection loss from the four surfaces is about 12%.

Special $F_2$ Laser Features

The above descriptions generally apply directly to an ArF laser system but almost all of the features are equally applicable to KrF lasers with minor modifications which are well known in the industry. Some significant modifications are required, however, for the $F_2$ version of this invention. These changes could include a line selector in the place of the LNP and/or a line selector between the two chambers or even downstream of the power amplifier. Line selectors preferably are a family of prisms. Transparent plates properly oriented with respect to the beam could be used between the chambers to improve the polarization of the output beam. A diffuser could be added between the chambers to reduce the coherence of the output beam. The disclosures in this specification regarding techniques, materials and components discussed in the context of 193 nm ArF beams for avoiding damage to optical components apply to the 157 nm $F_2$ laser beams, with the recognition that the $F_2$ photons energy is even more energetic than the ArF photons.

BEAM DELIVERY UNIT

In preferred embodiment of the present invention a pulsed laser beam meeting requirements specified for the scanner machine 2 is furnished at the light input port of the scanner with a beam delivery unit (BDU) furnished as a part of the laser system. A beam analysis module as shown at 38 in FIG. 1 called a BAM is provided at the input port of the scanner to monitor the incoming beam and providing feedback signals to the laser control system to assure that the light provided to the scanner is at the desired intensity, wavelength, bandwidth, and complies with all quality requirements such as dose and wavelength stability. Wavelength, bandwidth and pulse energy are monitored by meteorology equipment in the beam analysis module on a pulse to pulse basis at pulse rates up to 4,000 Hz using techniques described in U.S. patent application Ser. No. 10/012,002 which has been incorporated herein by reference.

Other beam parameters may also be monitored at any desired frequency since these other parameters such as polarization, profile, beam size and beam pointing are relatively stable, may be normally monitored much less frequently than the wavelength, bandwidth and pulse energy parameters.

Beam Pointing Control

Figure 10A:
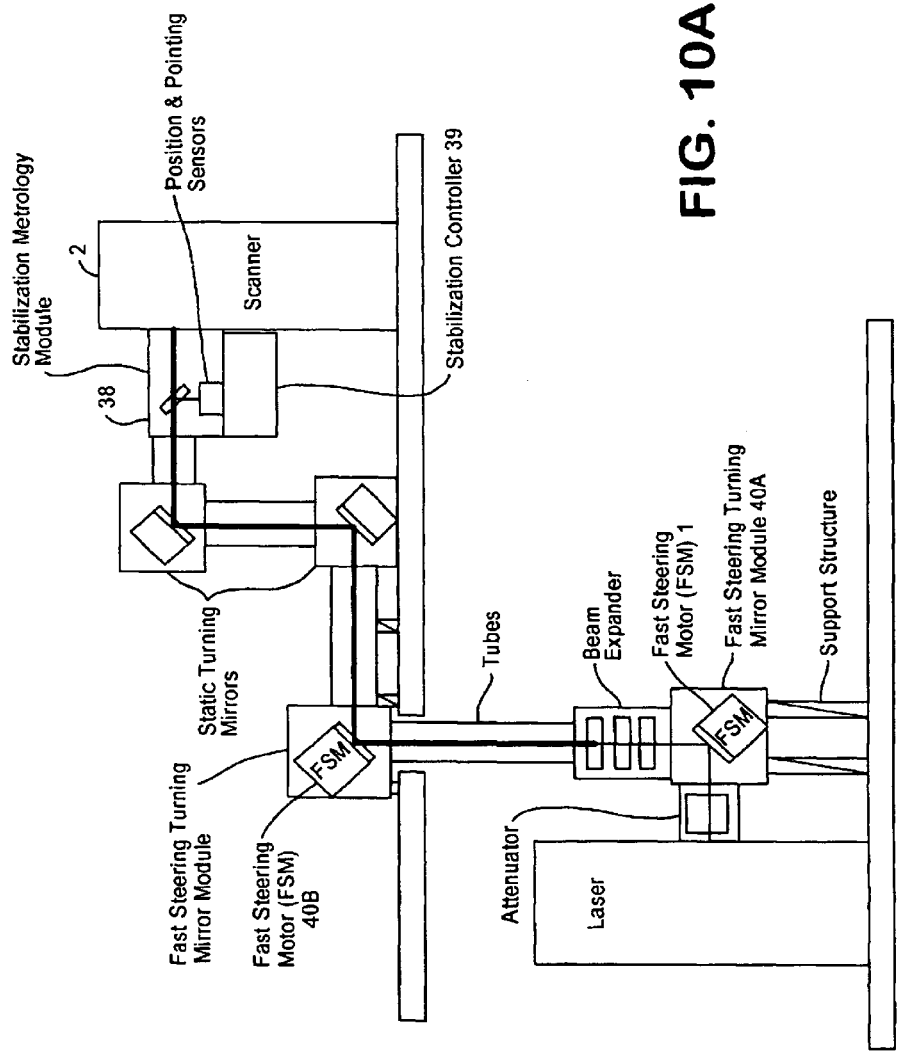
FIG. 10A shows a beam delivery unit.

This particular BDU comprises two beam-pointing mirrors 40A and 40B (as shown in FIG. 10A) one or both of which may be controlled to provide tip and tilt correction for variations beam pointing. Beam pointing may be monitored in the BAM providing feedback control of the pointing of one or both of the pointing mirrors. In a preferred embodiment piezoelectric drivers are provided to provide pointing response of less than 7 milliseconds.

A preferred beam pointing control technique can be described by reference to FIG. 10A. A beam analysis module 38 is located at the BDU exit. Module 38 has sensors that measure the beam pointing and position errors as they enter the scanner. The error signals are sent to a stabilization controller 39 located adjacent to module 38 that processes the raw sensor data and generates commands to drive fast steering turning mirrors 40A and 40B. Two fast steering turning mirrors, each with 2 axes of control, are placed upstream of the beam stabilization sensors. The turning mirrors are each mounted to a fast steering motor. The motor actuates the mirror angle in two axes and thus redirects the path of the laser beam. Two motors with 2 axes of control enable the BDU stabilization controller to independently regulate the vertical and horizontal beam pointing and position errors. The control system corrects for the beam errors from pulse-to-pulse. Namely, the beam errors from each laser pulse are fed to a feedback control system to generate commands for the steering motors. The electronics used to run the feedback control system are located in the Stabilization Controller module 39.

The vertical and horizontal beam pointing and position errors are evaluated at the BDU exit for every pulse of light generated by the laser. In total there are four independent sensor measurements.

Figure 10B:
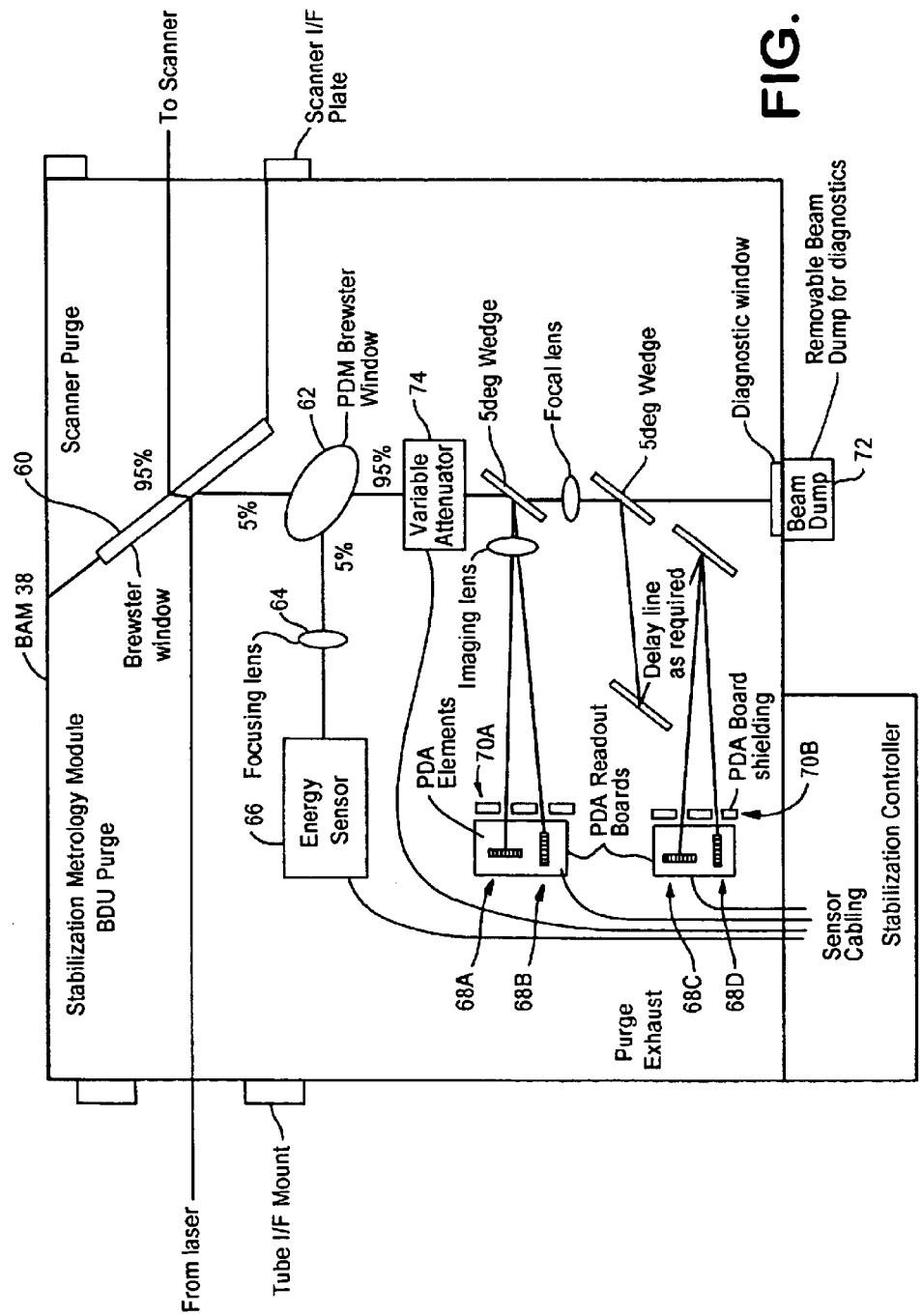
FIG. 10B shows details of a metrology monitor for monitoring beam angle and beam position.
Figure 10E:
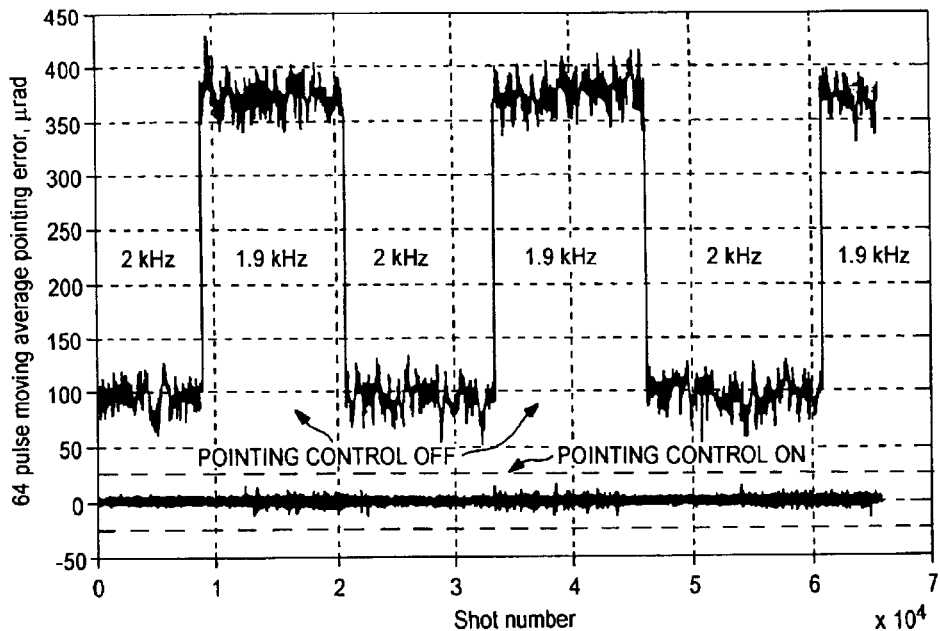
FIGS. 10E, F, G and H show test chart demonstrating performance of a beam pointing control system.

1. Vertical pointing error
2. Horizontal point error
3. Vertical position error
4. Horizontal position error The beam analysis module 38 as shown in detail in FIG. 10B contains the sensors and associated optics needed to measure the pointing, position, and energy of the beam at the exit of the BDU (the entrance of the scanner.) Most of the beam energy passes through module 38 (as shown in FIG. 10B) for delivery to the scanner, while a small fraction is diverted for the various measurements:

Pulse-to-pulse evaluation of beam pointing and position errors

Vertical and horizontal pointing is measured by putting far-field images on linear photodiode array (PDA) elements, such the S903 NMOS Linear Image Sensors offered by Hamamatsu Corporation with offices in Bridgewater, N.J.

Vertical and horizontal position is measured by putting reduced images of the beam near the BDU exit on linear PDA elements.

Beam energy measurement

The energy of the beam delivered by the BDU to the scanner is measured with calibrated photo-cell circuit.

Signals from the sensor in the SMM are sent through electrical connectors to the Stabilization Controller.

Brewster window 60 (as shown in FIG. 10B) allows 95% of the beam energy to pass on to the scanner, deflecting 5% into the body of module 38 for use by the beam metrology sensors. The light deflected by the main Brewster window for metrology is split again by another Brewster window 62; the deflected light, which has the same polarization mix as the light sent to the scanner, is focused by converging lens 64 on a photo-cell energy sensor.

The remainder of the light not deflected by the PDM Brewster window is distributed among four linear PDA sensors 68A, B, C and D for measuring vertical and horizontal beam position and pointing. To measure position, two beams split off by a wedge are sent through a converging lens to form images of the beam on two of the PDA sensors 68A and 68B. The lens and path lengths are such that the images formed are ½ scale images of the cross-section of the beam at the main Brewster window. The two PDA sensors are oriented at 90° to one another so that one measures the intensity profile of the beam in the vertical direction, and the other measures the intensity profile in the horizontal direction. Changes in the position of the beam at the Brewster window thus produce shifts in the reduced profile images on the sensors.

The light not deflected for the position sensors is passed through another converging lens and a wedge so as to form spots on the remaining two PDA sensors 68C and 68D which are also oriented at 90° to one another. In this case, the PDS sensors lie in the focal plane of the lens, so that changes in the pointing angle of the beam produce shifts in the positions of the spots on the sensors. Mechanical shields 70A and 7B are placed in front of all the PDA sensors to ensure that they detect only the intended light intensity distributions. Finally, a beam dump 72 dissipates any remaining light energy. This beam dump is removable to expose a window that may be used for diagnostics.

Because of the large range of delivered light intensity, a variable attenuator 74 is used upstream of the PDA elements to prevent them from saturating. The variable attenuator is a motorized device that places various neutral density filters in the beam path, for example a version of a motorized flipper model 8892 offered by New Focus with offices in San Jose, Calif. The variable attenuator comprises an energy sensor and a feedback circuit and is motorized to automatically adjust the light intensity arriving at the PDA elements. The attenuator setting is adjusted by feeding the energy sensor data to the stabilization controller. An algorithm on the stabilization controller adjusts the attenuator setting based on the energy sensor reading. In one embodiment, only one filter is used. When the energy setting is above a pre-specified threshold, the filter is placed in the beam path to attenuate the energy of the beam. When the light energy drops below the pre-specified threshold, the filter is removed from the path. In other embodiments, several filters may be required depending on the intensity range of the light and sensor electronics dynamic range.

FIGS. 10B, 10B, 10C, 10D(2) and 10D(3) illustrates the signal processing performed to generate pointing error measurements from the PDA detectors. Metrology in module 38 places the vertical and far field spots on PDA elements. FIG. 10C illustrates a situation where the metrology rotates one reflection of the beam so that both the vertical and horizontal spots are placed on the same PDA element.

Pointing errors are defined from a target locations defined at the exit of module 38. In other words, the laser user dictates where it wants the beam leaving module 38. Module 38 is a compact, light weight unit that can readily be mounted at the beam entrance to scanner 2. Total module size and weight can be kept to within 50×25×15 cm and about 15 kg.

To compute pointing errors, a reference location on the PDA elements is specified. The corresponding reference points on the PDA elements are defined with respect to the scanner specified reference location. Namely, the metrology inside the module 38 is aligned so that zero pointing errors corresponds to the center of the far field spot falling at the reference pixel location. On FIG. 10C the reference pixel locations are denoted by $r_v$, and $r_h$ for the vertical and horizontal fringes respectively.

The position of the far field fringes with respect to the reference location on the PDA elements reflects the pointing angle of the beam as it leaves the BDU. Likewise, the relative position of the image profiles with respect to the reference location on the PDA elements reflects the position of the beam leaving module 38. The position of a far field spot or profile on a PDA shall be defined in terms of threshold crossings. (Alternately, the position could be defined in terms of the location of the centroid of the intensity distribution.) For each pulse, the first and last pixels to exceed the threshold value (e.g. $1/e^2$ of the maximum) are found, and the threshold crossing itself is determined by interpolation with the neighboring pixels as illustrated in FIGS. 10D1, 2 and 3. The midpoint between the threshold crossing is taken to be the center of the fringe ($C_v$ and $C_h$ representing the vertical and horizontal center) and the error signal is the distance between the center of the fringe and the reference locations, (i.e., $r_v$ and $r_h$). For example, the vertical pointing error is directly proportional to the distance between rv and cv as shown in FIG. 10C.

Beam Shaping Telescope

The BDU may include a beam-shaping telescope 7 as shown in FIGS. 1, 1A, and 1B. This telescope alters the divergence and the beam cross-section of the laser output to match the divergence and cross-section desired by the end user of the laser.

First Prototype Test Results

A first prototype BDU system was built and test by Applicants and test results at 2 KHz and 1.9 KHz are shown in FIGS. 10E, 10F, 10G, and 10H with the pointing control on and pointing control off. In the open loop the beam stabilization system is off, and the steering mirrors are fixed. The beam from the laser propagates directly to the scanner without correction. The open loop errors are exactly the pointing and position errors generated by the laser. The closed loop behavior indicates the performance achieved when the beam stabilization system is running. The reader should note that the changes in beam angle offset that accompany a change in repetition rate are eliminated, as is the variation in angle that occurs over hundreds or thousands of shots at a constant repetition rate.

Figure 10F:
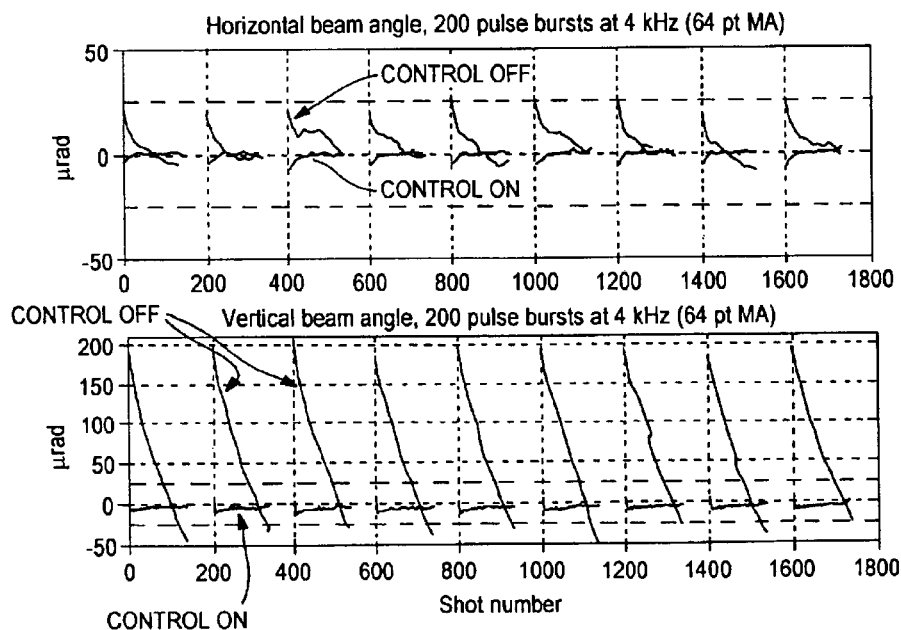

FIG. 10F shows moving averages of horizontal and vertical beam angles controlled simultaneously for 200 pulse bursts of pulses with 0.5 second intervals between bursts. As shown in FIG. 10F the vertical beam angle error is reduced more than a factor of 10.

Figure 10G:
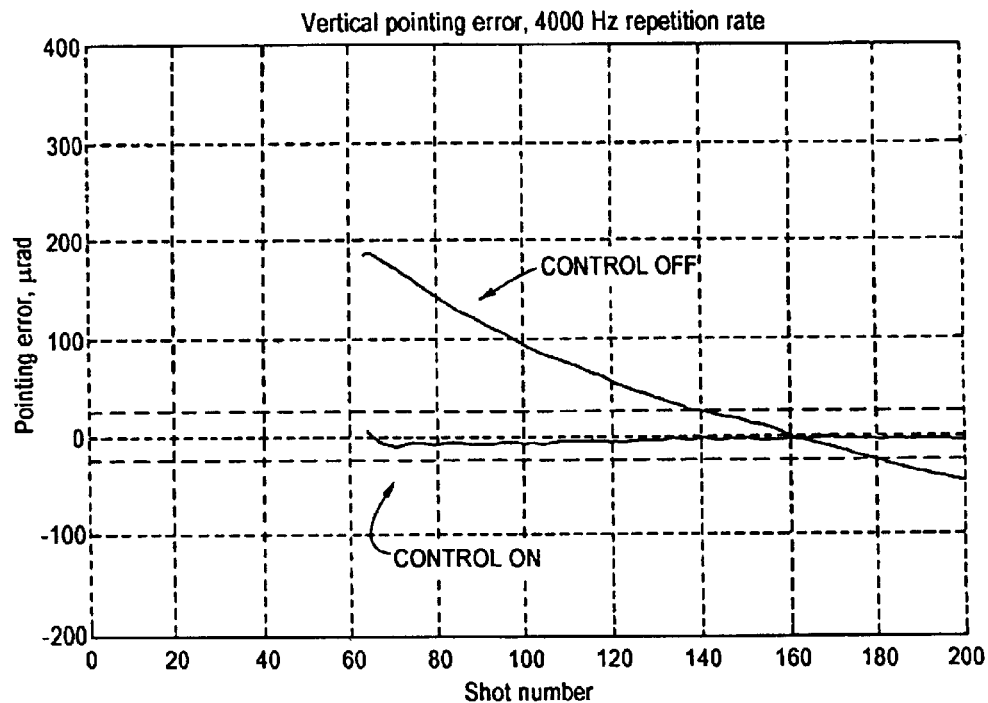

In FIG. 10G the actual measured angle for each shot in a burst is presented. The pointing angle change at the beginning of a burst is the same in both cases; but when the sensor measures a significant angle error, the controller determines the proper command to send to the actuator, which quickly corrects the beam angle to near zero. The result is a moving average performance that is greatly reduced from the uncontrolled case.

Figure 10H:
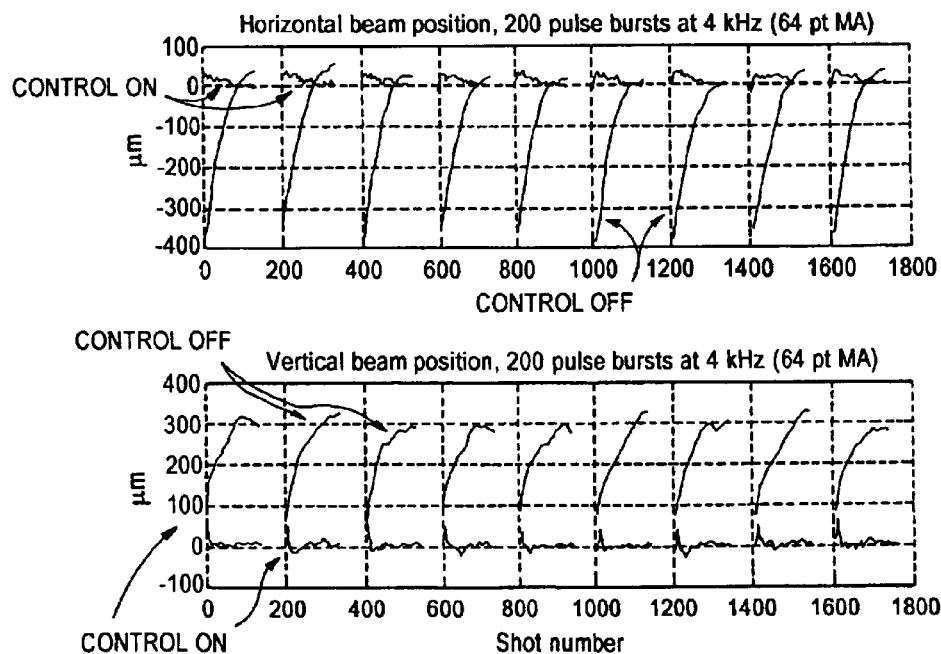

In FIG. 10H the same laser is used with the sensor equipment arranged to measure beam position rather than beam angle.

Purge Shutters for Mirrors

The BDU volume could be large, as much as 200 liters and must be purged with high purity $N_2$. This purging process may take several hours to get to the fee ppm level of oxygen and other organics. During the first installation of the BDU to the scanner, this purge time is acceptable, but is considered very long during normal operation.

Figure 7:
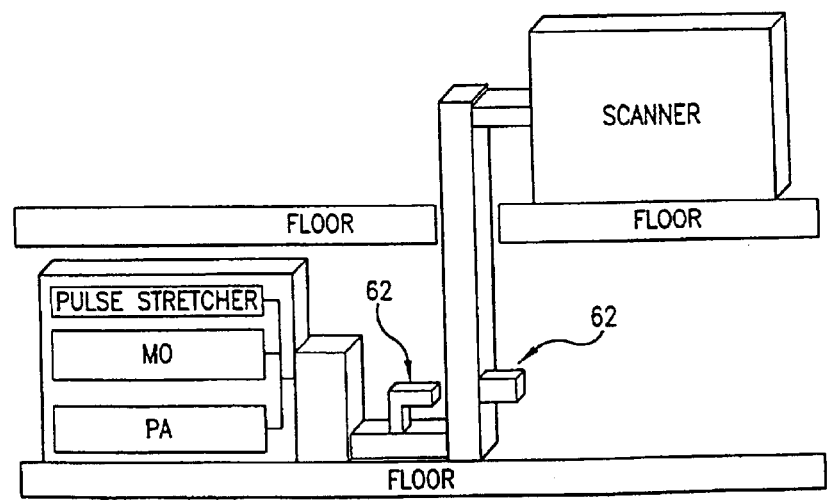
FIG. 7 shows a laser light source with beam delivery to a scanner.

Assume that a mirror, such as mirror 40A in FIG. 1 needs service. This may entail dismantling the mirror from BDU which could expose BDU to air. Hence, what could be a brief service procedure (replacing the mirror) turns into a very long purge procedure. To avoid substantial delays associated with a long purge period to restore the quality of the beam path in the BDU, BDU shutter units 62 are added on both sides of each mirror in the BDU as shown in FIG. 7.

Here, in the BDU are located several inserts where service shutters may be inserted to isolate the other regions in a BDU. These shutters are normally not inserted during operation. For example, as shown in FIG 7 two shutters are slid between mirror 60 that needs to be isolated and then the mirror itself is replaced. After that, this exposed region is now purged with $N_2$ for a few minutes. The purging interval is much shorter now due to the fact that the volume exposed to air is much smaller than the total volume of the BDU. Preferably during the servicing purging continues in all regions of the beam path other than that between the shutters.

Another technique is to use a beam tube flapper segment as shown in FIG. 11O. This is a short beam segment containing a mechanical flapper valve that is open when a module is connected to it as shown by dashed lines 301 and closed when the module is removed as shown at 303. A spring not shown provides sufficient force to keep the flapper in position shown at 303 and that force will be supplemented by the pressure of the (above atmospheric) purge gas in cavity 305. The installation of an optics module at location 307 will force the flapper into position 301 to open the flapper segment.

BDU-Part of Laser

Another advantage of providing the laser beam at the entrance port of the scanner is that the beam delivery unit now becomes the responsibility of the laser supplier for not only design and manufacture but also for pro-active preventative maintenance so as to minimize downtime and increase system availability.

Various Laser-BDU-Scanner Configuration

Another advantage is that the beam delivery unit can be designed as part of the laser system to suit the location of the laser with respect to the lithography machine. FIG. 1 shows a typical configuration but most lithography installations are unique and many other configurations are expected to be utilized. Some of the various possible laser—BDU—scanner configurations are shown in FIGS. 4A, 4B, 4C and 4D.

Second Prototype Beam Delivery Unit

Figure 11A:
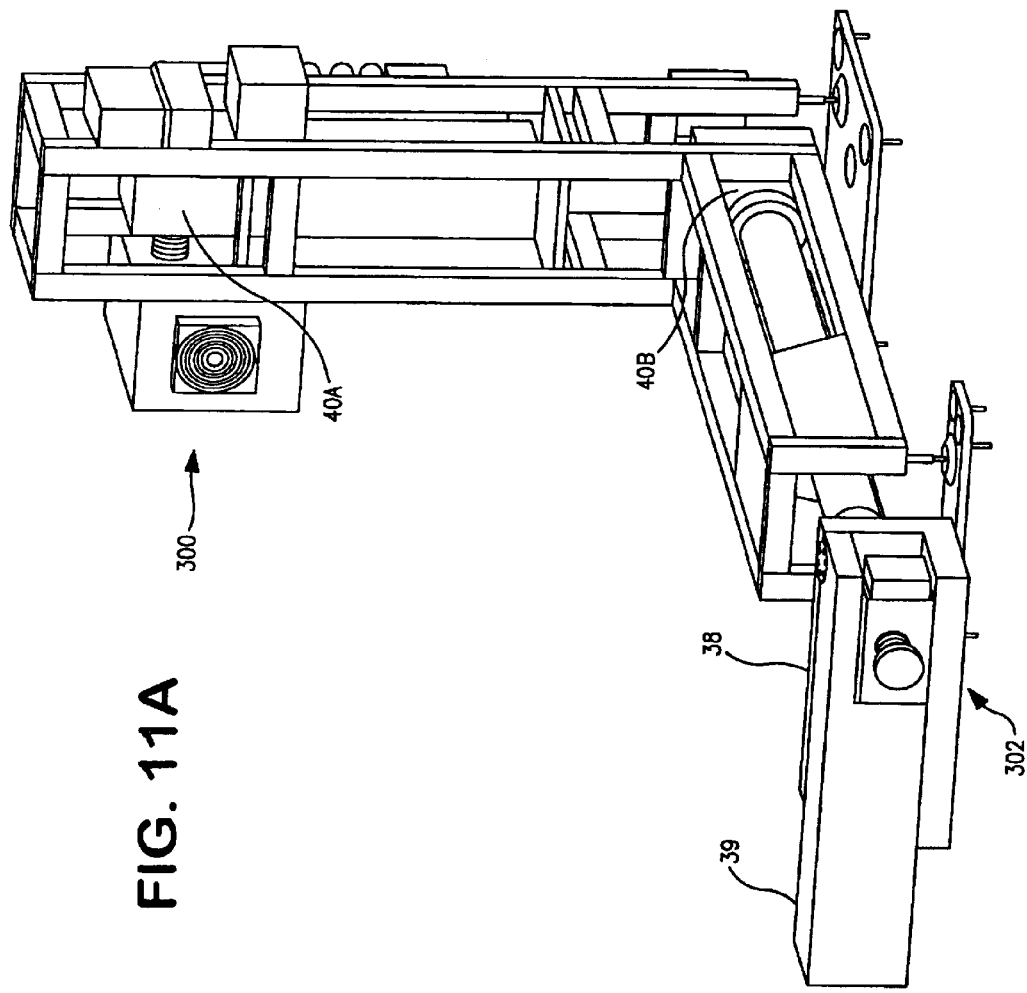
FIGS. 11A through 11O show features of a beam delivery unit.
Figure 11B:
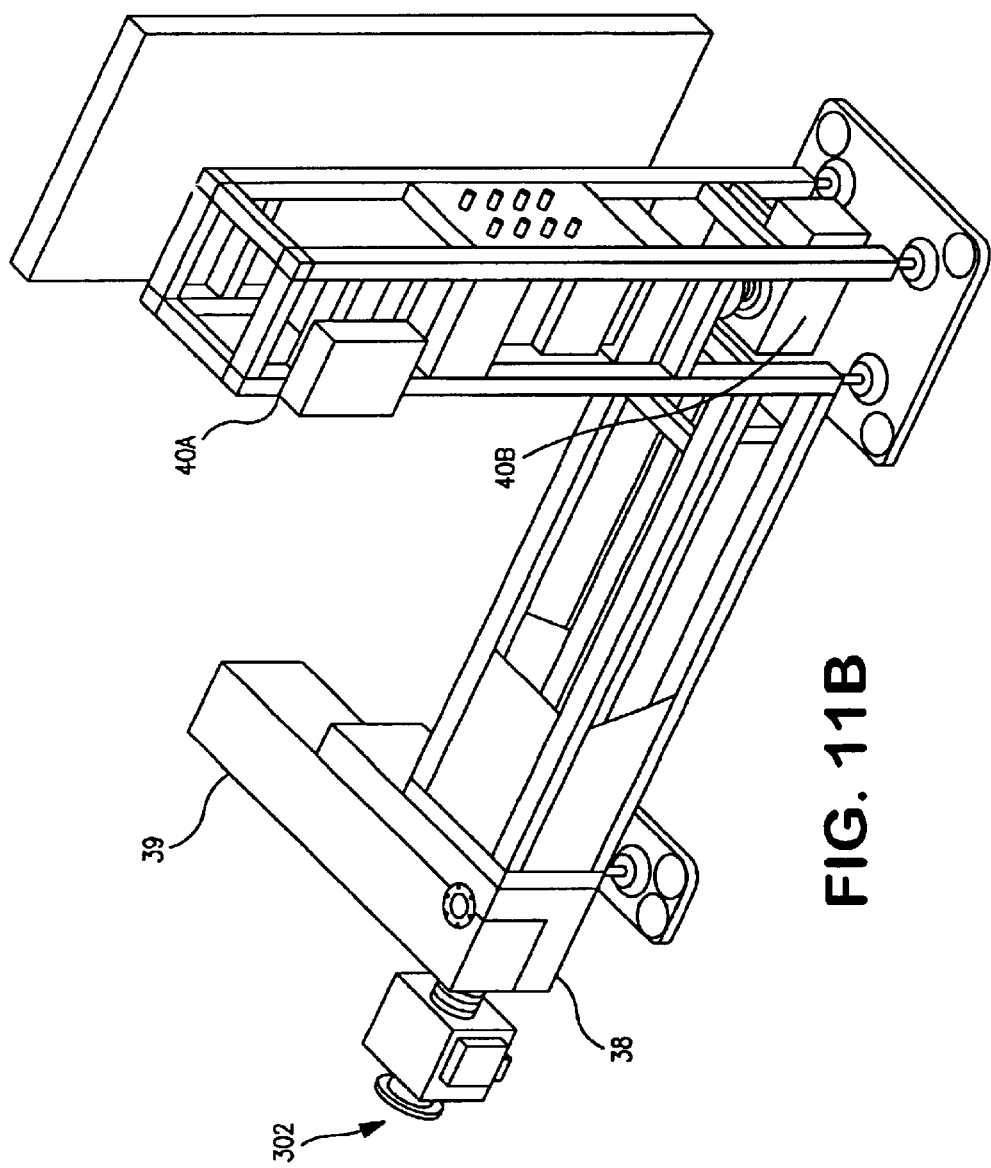

A second production ready prototype beam delivery unit built and tested by Applicants is shown in FIG. 11A. The output of a laser system enters the BDU at location shown at 300 and the BDU delivers the beam to a stepper machine at location shown at 302. The beam path is completely enclosed and is purged with nitrogen. The unit includes metrology module 38 and two high speed precision turning mirrors 40A and 40B. Beam stabilization controller is shown at 39. Another view of the prototype unit is shown in FIG. 11B.

Figure 11F:
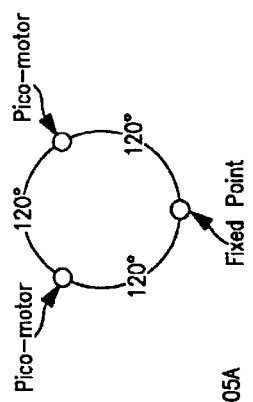
Figure 11E:
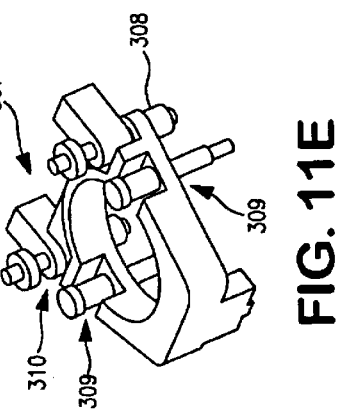
Figure 11D:
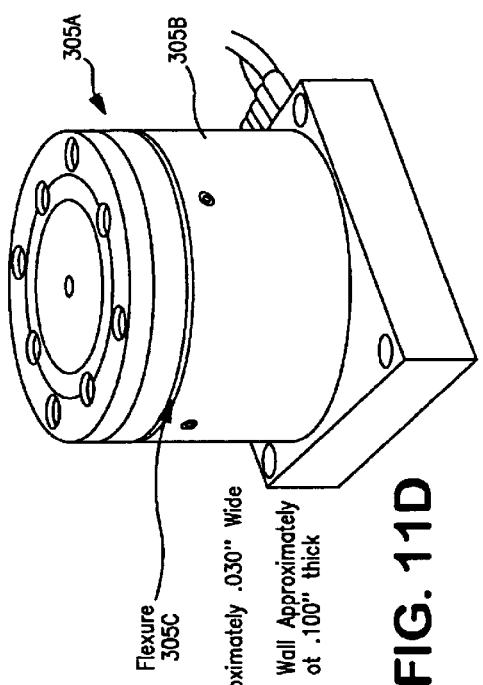
Figure 11C:
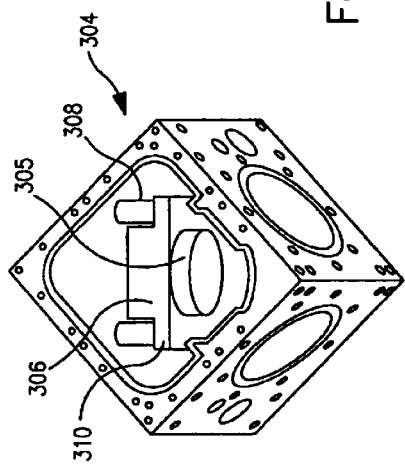

One of the two high speed precision turning mirrors is shown in FIG. 11C. A cut-a-way of this mirror unit is shown at 304. This mirror includes a very fast two-axis piezoelectric driver fast steering mirror 305 with a one milliradian range. Mirror 305 and the base 306 on which it operates is driven by pico motor steering unit 307 comprised of two pico motors 308 and 310 and a pivoting ball joint (not shown). The pico motor steering unit provides a tip-tilt turning range of 9 milliradians.

FIG. 11D is a drawing of the piezo driver unit 305A for driving fast steering mirror 305. The driver unit is comprised of four piezoelectric drive units mounted inside metal casing 305B. A flecture feature 305C cut in the walls of casing 305B permits tightly controlled precise pivoting of the mirror unit for mirror 305.

FIG. 11E shows pico motor steering unit 307 and FIG. 11F shows how the two pico motors pivot the unit to provide tip and tilt. The motors operate against spring units 309. Fast steering mirror 305 fits in the circular cavity in unit 307. Fast steering units driver as shown in FIG. 11C are available from suppliers such as Polytec PI, Inc. with offices in Alburn, Mass.

The beam positions and beam directions are monitored by stabilization module 38 at the input port of the stepper machine. Four 512-pixel photodiode arrays are used to monitor the horizontal angle, vertical angle, horizontal position and vertical position.

Figure 11G:
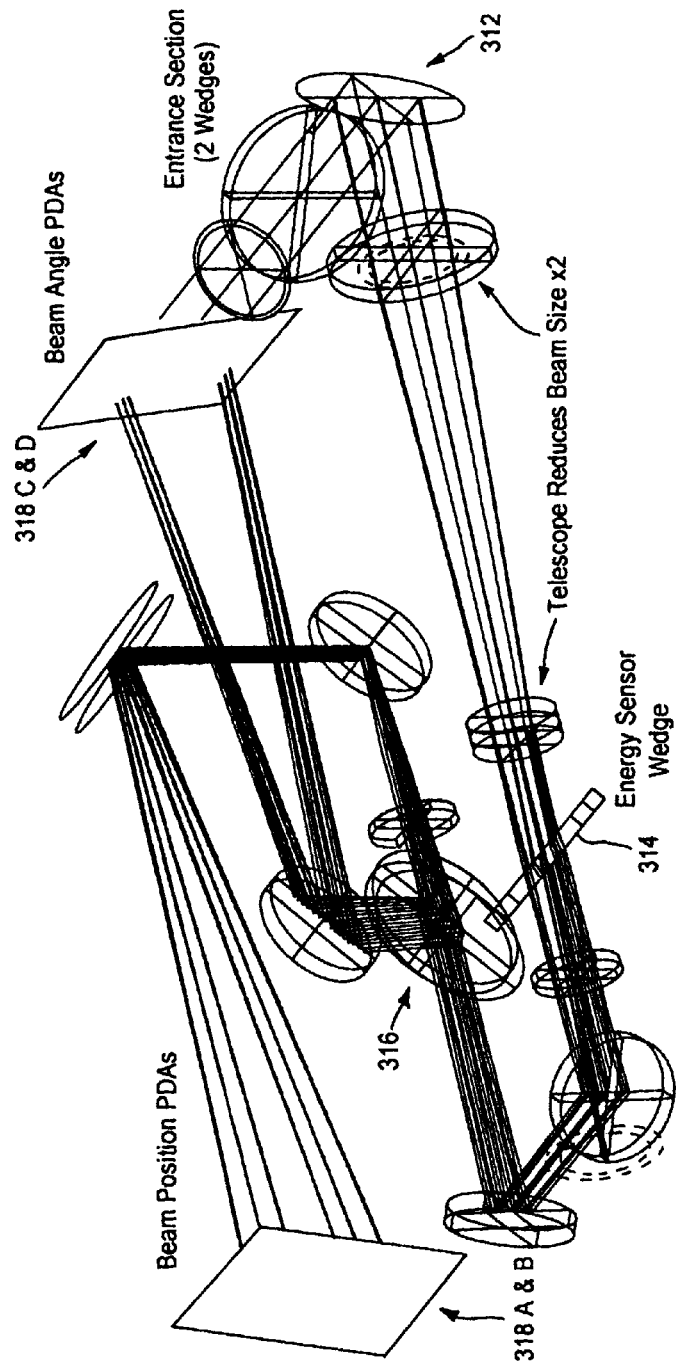
Figure 11H:
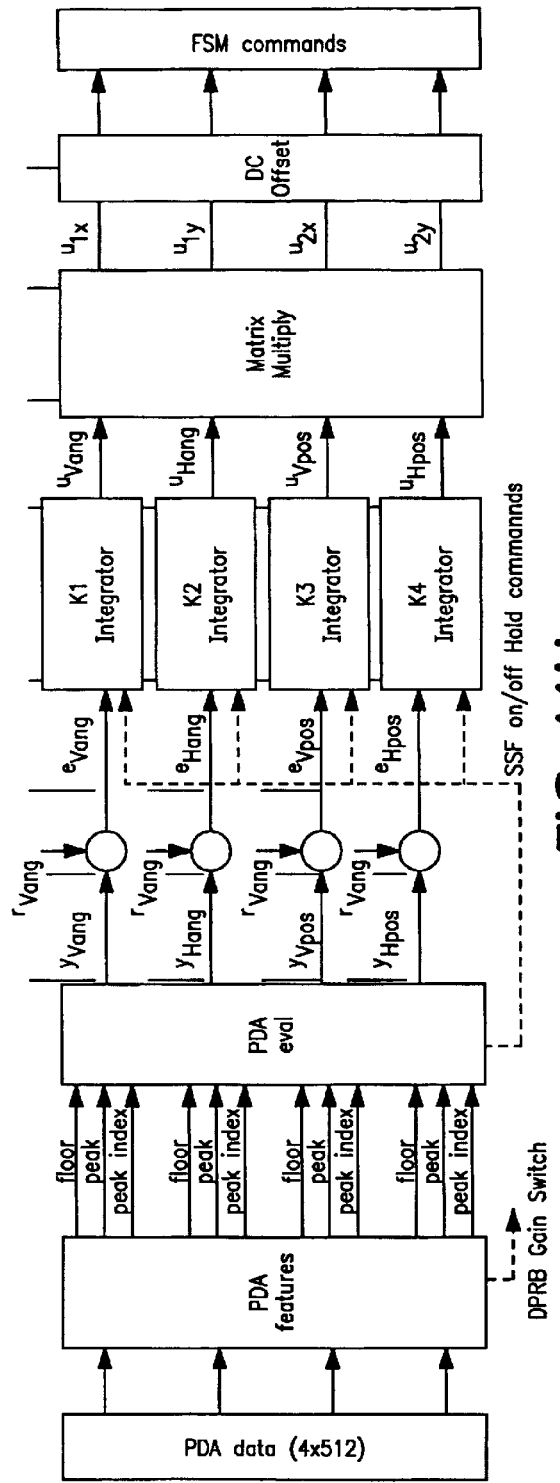

As shown in FIG. 11G, a portion of the laser beam is picked off at 312, reduced in size, split into four separate beams using wedge 314 and beam splitter 316 and then directed to the four photo diode arrays 318A-D. The technique for monitoring the beam position and direction is described above in the section entitled Beam Pointing Control. FIGS. 11H, I and J demonstrate a preferred algorithm for controlling mirrors 40A and 40B based on data collected by the stabilization module 38.

In this preferred algorithm the turning mirror 40A is used to control beam position at the output of the beam delivery unit and turning mirror 40B is used to control the beam at the output.

The fast steering mirror provides fast response and the pico motor unit controls long term drift and provides correction when optics are realigned.

Second Prototype Test Results

Figure 11L:
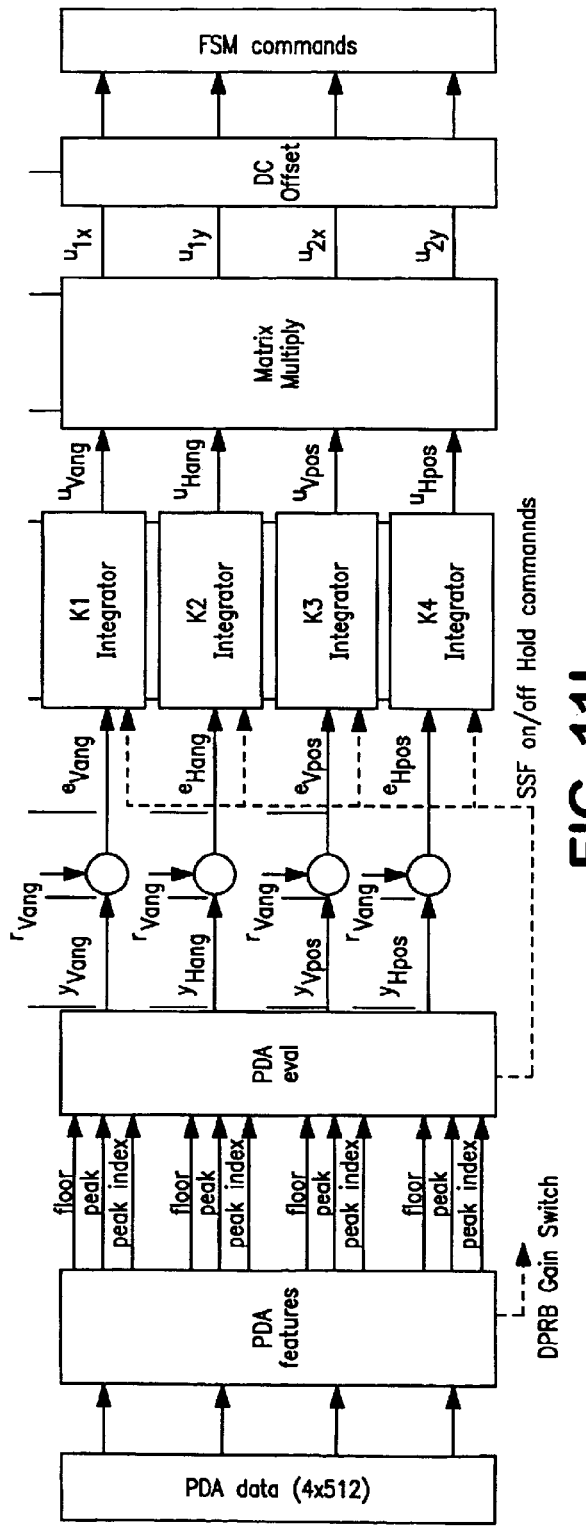
Figure 11J:
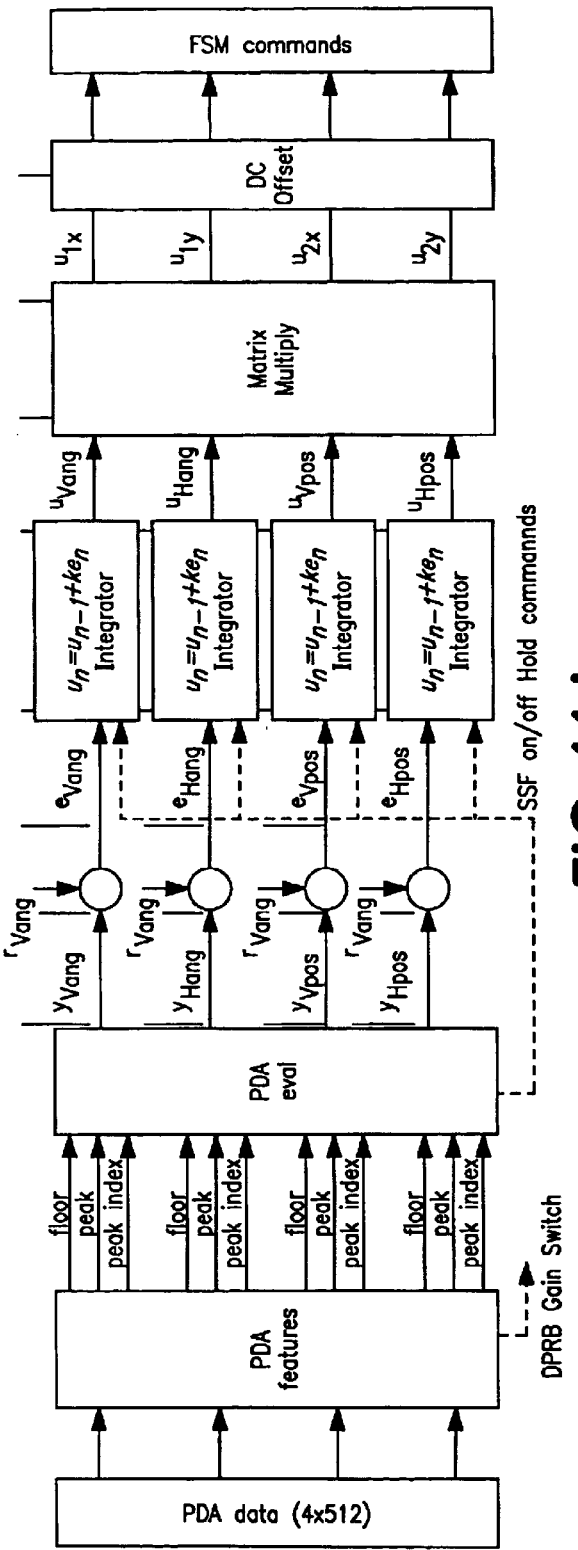
Figure 11K:
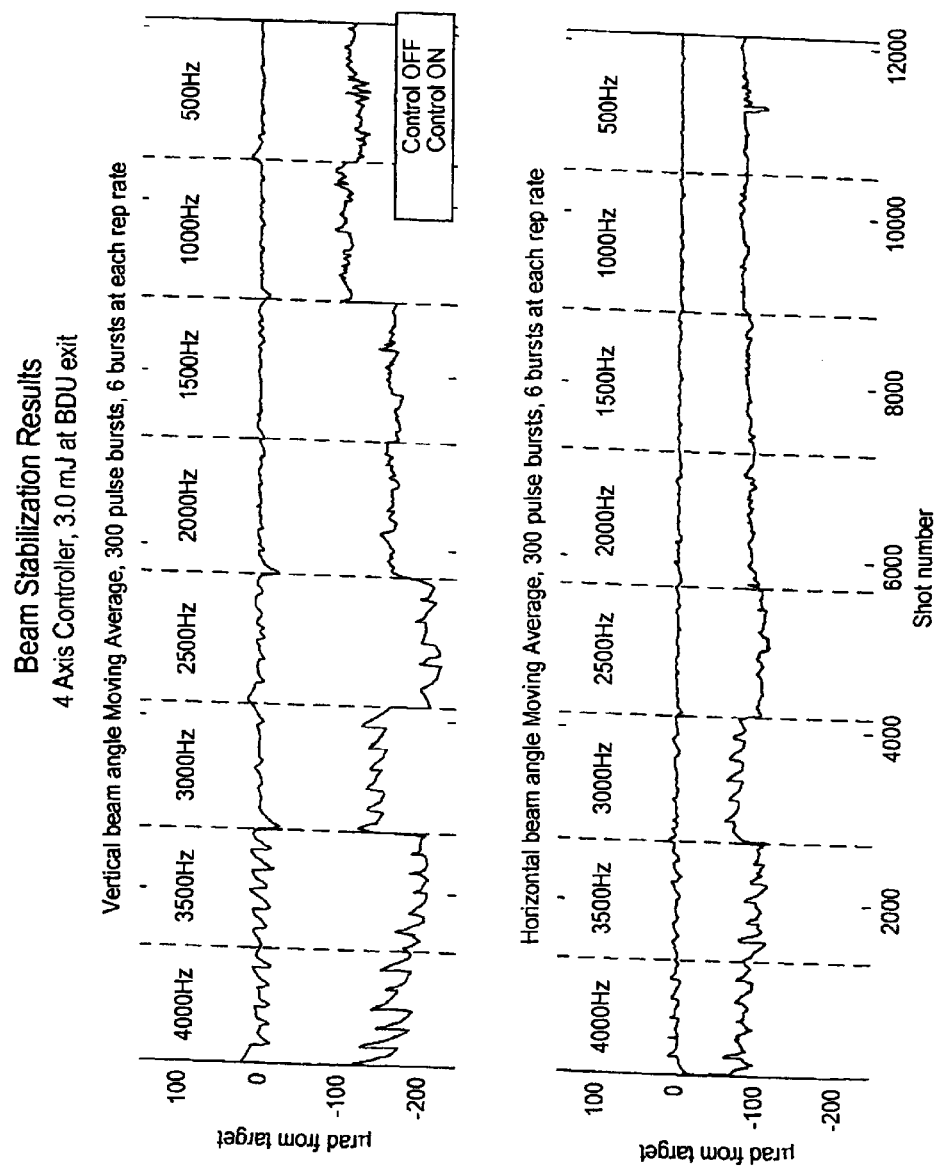
Figure 11L:
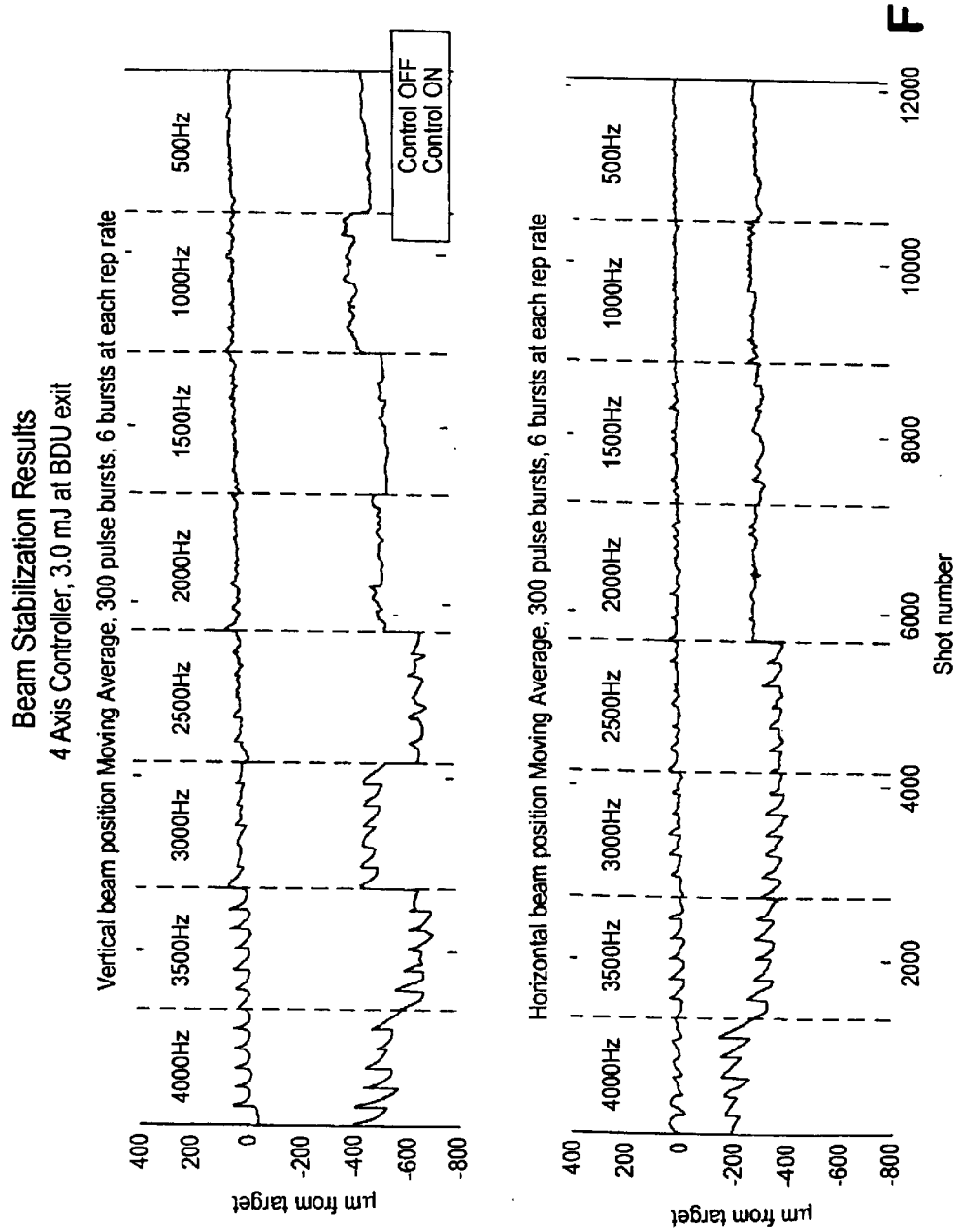
Figure 11N:
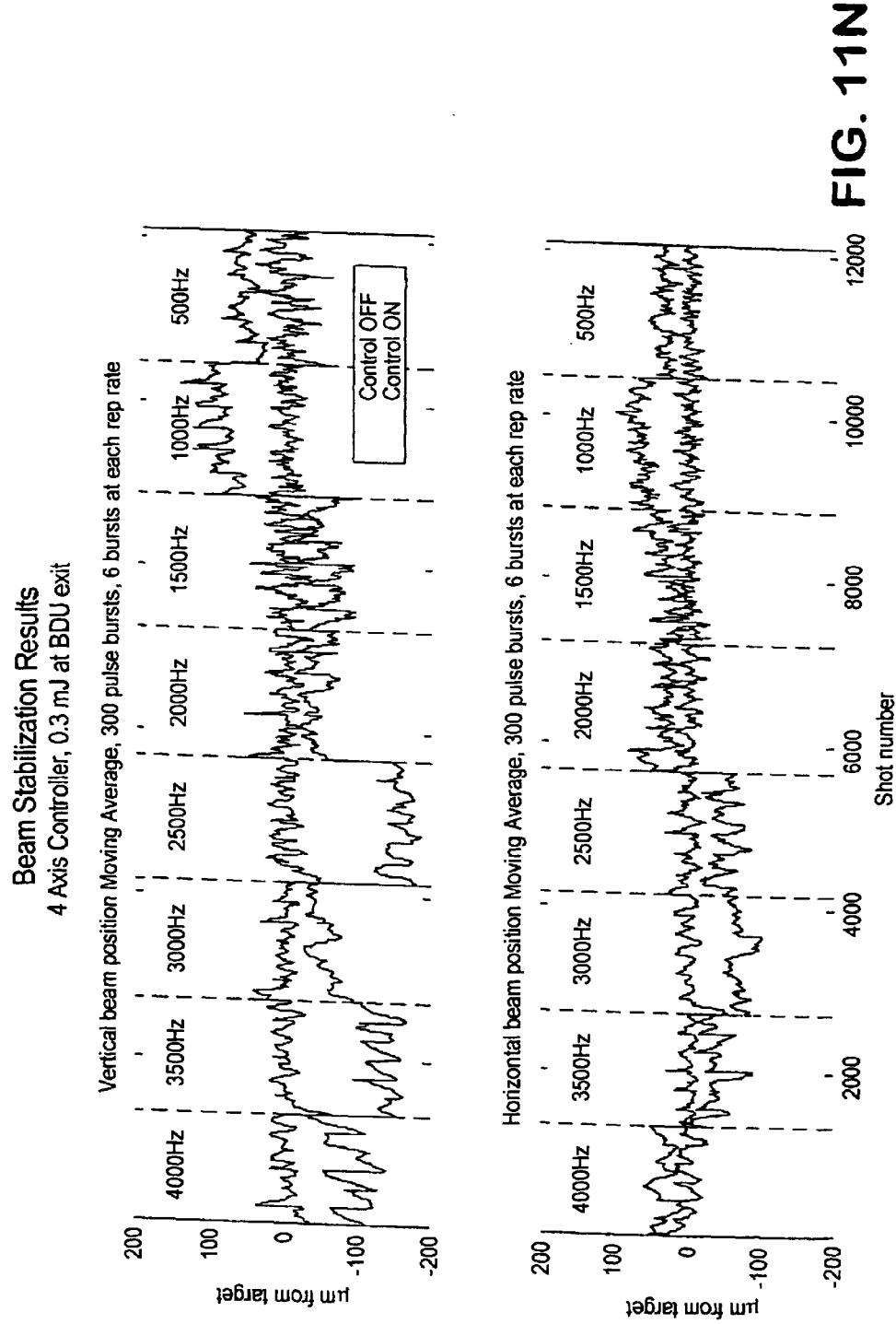
Figure 110:
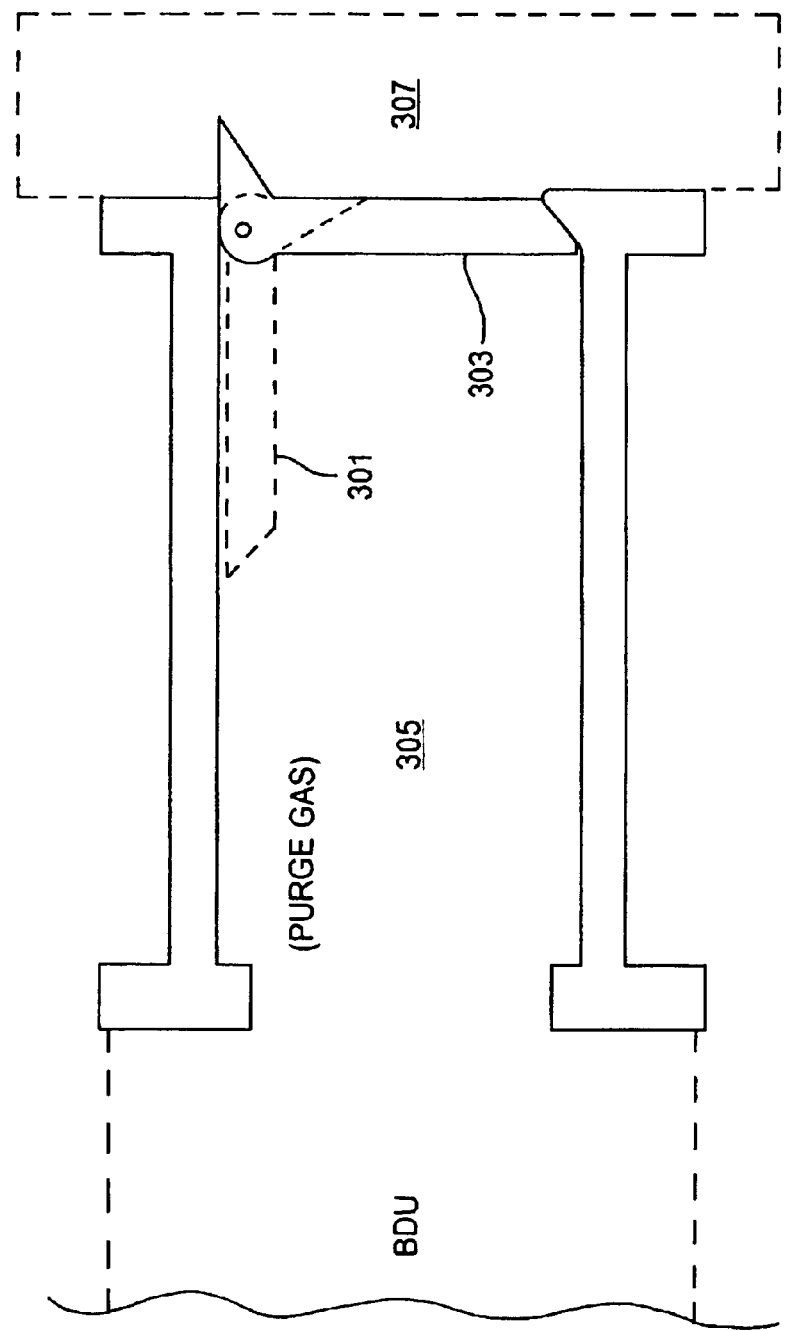

Actual test data showing the excellent performance of this beam delivery unit is shown in FIGS. 11K, 11L, 11M, 11N. FIG. 11K shows angle control with the control on and off. FIG. 11L shows position control. FIG. 11M shows angle control at low output energy and FIG. 11N shows position control at low output energy. In all cases the controlled values are maintained on target well within specifications shown by dashed lines, whereas the uncontrolled values are typically out of specifications.

POLARIZATION CONSIDERATIONS

In the master oscillator resonant cavity optical components including two windows and three prisms are oriented with surfaces oriented vertically providing several angles of incident, with the developing laser beam, close to Brewster's angle. Therefore, beam 14A exiting the master oscillator is strongly polarized with about 98 percent of the electric field component of the beam being in the horizontal direction and about 2 percent being in the vertical direction.

Figure 4A:
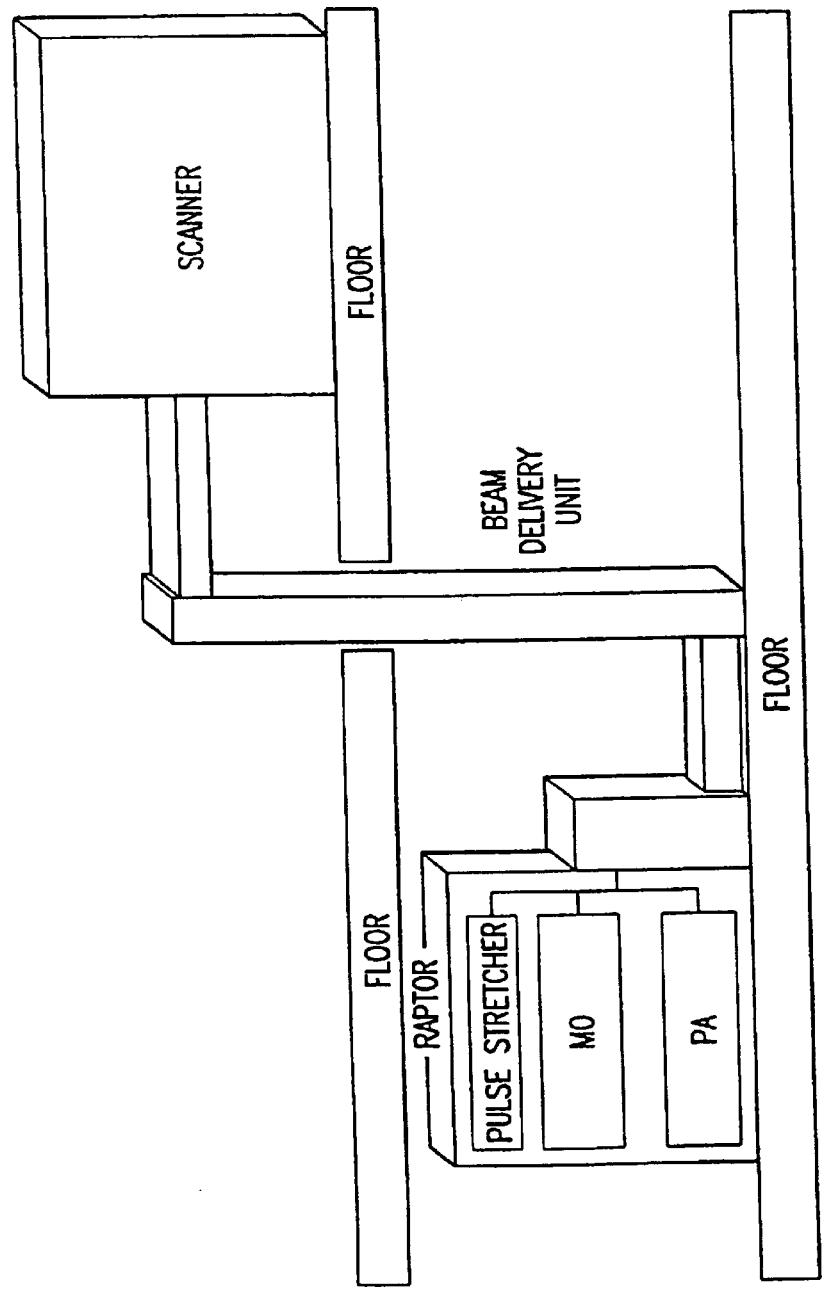
Figure 4B:
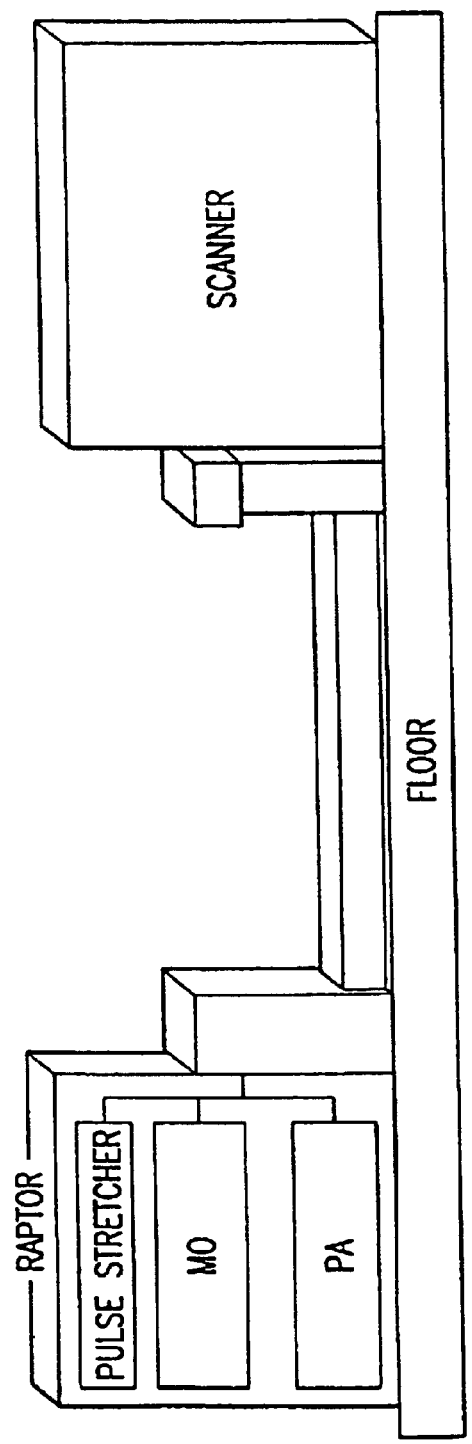
Figure 6:
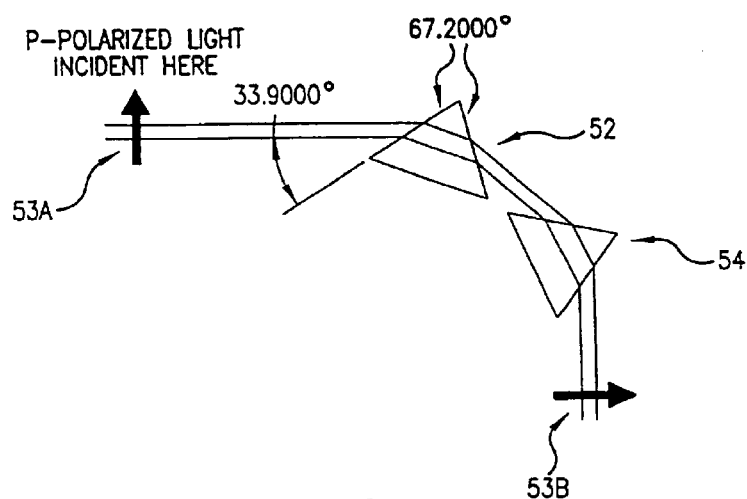
FIG. 6 shows a technique of tuning a beam 90 degrees with prisms.

When using dielectric coated mirrors at 45 degrees for beam turning, it is important to take into consideration polarization effects because with these mirrors S-polarization is reflected nearly 97 percent whereas P-polarization is reflected only 90 to 92 percent. (P-polarization refers to the electric field component of the light which is in the plane defined by the beam direction and a line perpendicular to the optical surface at the intersection of the beam direction and the surface. S-Polarization refers to the direction of the electric components of the light in the plane of the surface and perpendicular to the P-polarization). Therefore, to maximize reflection from turning mirrors, it is important that the S-polarization direction corresponds to the polarization of the incoming beam. As the reader will note mirrors 40A and 40B are both oriented so that the S-polarization direction is horizontal corresponding to the electric field direction of about 98 percent of the light in output beam 14C; therefore reflection should be about 97 percent from these mirrors. The mirror shown in the BDU shown in FIGS. 4A, 4B and 4C are all properly oriented from maximum reflection of horizontally polarized light. However, the mirror shown at 50 in FIG. 4.D is oriented so that the P-polarization direction is in the direction of the electric field direction of 98 percent of the light in the beam so that reflection by this mirror would be only about 90 to 92 percent. In this case Applicants preferred solution is to utilize two prisms to make the 90-degree beam turn at the 50 location in FIG. 4D. This technique is shown in FIG. 6. Two prisms 52 and 54 with an apex angle of 67.2-degrees (the angle is important) can change the angle of incidence by 90 degrees for the s-polarized light. The beam enters and exits the prism at Brewster angle, so there is no reflection at all of light in the horizontal direction. The portion of the beam polarized in the vertical direction would be mostly reflected by the first prism. The layout is done for 193 nm and $CaF_2$ prisms. (Minor modifications would be needed for 248 nm or 157 nm). Since no coatings are involved, the lifetime of this assembly is very high.

As the horizontal polarized light passes through the two prisms at location 50 in FIG. 4D the direction of polarization of substantially all of the electric field components is reoriented from horizontal to vertical as indicated by arrows 53A and 53B as shown in FIG. 6. For this reason at mirror 56 the electric field components of the beam are substantially all vertical so that mirror 56 mounted vertically provides an s-polarization orientation with respect to the beam and about 97 percent of the light is reflected by mirror 56.

Specially Cut $CaF_2$ Chamber Windows

Applicants have determined that loss of polarization due to intrinsic birefringence can be greatly minimized by proper cutting of crystal windows from $CaF_2$ ingots during the process of making the crystal windows.

Recent testing of $CaF_2$ by Applicants has shown unexpectedly that at high fluence a small intrinsic birefringence of $CaF_2$ will cause the polarization of 193 nm laser light to rotate. Although this effect can be tolerated in 193 nm lasers, the problem will be significantly worse in 157 nm lasers. Control of polarization in DUV lasers is critical for the proper operation of the laser and is required to meet customer specifications. Below we describe a specific cut and orientation of $CaF_2$ so that the intrinsic birefringence is minimized, and the sensitivity to orientation is minimized.

Figure 14B:
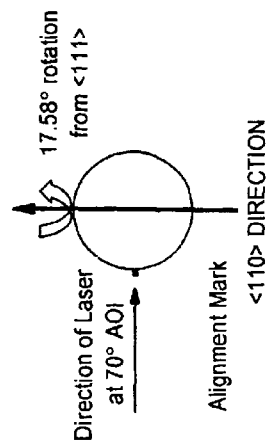
FIGS. 14A–D shows techniques for preparing CaF$_2$ windows and beam splitters.
Figure 14C:
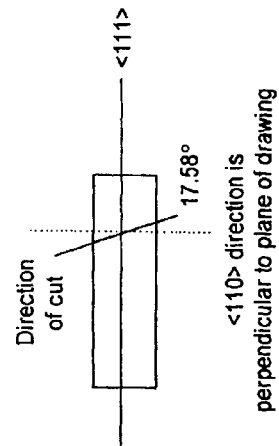
Figure 14A:
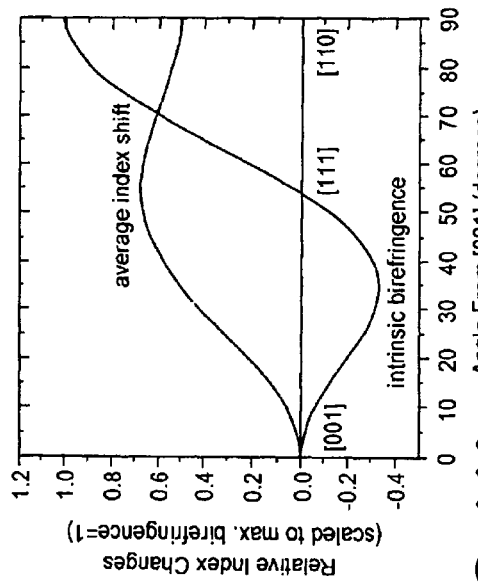
Figure 14D:
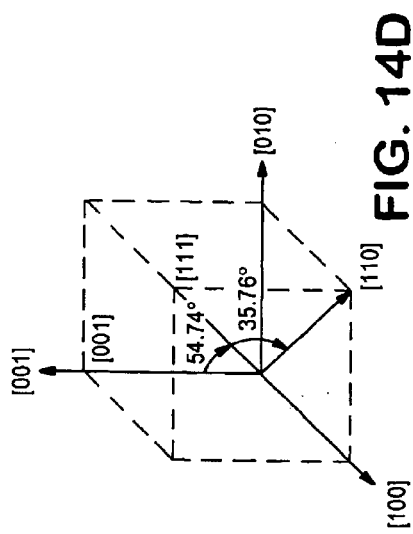

$CaF_2$ has zero intrinsic birefringence in the <111> and <100> directions. The preferred growth direction of $CaF_2$ as well as the typical orientation of optical components is in <111> direction. FIG. 14A shows the calculated magnitude of intrinsic birefringence as a function of angle between the incident beam direction and the $CaF_2$ [001] direction as shown in FIG. 14D. A detailed explanation of these effects are provided in an article by J. H. Burnett, et al., JM 3, Vol. 1, No. 3, October 2002.

For laser chamber window to be mounted with a 70 degree angle of incidence (which is preferred window orientation for the PA chamber 10 as shown in FIG. 1 the window is preferably cut and marked as follows:. From FIG. 14A it is clear that the <111> and <100> (<100> is equivalent to <001> and <010>) directions have zero birefringence. However, the <100> directions (including <010> and <001>) are much less sensitive to minor mis-orientations. A typical specification for optical orientations is +/−2.0 degrees.

Using Snell's law, Applicants calculated that at 157.63 nm, and a 70 degree angle of incidence, the laser beam travels 37.08 degrees from the normal to the face. Since the <100> direction is 54.74 degrees from the <111> direction, the direction of the special cut can be determined: [54.74−37.08=17.58 degrees from the <111> direction] However, the ingot must be properly oriented along two specified axes. Using crystal orientation techniques (X-ray Diffraction, cleavage planes, etc.) the <110> direction must be identified on the cylindrical ingot. With the <110> direction pointing in the vertical direction (out of the page as shown in FIG. 14C) the ingot can then be cut 17.58 degrees to the <111> direction (which is parallel to the cylinder axis). A mark should be made on the window so that it can be properly oriented in the laser system as shown in FIG. 14B. This invention can be used at other angle of incidence as well. For example, at 47 degrees, the window would be cut at 26.76. degrees from the <111>.

Birefringence Testing and Clocking of $CaF_2$ Optics

Applicants have discovered that the adverse effects of this $CaF_2$ birefringence referred to above can be greatly minimized using a "clocking" technique developed several years ago by Applicants for $MgF_2$ optics which are well known to be birefringent.

Figure 15A:
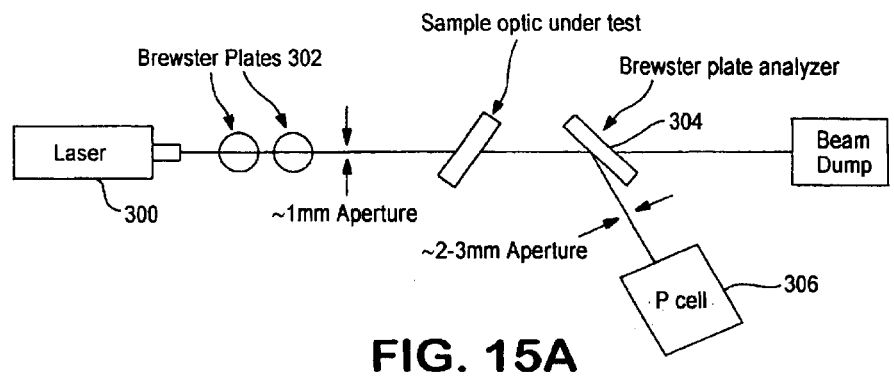
FIGS. 15A–C shows techniques for clocking birefringent windows and beam splitters.

FIG. 15A shows the optical arrangement used to measure the birefringence of $CaF_2$ windows. The output from a line-narrowed, 248 nm laser 300 is reflected off two Brewster plates 302 to ensure a high degree of horizontal polarization. The beam is then passed through the sample under test and finally analyzed by measuring the reflected energy from another Brewster plate 304 held in the minimum reflection orientation.

If the sample under test exhibits any birefringence it will rotate some amount of the beam energy into the vertical polarization and thus will be detected by a power cell 306 placed after the Brewster plate. With no sample in place, the angle of the Brewster plate is adjusted for minimum signal in order to most precisely find Brewster's angle. The polarization ratio of the beam is estimated to be at least 1000:1 based on the intensity levels of the reflected beam and the transmitted beam through the Brewster plate. Once Brewster's angle is set, the laser shutter is closed and a zero level is recorded for the Pcell and subtracted from all subsequent readings.

The sample is held in a rotation stage positioned to simulate the 47 degree angle of incidence typically used in prior art chambers. The rotation stage spins the sample about its central axis while the Pcell readings are recorded. Because of the mechanics of the rotation stage, the beam cannot pass through a different portion of the sample for each data point. If there is any dust or other inclusions on or in the sample, the measurement data will be affected for those angles that bring these items into the beam path.

Figure 15B:
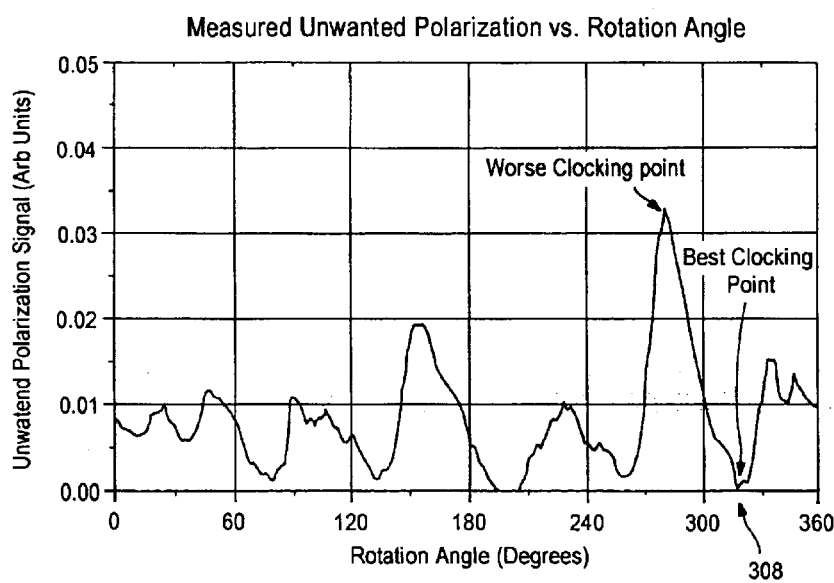

A typical measurement result is shown in FIG. 15B. Because of the three-fold symmetry of the CaF$_2$ crystal, there should be six minima and six maxima. The minima correspond to the angles with theoretically no birefringence. Three of the six maxima correspond to rotations to the left and the other three correspond to rotations to the right.

The original measurement method developed by Applicants several years ago when they were using a MgF$_2$ plate placed in front of a sample to expose the sample to some laser energy in the unwanted polarization. This method leads to an attractive, waveshape when measuring from 0 degrees through 360 degrees as the symmetric CaF$_2$ crystal rotates the polarization to the left and then to the right in periodic cycles. Since the desired use for these optics is for minimum creation of unwanted polarization a rotation producing a minimum "signal method", is selected for the optic as shown at 308 in FIG. 15B.

To test if properly clocked chamber windows might help improve this situation, a CaF$_2$ window was heated while monitoring its birefringence, both in a properly clocked orientation and the worse case orientation. The optic was heated with a heat gun placed about two feet away from the optic and positioned the same for both clocking orientations. The optic was held with the holder used for measuring birefringence and thus was free to expand in a relatively stress free manner.

Figure 15C:
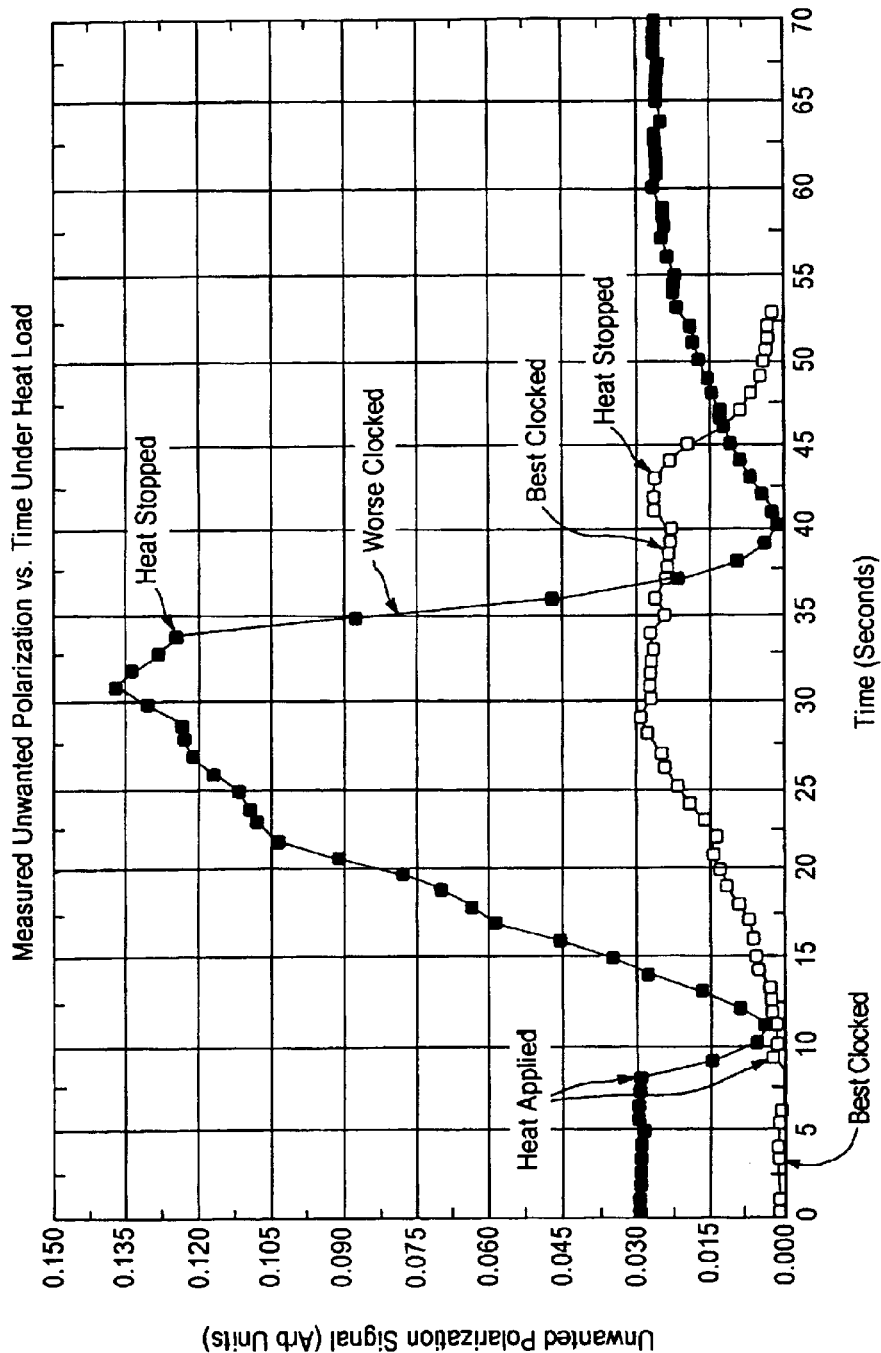

FIG. 15C shows the measured unwanted polarization vs. time for both orientations. The properly clocked results show about a 4× reduction in unwanted polarization. Note also the difference in unwanted polarization signal while unheated, as expected from the two chosen closing positions shown in FIG. 15B. It is also interesting that for the improper clocking orientation the unwanted polarization signal first passed through zero and change directions before increasing. One can imagine the shape of this curve if it had not been "half wave rectified", that is passing through zero into negative values making a nice exponential shape.

Orientation of CaF$_2$ Crystals for TIR Turning Prisms

For TIR turning prisms and the beam reversing prism shown in FIGS. 3A–3F the beam passes within the optic in two directions, which are perpendicular to each other. To minimize adverse consequences of polarization shifts, the CaF$_2$ crystal preferably is cut and oriented such that both beams propagate in direction of the <100>, <010> or <001> crystal axes. The beam polarization should be also aligned to one of these axis as shown in FIGS. 3A(1) and 3B(1). In this configuration the intrinsic birefringence has minimal sensitivity to minor beam misalignments (compare FIGS. 14A, 14D, also see Burnett article referred to above).

Orientation of the CaF$_2$ Crystal in Beam Splitter

Figure 3H:
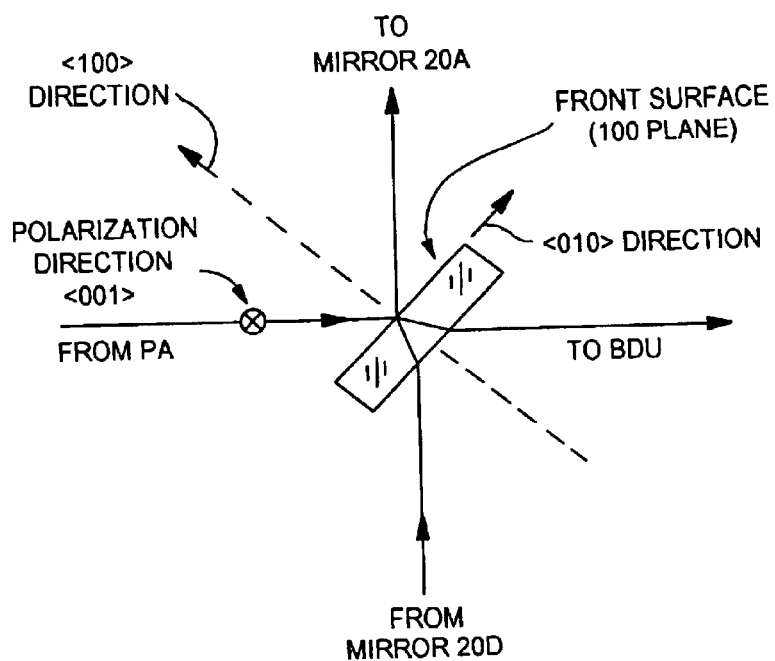

Beams propagate through the pulse stretcher beam splitter in two directions which are not perpendicular to each other. By keeping the plane of propagation of both beams parallel to one of the major cubic crystal planes (i.e., either (100), (010) or (001)) and orientating the crystal so that the polarization direction of the in-coming beam is aligned with one of the major crystal directions (i.e., either <100>, <010> or <001>; the negative effect of intrinsic birefringence can be eliminated. For example, as shown in FIG. 3H the front surface of the beam splitter is cut parallel to the (100) plane (perpendicular to the <100> direction) and the beam splitter is oriented so that the <001> direction of the crystal is aligned with the direct of polarization of the incoming beam (i.e., the horizontal direction). Since the component is rotationally symmetric the clocking technique described above for chamber windows can be applied to ensure that the plane of propagation (i.e., the plane defined by the beam downstream and the direction of polarization) is parallel to the (001) plane with a high degree of accuracy, for each pass of the beam through the beam splitter.

Crystal Orientation in CaF$_2$ Beam Expansion Prisms

In typical prior art line narrowing modules utilized by Applicants employer for several years, there are 3 or 4 right angle prism used for beam expansion where the incoming beam (from the laser chamber) exits near perpendicular to exit plane of each prism. (A line narrowing module is shown at 8B in FIG. 1). If this exit plane is the (100) plane, then the beam propagates through the crystal close to the <100> direction. According to the Burnett referred to above, this gives zero intrinsic birefringence if perfectly aligned and near zero intrinsic birefringence as long as the angular variation is minimal. Therefore, in preferred embodiments the exit plane for these prisms should be a (100) plane.

Clocking of MgF$_2$ Windows

The discovery of the need to azimuthally orient CaF$_2$ chamber windows immediately indicated the need to perform the same operation with MgF$_2$ c-cut material. Applicants were already aware of the need to carefully orient the "clocking" of off-axis cut MgF$_2$ when the material is oriented at a compound angle with respect to the beam propagation direction, because of the known birefringent nature of MgF$_2$. Subsequently, Applicants have understood that there is a definite need to "clock" c-cut material, which arises from small angle errors in the crystal cut that are difficult to eliminate during the fabrication process. As a consequence, all MgF$_2$ parts will operate as high-order waveplates except when perfectly cut along the c-axis (which appears difficult to ensure in a practical sense). When such a part is not correctly oriented in the azimuthal sense, the net polarization rotation upon propagation through the material depends strongly on the thermal state of the material, which will lead to highly undesirable duty cycle/optical power loading dependent depolarization in our applications.

The clocking process is basically the same as described above for CaF$_2$. The process is summarized as follows: Establish birefringence axes. Mount the optical element in the orientation that it is used. Mount must be capable of rotation about an axis perpendicular to its surface. Illuminate with highly linearly polarized light (preferably actinic, as short a wavelength as possible). Monitor with analyzing polarizer monitoring orthogonal polarization, as part is rotated about axis previously defined through 360 degrees. An oscillating pattern of maxima and minima will be observed. Part should then be installed in direction that corresponds with best minimum (i.e., least polarization rotation. Install part with orientation as described above.

Orientation of Uniaxial Birefringent Prisms

Figure 13A:
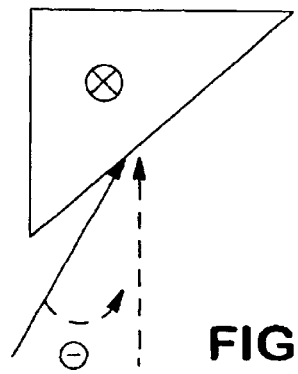
FIGS. 13A–D shows technique preparing and using MgF$_2$ prisms in laser systems.

As stated above CaF$_2$ optics have been used primarily in high intensity portions of ArF and F$_2$ laser beam paths. However, as also explained above surface damage caused by very high fluences may limit the use of CaF$_2$ in these laser systems. MgF$_2$ does not exhibit the same damage as CaF$_2$, but while CaF$_2$ is non-birefringent, MgF$_2$ is uniaxial birefringent. Polarized UV radiation must have the plane of polarization either parallel or perpendicular to the c-axis of uniaxial birefringent crystals, otherwise there will be rotation of the polarization from the incident plane. Additionally, prisms are often used in an application where the incident angle of the polarized radiation to the prism face is adjusted for alignment and optical system optimization. To deal with these constraints, Applicants has proposed a configuration in which the c-axis of the uniaxial birefringent $MgF_2$ crystal is perpendicular to the incident beam and parallel to the incident and exit face of the prism. In this case changing the incident angle θ as shown in FIG. 13A does not change the state of polarization or refractive index of the prism medium.

Figure 13B:
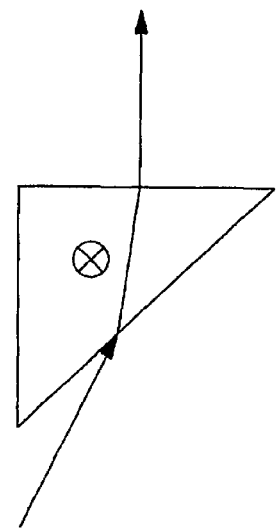
Figure 13C:
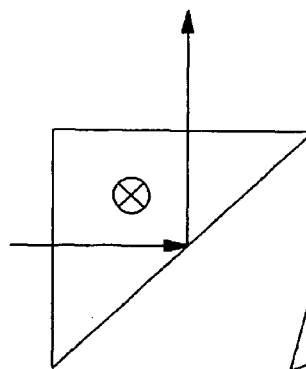
Figure 13D:
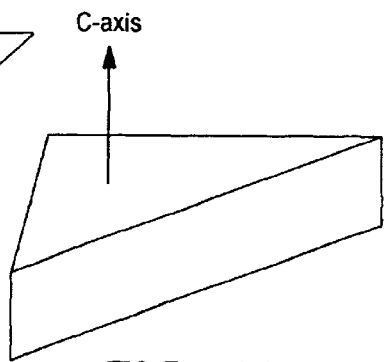

The prism must be cut with the C-axis of the uniaxial birefringent crystal orientated perpendicular to the top face of the prism as shown in FIGS. 13A–D. The mis-orientation of the axis must be minimized (typically less than 0.5%). The prism may then be used as a beam expanding prism beam as shown in FIG. 13B contracting prism (reverse of FIG. 13B) total internal reflecting prism, FIG. 13C or dispersing prism; in each case should with the incident beam perpendicular to the C-axis of the crystal. The polarization state of the incident beam should be either p- or s-polarized with minimal out of plane component. In this configuration, the fraction of polarization out of the incident plan will be dependent on the mis-orientation of the c-axis and parameters can be minimized since the output beam of the laser system described herein is typically polarized to better than 99 percent.

High Speed, Water-Cooled Shutter-Energy Detector Module

Figure 16A:
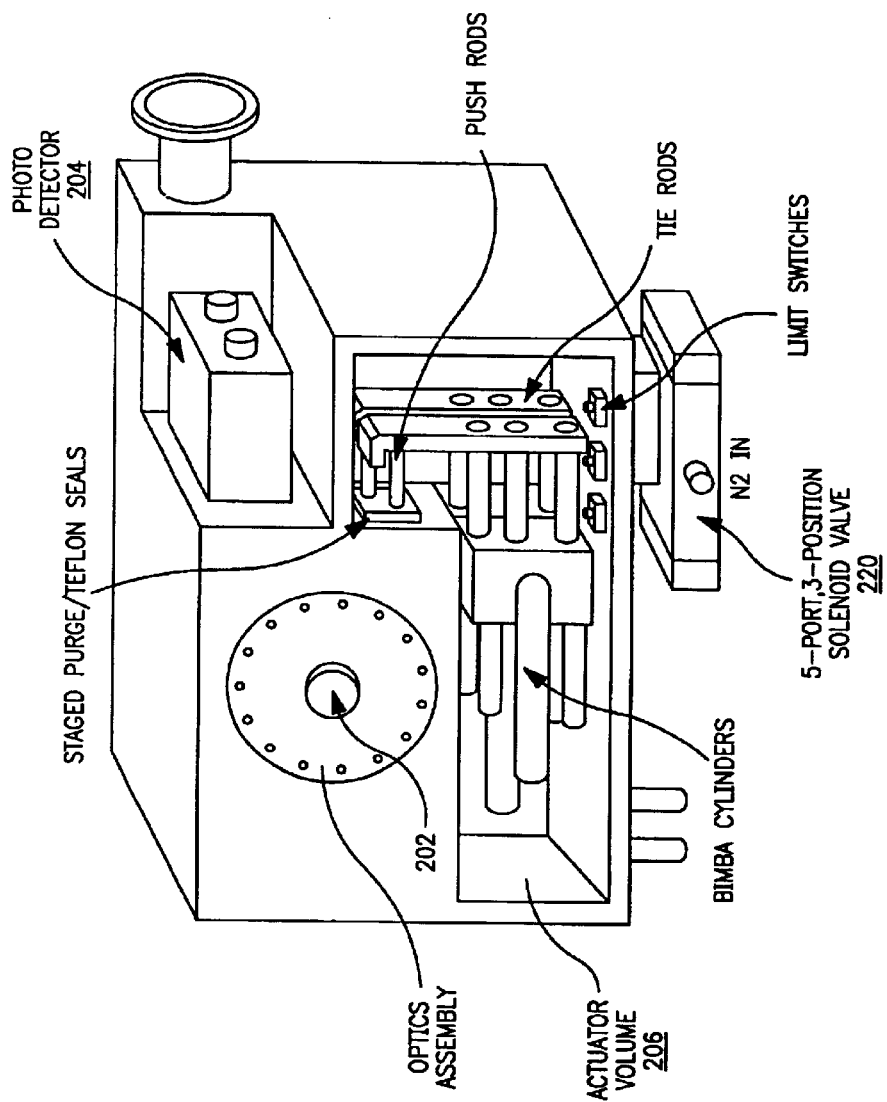
FIGS. 16A through I show features of combination beam energy detector and high-speed shutter.

An Auto-Shutter Module shown at 200 in FIG. 1 includes, a pulse energy detector, calibrating power probe and a fast light weight shutter. A drawing showing one view of the module is shown in FIG. 16A. The beam enters the module at 202 and a very small portion of the beam is reflected by a beam splitter (not shown) and a mirror (not shown) to photo detector 204 which measures pulse energy of each pulse in the laser beam as it exits laser system 4. This FIG. 16A drawing shows an actuator volume 206 where actuators for the power probe and the shutter are located. The drawing also shows actuator cylinders (called Bimba cylinders), tie rods, limit switches, seals, push rods and a 5-port, 3 position solenoid valve.

Figure 16B:
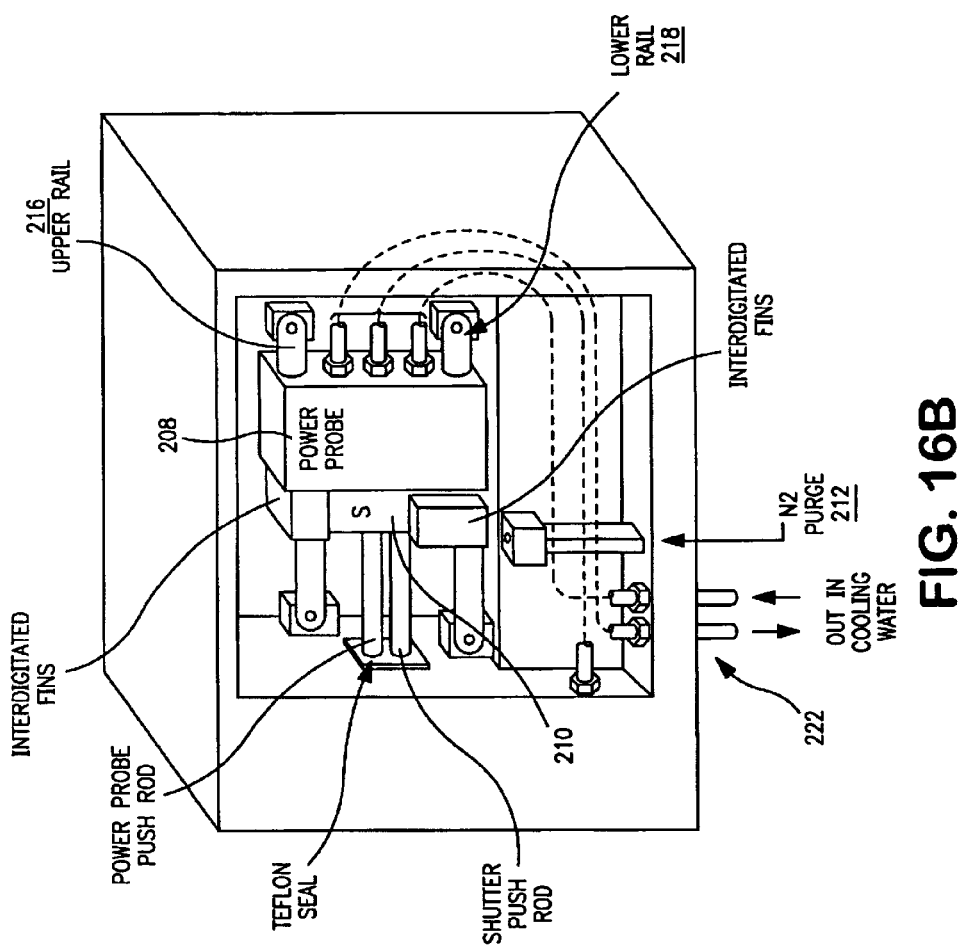

FIG. 16B shows another view of the module showing the power probe 208 and the shutter 210.

Photo-Detector

The photo-detector is mounted in a stationary location within the Auto-Shutter. A beam splitter is used to divert a percentage of the beam to the Photo-Detector. Since the Photo-Detector only diverts a small percentage of the beam it allows the capture of beam characteristics on a shot to shot basis. Detector performance will change over time and in order to capture that change a calibration is performed using the Power Probe at regular intervals.

Power Probe

Figure 16C:
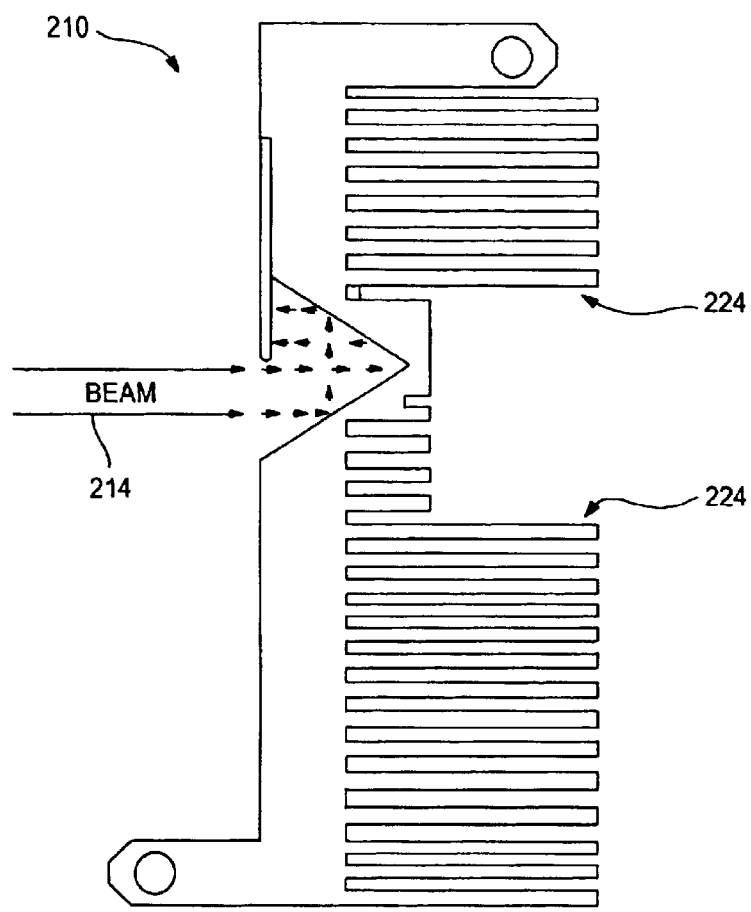
Figure 16D:
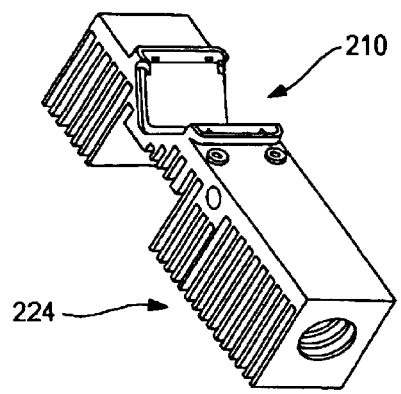
Figure 16E:
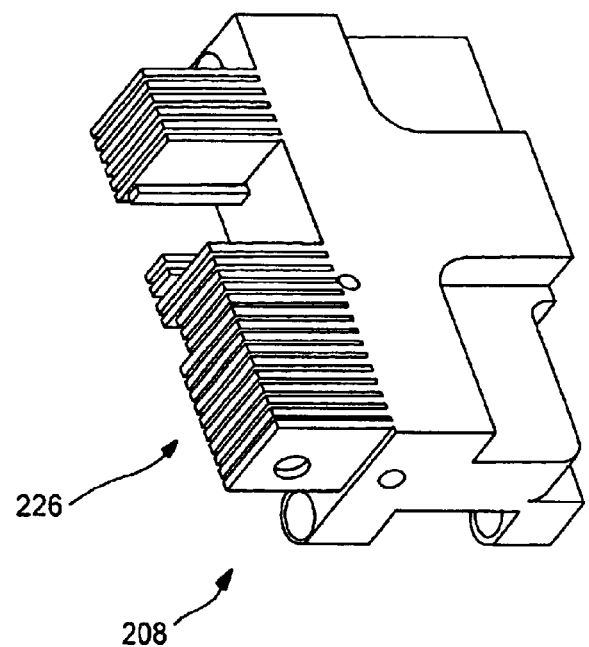
Figure 16F:
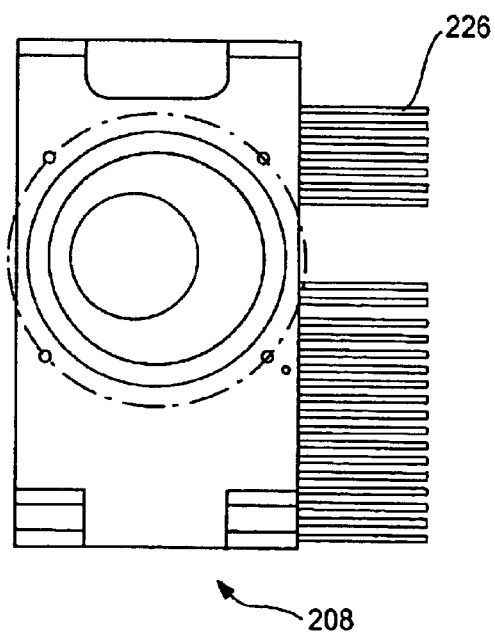

The Power Probe 208 shown in FIGS. 16B, 16E and 16F measures output power of the beam prior to exiting the laser in order to calibrate the Photo Detector. The power calibration is not required on a shot to shot basis. It can be inserted into the beam path whenever desired in order to measure the power. The Power Probe utilizes the Molectron PM-1174 Molectron, Inc., Portland, Oreg. which is repackaged into a housing which provides a thermal interface to the shutter.

Shutter

The shutter 210 is used to stop light from exiting the laser. Light enters a cavity within the shutter where the power is absorbed onto Nickel plated alumina surfaces. Nickel is used due to the excellent power absorption properties and the inherent cleanliness of this surface. The power absorbed is transferred to heat, which is imparted into the Power Probe housing through a fin interface. To assist in heat removal holes are drilled between the fins and purge gas is fed through the fins from N2 purge shown at 212 in FIG. 16B.

The Shutter 210 is mounted to a Shutter Carriage at two points which are designed to be as small as possible in order to reduce heat transfer to the Shutter Carriage. Shutter Carriage carries the shutter on rails 216 and 218. The Shutter Carriage is made of Invar which has low coefficient of thermal expansion. The result is a design that reduces the loading on the bearing assembly at elevated temperatures and avoids binding of the bearings. FIG. 16C shows how the laser beam is captured by the shutter. The beam enters the shutter as shown at 214 and is required to make five reflections to exit the shutter. But at each reflection 90 percent of the energy is absorbed since the reflecting surfaces are coated with nickel which is very highly absorbent of these wavelengths of ultraviolet light.

Actuation of the Shutter and Power Probe

The Shutter and Power Probe slide on rails 216 and 218 as shown in FIG. 16B and are connected through push rods to pneumatic cylinders. The Shutter utilizes the 3 position Bimba cylinder, part number CTE-00425-A and the Power Probe utilizes a 2 position Bimba cylinder, part number CTE-00426-A Bimba, Inc. with offices in Monee, Ill. Each cylinder incorporates a return spring that ensures if power or gas is lost to the module that the Probe if inserted will remove to the stowed position and Shutter will return to the closed position, guaranteeing and fail-safe condition being met if the laser is firing.

The Shutter has 3 states, these being open, closed and stowed. Movement of the cylinder between open and close and close and open is proved by a 5-port 3-position solenoid valve mounted to the module as shown at 220 in FIG. 16A. The solenoid valve assembly is manufactured by Ross Controls with offices in Livonia, Ga., part number 2877A1120C. Control of the shutter open and close function is provided at the module to reduce the shutter speed, a function critical to customers and required to be below 200 ms.

The Laser Gas Management Sub-System provides the valves necessary to move Shutter to the stowed position and insert the Power Meter. The Shutter is stowed in order to allow the Power Probe to be inserted.

The position of the Shutter and Power Probe is achieved with the use of limit switches. The positional states are linked to the Control System where software code ensures that the speed requirement is being achieved and collisions are avoided between the Shutter and Power Probe.

Figure 16G:
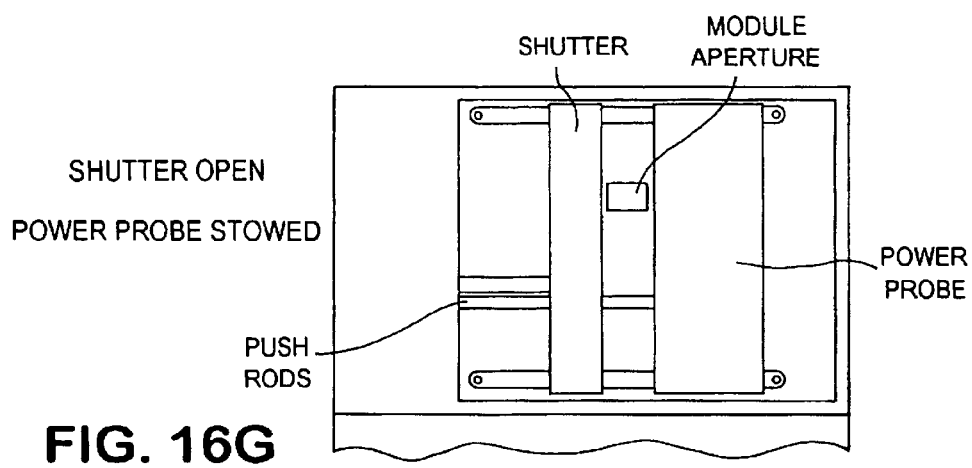
Figure 16H:
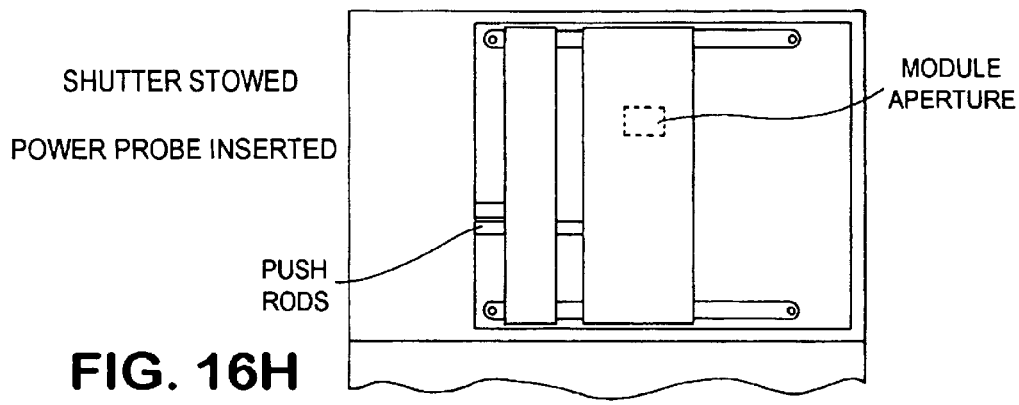
Figure 16I:
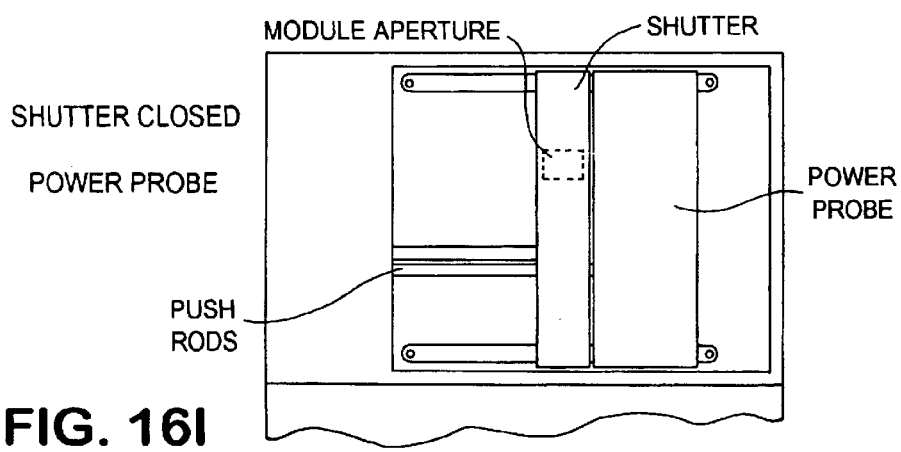

FIGS. 16G, H and I show the various positions of the shutter and power probe. In FIG. 16G the shutter is open as for normal laser system operation. In FIG. 16H the shutter is slowed and the power probe is in position so that the full laser beam is captured in power probe 208 and the energy of the laser beam is monitored. Water flow from the probe through cooling water line 222 maintain the temperature at equilibrium for beam energy. FIG. 16I shows the power probe stored and the shutter closed. In this case the shutter captures the entire laser beam which could be as high as 40 watts. The shutter is extremely light weight yet is able to dissipate all of this power, most of it through 21 cooling fins 224 which in this view are integrated with corresponding fins 226 of power probe 208. The heat then is removed from power probe 208 by cooling water through flexible cooling water line 222.

OTHER IMPROVEMENTS

Fixed Energy Output

In general all optics in the beam path from the gain medium to the silicon wafer degrade over time generally as a function of intensity of the light in each pulse and the number of pulses. However, because of major improvements over the past few years that degradation is slow and is typically measured in billions of pulses. Still, the degradation is significant since, at 4000 Hz, a round-the-clock operation at a 15 percent duty factor, a lithography system will accumulate a billion pulses in a about three weeks. For this reason maintaining constant beam quality can be a challenge. In the past this effort to maintain consistent beam quality over the life of the components of the lithography system has been complicated by the fact that laser beam quality for most laser control functions was measured at the output of the laser system, just downstream from the output coupler. The present invention greatly moderates this problem by providing direct pulse-to-pulse feedback control at the input port of the scanner machine and by supplying the beam delivery unit as a part of the laser system. In this preferred embodiment the beam delivery unit is combined with the above described MOPA system which produces about two to three times the pulse energy as the current state-of-the-art lithography light sources with a reduction in pulse intensity and with substantial improvements in beam quality. Therefore, with this arrangement the present invention provides illumination meeting the requirements of the operator of the stepper machine with beam quality and intensity unchanged over the lifetime of the lithography system despite substantial degradation of optical components throughout the length of the beam path. This can be accomplished by intentionally operating the laser system to provide a desired nominal performance at all stages of equipment life.

Techniques for Decreasing Pulse Energy

Figure 5:
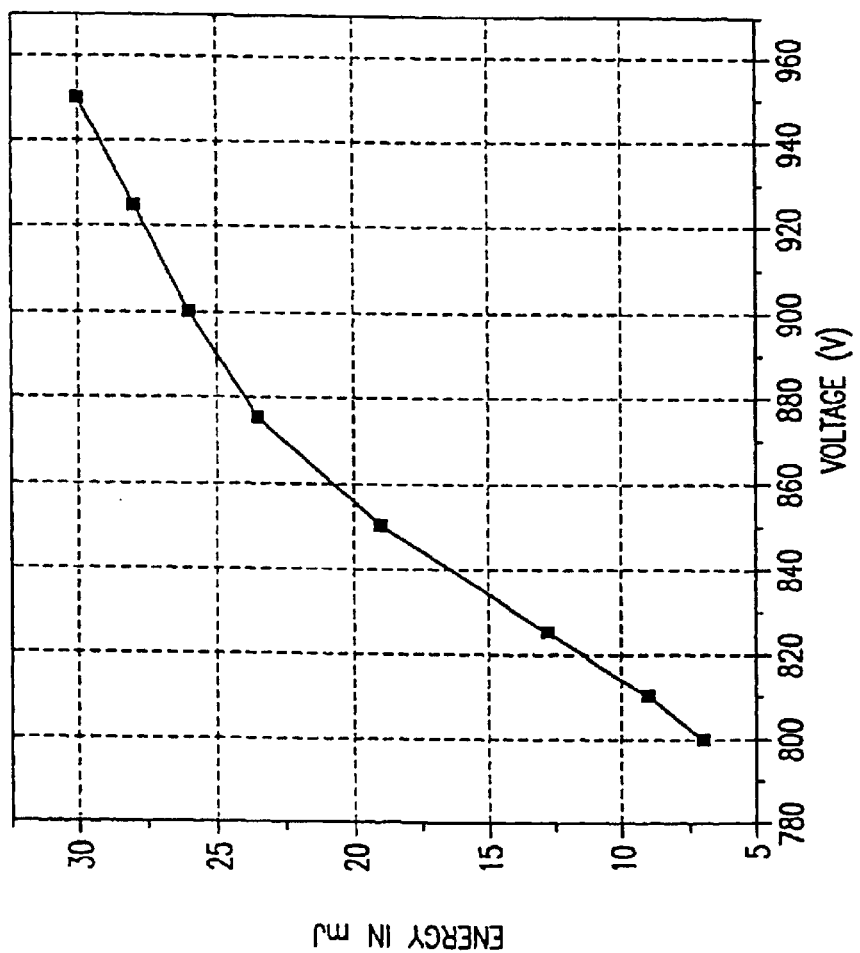
FIG. 5 is a graph of pulse energy versus charging voltage.

Techniques for intentionally decreasing pulse energy include the usual technique of reducing discharge voltage or also reducing gas pressure of fluorine concentration. Some energy reduction can be provided with these two techniques, but beam quality can be adversely affect if these techniques are used to the extent that the gain medium is at less than its saturation range. Beam attenuation is another possibility. This means that in the early stages of equipment life when all components are new, the laser may be operated so as to produce illumination with less than optimum quality and intensity, but quality and intensity values can be maintained constant (if desired) throughout the life of the lithography system. This approach can substantially increase the useful life not only of the very expensive laser system but also the much more expensive stepper machine. FIG. 5 is a plot of charging voltage vs. pulse energy output for a prototype MOPA laser system built and tested by Applicants. This chart shows that the laser system output can be varied between about 7 mJ to 30 mJ merely by charging the charging voltage. For example, if a nominal operating parameter is 15 mJ, the graph in FIG. 5 demonstrates that there is plenty of excess capacity in the laser to compensate for optics degradation over a long equipment lifetime.

Another technique for reducing the pulse energy output while maintaining (or even improving) beam quality is to add a little xenon to the laser gas. Oxygen has also been used in the part to improve beam quality. These additives such as xenon or other noble gases and oxygen are known to improve beam quality and to stabilize output (see U.S. Pat. Nos. 5,982,800, 6,014,398 and 6,188,710 which are herein incorporated herein by reference), but these additives have not in the past been used for the purpose of reducing output or maintaining it at a desired level. Since the maximum MOPA output in this embodiment is 30 mJ per pulse (up to about 40 mJ/pulse) compared to present state-of-the-art laser systems with maximum output of about 10 mJ, major lifetime improvements are expected using the above-described plan.

Beam Path Purge

Figure 8F:
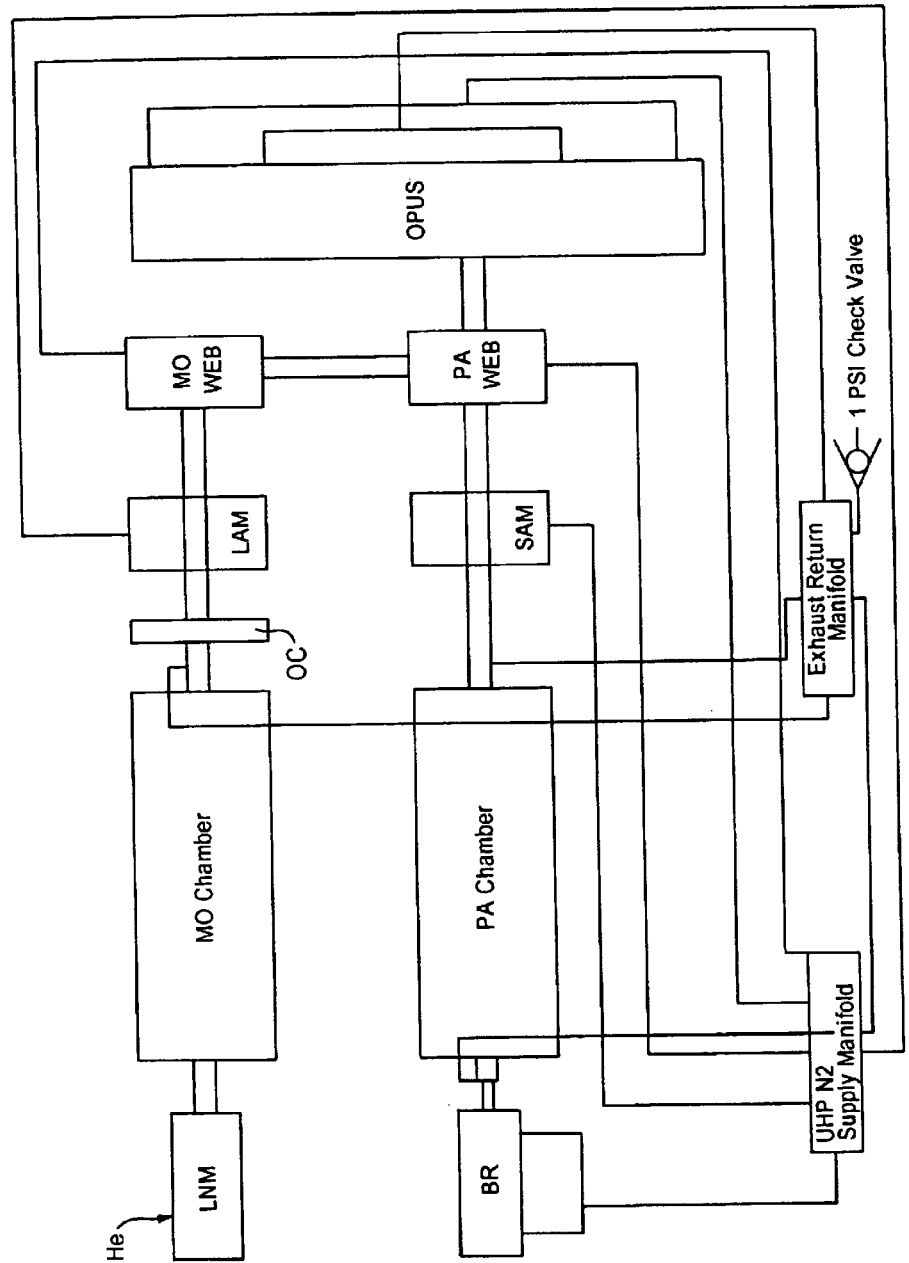

In this preferred embodiment all portions of the beam path outside the laser chambers are purged with $N_2$, with three exceptions: (1) The line narrowing package and the portion of the path between laser chamber 8C and the LNP is purged with helium, (2) the etalon chambers in the LAM, SAM and BAM for measuring wavelength and bandwidth are sealed chambers and (3) as discussed above and below it may be necessary to enclose some optical components exposed to high pulse intensities in an environment containing fluorine. FIG. 1 shows a purge gas supply at 42 but the purge lines are not shown. Excellent examples of purged beam paths are described in detail in U.S. patent application Ser. No. 10/000,991 which is incorporated by reference herein. This technique includes metal bellows and easy sealing vacuum quality seals at interfaces between the vibrating chambers and the sensitive laser optics and vacuum quality seals at interface between all separate modules permitting quick separation of the modules to permit fast module removal for maintenance or for service. FIGS. 8A through E show drawings of preferred easy sealing bellows seals unit with parts 93A, B and C useful for making connection for components in the beam path from the LNP to the scanner. Either of the clamps shown in FIGS. 8C and 8E can be used to clamp parts 93A and 93B together with the tin coated metal C-seal sandwiched in between. FIG. 8D shows a cut-away of the assembled seal unit. The seals in the seal units are metal "C" seals preferably with a tin contact layer. The metal seals do not deteriorate or out gas contamination under ultraviolet irradiation. All modules along the beam lines are enclosed with a total leak rate of less than 0.01 sccs. To minimize back diffusion of air into the purged volume, all exhaust lines lead to a sealed manifold, which exhaust through a check valve. This arrangement ensures a constant overpressure throughout the purged volume of about 115 kPa. To avoid "dead" volumes (not purged or inadequately purged volumes) in the purge system, several input and output purge ports are positions at selected locations as shown in FIG. 8F. During laser operation at all times the entire beam path remains sealed and purged. To ensure good purge during the alignment process at various locations along the beamline alignment targets can be moved in the nominal beam position remotely controlled without breaking the seal. The beam position can be viewed through sealed viewports.

Beam Path Monitor

Preferably monitors are provided to assure the quality of the laser beam path since contamination of the path with absorbers such as oxygen can substantially affect beam quality and pulse energy. Preferably several purge paths will be provided. Flow monitors can be used to monitor purge flow; however, other monitors may also be provided such as $O_2$ monitors which are commercially available from several suppliers. Another beam path quality monitors includes an acoustic monitor utilizing a electret electronic microphone available from suppliers such as Audio Products with offices in Dayton, Ohio. This type of monitor is described in U.S. patent Ser. No. 10/000,991 which is incorporated by reference herein. In preferred embodiments these monitors are used to provide signals which may be used by the lithography operator to delay fabrication after a shutdown until the beam path purge has sufficiently cleared the beam path of contamination.

Beam Profile Flipping

For integrated circuit fabrication coherence of the laser beam is undesirable. Excimer laser beams characteristically have poor coherence which is one of the many reasons why this light source is good for integrated circuit fabrication. However, as other aspects of the beam quality continue to get better, even the poor coherence of the laser beams from these lasers may not be poor enough. If that turns out to be the case a coherence scrambler can be added. It could be added at several places in the beam path. A good place for it would be anywhere in the beam delivery unit.

Figure 9:
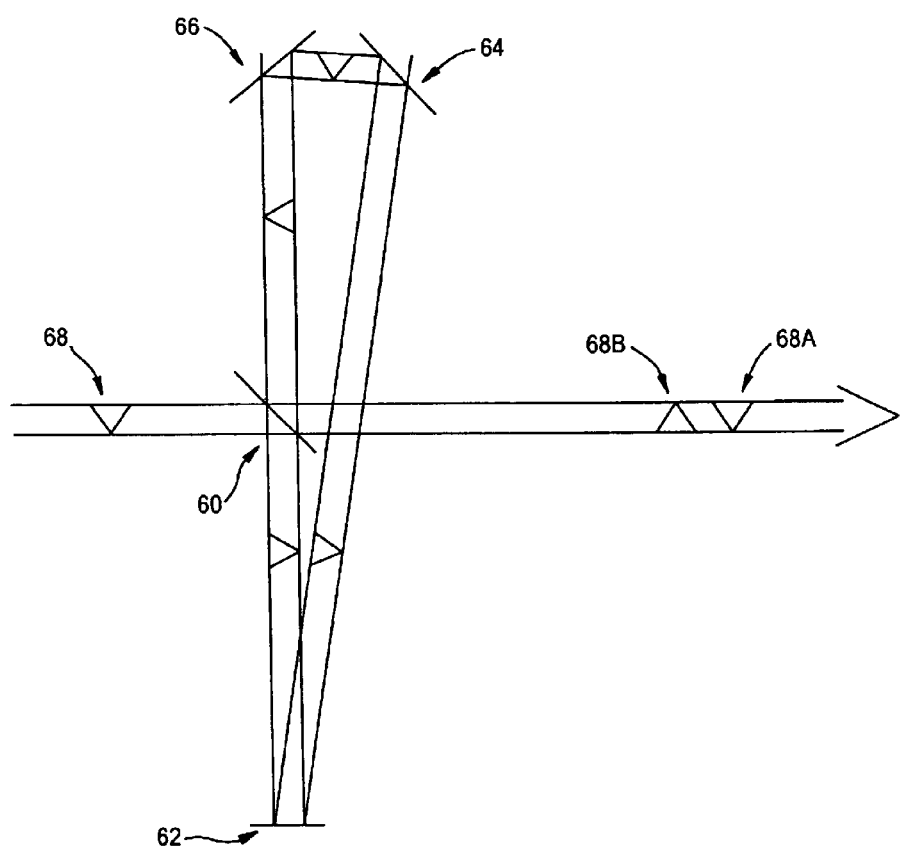
FIG. 9 demonstrates a feature of a preferred pulse stretcher.

FIG. 9 shows an example of a beam profile flipping coherence scrambler. This is produced with a 60 percent beam splitter 60 and three maximum reflection mirrors 62, 64, and 66. This arrangement segregates the pulse into segments in a manner similar to the pulse stretcher discussed above. But with this configuration the profile of each segment is flipped with respect to the preceding segment. In the FIG. 9 example the profile of the incoming pulse 68 is represented with a triangle with a point at the bottom. The first segment, 40% pulse intensity of the passes through with the same profile as shown at 68A. The reflected portion suffers reflection at each of the mirrors and 60 percent of it is reflected from beam splitter 60 that segment has a profile shown at 68B which is flipped with respect to profile 68A. As subsequent segments pass through the coherence scrambler their profiles are each flipped with respect to the preceding segment. Thus, the net profile of the beam will be scrambled and more importantly any coherence will also be scrambled. The reader should note that in this embodiment there will be no significant pulse stretching unless the legs are long enough to provide significant delays of the segments following the first one. Since we have already stretch the pulse as described above the legs here could be very short such as a few inches in which case the segments will overlap each other.

UV Opaque Coating for O-Ring Protection

In several places in the system shown in FIG. 1 optical components are held in place or sealed with a O-ring or other materials which degrade under UV radiation. As the laser beam passes through the optical element some of the light reflects several times internally within the optic and ends up being absorbed in the UV sensitive material producing degradation. This can be avoided by providing a UV opaque coating (not subject to UV degradation) on the optic at locations which are in contact with the sensitive material. Protective coatings include, aluminum, $Al_2O_3$, $ScO_2$. Applicants have used an aluminum coating on the bottom of prisms to protect epoxy holding the prisms in position in the LNM shown at 8B in FIG. 1. In LAM 7, the SAM 9 and the BAM 38 as shown in FIG. 1, etalons are used for wavelength and bandwitdth monitoring. The etalon plates are held in place in the etalon aluminum housings with three small dots of RTV glue. To protect this glue from degradation the edge of the etalon plates at the location of the glue dots should be coated as described above.

Pulse Energy Detection at Wafer Plane

In preferred embodiments of the present invention a pulse energy detector 44 is provided at wafer plane 46 in the scanner. Pulse energy signals this detector may be used in a feed back loop to control the energy output of the laser directly. Alternatively, the signals may be used for the purpose of determining pulse energy parameters as measured at the BAM or the SAM which will provide the illumination needed at the wafer plane.

Optics Monitor

The output pulse energy of preferred embodiments of the present invention produces pulse energies approximately twice as large or greater than state-of-the-art lithography lasers currently in use. Repetition rates are at least as great or greater than this state-of the-art-lasers. These pulse energies and repetition rates pose potential danger to optical components such as mirrors, lenses and prism used in the laser system and downstream of the laser. If when and if these components degrade or fail they adversely affect beam quality. However, with many optical components in the beam, finding the deteriorated optic may be difficult. One preferred solution to this issue is to attach a thermocouple to the optical components to permit easy monitoring of the temperature of the component.

The signals from the thermocouple may be read periodically by a data acquisition computer which may be programmed to provide a warning if temperatures exceed a predetermined threshold. A preferred attachment technique is to attach the thermocouple to the back of the mirror with solder or an epoxy. Alternatively, the thermocouple may be attached to the edge of lenses and prisms or to the lens or prism mounts.

Various modifications may be made to the present invention without altering its scope. Those skilled in the art will recognize many other possible variations.

For example, although the novel features of this invention, is described using a MOPA laser configuration, a single chamber laser system such as described in U.S. patent application Ser. No. 09/854,097 could make use of the improvements described herein, especially if pulse energies exceed 5 mJ and these improvements may be necessary if pulse energies exceed 10 mJ. For lithography either ArF, KrF or $F_2$ systems could be utilized. The optical components and techniques described herein may also be applied to uses other than lithography in which other ultraviolet wavelength may be more appropriate. An important improvement here is the addition of equipment to a laser system to deliver an ultraviolet laser beam having desired beam qualities to an input port of a equipment needing an ultraviolet laser light source. Other techniques to improve the resistance of $CaF_2$ and $MgF_2$ optics to surface damage include use of a known process called "rapid thermal process" in which the optic surface is heated quickly with an RTP lamp in a sealed chamber. Applicants' propose the addition of a quantity of $F_2$ (of for example 1%) in the sealed chamber during the PTP procedure. Applicants also propose use of $F_2$ gas additive or a fluorine containing gas (such as $SiF_4$ or $NF_3$) in coating chambers when optics are being coated to help protect the cooling and the substrate. Various feedback control arrangements other than those referred to herein could be used. Many other laser layout configurations other than the one shown in FIG. 1 could be used. For example, the chambers could be mounted side-by-side or with the PA on the bottom. Also, the second laser unit could be configured as a slave oscillator to produce a MOPO system by including an output coupler such as a partially reflecting mirror. Additional pulse stretching could be accomplished using additional mirrors and beam splitter in unit 12 shown in FIG. 1 or another pulse stretcher unit similar to unit 12 but with longer delay lines could be added in series with unit 12. Other variations are possible. Fans other than the tangential fans could be used. This may be required at repetition rates much greater than 4 kHz. The fans and the heat exchanger could be located outside the discharge chambers. The fluorine gas needed to protect the surfaces of the optical components could be provided using a fluorine generator. Also, a fluorine trap preferably is provided as part of any purge system used to purge the enclosures containing the protective fluorine gas. These traps are well known and have been used for many years to trap fluorine in exhausts from discharge chambers.

Accordingly, the above disclosure is not intended to be limiting and the scope of the invention should be determined by the appended claims and their legal equivalents.

We claim:

1. A modular, high fluence, high repetition rate ultraviolet laser system for a production line machine comprising:
   A) a laser source for producing ultraviolet laser beams at wavelengths less than 200 rm comprising:
      1) a first discharge chamber containing;
         a) a first laser gas and
         b) a first pair of elongated spaced apart electrodes defining a discharge region,
      2) a gas circulation means for producing sufficient gas velocities of said first laser gas in said first discharge region to clear from said discharge region, following each pulse, substantially all discharge produced ions prior to a next pulse when operating at a repetition rate in the range of at least 2,000 pulses per second,
      3) a heat exchanger system capable of removing heat energy from said first laser gas, so as to maintain laser gas temperature within a desired range, and
      4) a pulse power system providing electrical pulses to said first pair of electrodes sufficient to produce laser pulses having pulse energies greater than 10 mJ, and average pulse intensities greater than $1 \times 10^{-6}$ Watts/cm$^2$ at locations immediately downstream of said discharge region,
   B) pulse energy density reducing optical components comprising at least one crystal fluoride optical component for reducing the pulse energy density to less than $25 \times 10^{-6}$ J/cm$^3$.

2. The system as in claim 1 wherein said pulse power system provides electrical pulses sufficient to produce laser pulses average pulse energies in excess of 15 mJ.

3. The system as in claim 1 wherein said laser pulses immediately downstream of said discharge region have average pulse intensities greater than $1.8 \times 10^6$ Watts/cm$^2$.

4. The system as in claim 2 wherein said laser pulses immediately downstream of said discharge region have average pulse intensities greater than $2.75 \times 10^6$ Watts/cm$^2$.

5. The system as in claim 4 wherein pulse power of said laser pulses immediately downstream of said discharge region is in excess of $7.5 \times 10^5$ Watts/cm$^2$.

6. The system as in claim 1 wherein said at least one crystal fluoride optical component is a plurality of optical components each comprised of calcium fluoride.

7. The system as in claim 1 and pulse energy density reducing optical components comprise at least one crystal fluoride optical component enclosed within an enclosing chamber containing fluorine gas.

8. The system as in claim 7 wherein the enclosing chamber is said first discharge chamber.

9. The system as in claim 7 wherein the expander is enclosed within a downstream enclosing chamber downstream of said first discharge chamber.

10. The system as in claim 7 wherein said at least one crystal fluoride optical component comprises at least one prism beam expander.

11. The system as in claim 7 wherein said fluorine gas is a part of a gas mixture and comprises less than 0.1 percent of said mixture.

12. The system as in claim 9 wherein said downstream enclosing chamber is purged with a purge gas comprising fluorine.

13. The system as in claim 12 wherein said fluorine is in the form of $F_2$ gas.

14. The system as in claim 12 wherein said fluorine is in the form of a gas molecular compound comprising fluorine.

15. The system as in claim 12 wherein said molecular compound is chosen from a group consisting of: $NH_4F \cdot HF$, $SF_6$, $CCl_3F$, $C_2Cl_2F_4$, $SiF_4$, $CF_4$, $NF_3$ and $COF_2$.

16. The system as in claim 15 wherein said molecular compound is $SiF_4$.

17. The system as in claim 16 wherein said $SiF_4$ in contained in a mixture along with helium and said $SiF_4$ concentration is 1.0 ppm or greater.

18. The system as in claim 10 wherein said fluorine gas comprises less than 4 ppm in said mixture.

19. The system as in claim 10 wherein said fluorine gas comprises less than 0.8 ppm in said mixture.

20. The system as in claim 1 wherein said pulse energy density reducing optical components comprises a pulse stretching unit.

21. The system as in claim 1 and further comprising a second discharge chamber and optical components defining a resonant cavity for producing a seed beam for amplification in said first discharge region.

22. The system as in claim 21 wherein said pulse energy density reducing optical components comprise optical components for focusing said seed beam near a first end of said first discharge region so as to produce beams which are expanding while being amplified on their final pass through said discharge region.

23. The system as in claim 22 and wherein said first discharge chamber comprises an elongated output window unit comprising an output window located at least 20 cm downstream of the first discharge region.

24. The system as in claim 22 and wherein said first discharge chamber comprises an elongated output window unit comprising an output window located about 55 cm downstream of the first discharge region.

25. The system as in claim 22 wherein said first discharge region defines a discharge direction located along central positions between said first pair of elongated electrodes and said seed beam makes two passes through said first discharge region, said first pass defining a path angled with respect to and crossing said discharge direction and said final pass through said discharge region is along said discharge direction.

26. The system as in claim 21 wherein said first and said second chambers are configured to produce a MOPA laser system.

27. The system as in claim 21 wherein said first and said second chambers are configured to produce a MOPO laser system.

28. The system as in claim 21 wherein said system is configured to produce pulses having energies of at least 10 mJ.

29. The system as in claim 21 wherein said system is configured to produce pulses having energies of at least 15 mJ.

30. The system as in claim 21 wherein said system is configured to produce pulses having energies of at least 30 mJ.

31. The system as in claim 21 wherein said system is configured to produce pulses having energies of at least 40 mJ.

32. The system as in claim 21 and further comprising a pulse stretcher unit to increase duration of output pulses producing a stretched pulse in which $t_{IS}$ of the stretched pulse is at least doubled as compared with unstretchable pulses from the first discharge region.

33. The system as in claim 32 wherein said pulse stretcher comprises a beam splitter, four mirrors, two of which are focusing mirrors and two of which are collimating mirrors.

34. The system as in claim 33 wherein said beam splitter is coated and oriented to reflect about 60 percent of incoming laser beams.

35. The system as in claim 33 wherein said beam splitter is cut so that its front and rear surfaces are parallel with a major cubic crystal plane and oriented so that all directions of propagation through the beam splitter is parallel to a major cubic crystal plane.

36. The system as in claim 33 wherein said beam splitter is a $CaF_2$ with front and rear surfaces cut parallel to a (100), (010), (001) crystal plane and said beam splitter is oriented so that planes of propagation of each portion of laser beams traversing the beam splitter traverses the beam splitter parallel to a (100), (010), or (001) crystal plane.

37. The system as in claim 21 wherein said pulse stretcher unit comprises focusing means to minimize varying divergence in different portions of the stretched pulse.

38. The system as in claim 37 wherein said beam splitter is comprised of $CaF_2$.

39. The system as in claim 21 wherein said first discharge chamber is a power amplifier and further comprising relay optics to provide two passes of said seed beam through the first discharge region of said power amplifier.

40. The system as in claim 21 wherein system is an ArF laser system operating at wavelengths of about 193 nm and said first laser gas comprises argon, fluorine and at least one buffer gas.

41. The system as in claim 21 wherein said system is fluorine laser system operating at wavelengths of about 157 nm and said first laser gas comprises fluorine and a buffer gas.

42. The system as in claim 21 and further comprising a line narrowing unit for reducing spectral bandwidth of laser light produced in said second discharge chamber said line narrowing unit comprising a multi-prism beam expander, wherein each prism in said multi-prism beam expander comprises at least one surface cut on a (100), (010), or (001) crystal plane and is oriented so that laser beams traversing from said second discharge chamber toward a line narrowing grating exits the prism approximately perpendicular to said (100), (010), or (001) plane.

43. The system as in claim 1 wherein said crystal fluoride optical component comprises a protective coating to protect against surface damage produced by intense ultraviolet laser pulses.

44. The system as in claim 43 wherein said coating contains trapped fluorine atoms.

45. The system as in claim 43 wherein said coating is comprised of silicon oxyfluoride.

46. The system as in claim 43 wherein said crystal fluoride optical component is exposed on a first surface to fluorine gas and is not exposed on a second surface to fluorine gas and said protective coating is applied to said second surface and not applied to said first surface.

47. The system as in claim 1 wherein said crystal fluoride optical component is comprised of $MgF_2$.

48. The system as in claim 1 wherein said at least one crystal fluoride optical component comprises a $CaF_2$ prism beam expander located in a laser chamber window housing.

49. The system as in claim 48 wherein said prism beam expander is a two prism beam expander defining a first prism and second prism.

50. The prism system as in claim 48 wherein said second prism is a part of a window unit and said second prism functions as an output window of said discharge chamber.

51. The system as in claim 1 wherein said first discharge chamber comprises an elongated output window unit with a $CaF_2$ output window defining a downstream surface, said unit being elongated enough to permit natural divergence of the output beam to increase the beam cross-section sufficiently to reduce the pulse energy density enough to avoid surface damage on the downstream surface of the output chamber window.

52. The system as in claim 1 wherein said at least one crystal fluoride optical component is a $CaF_2$ output window oriented so that a normal to a surface of said window makes an angle of about 70 degrees with a direction of said laser beam exiting said first discharge region.

53. The system as in claim 1 wherein said first discharge chamber comprises an elongated output window unit with a $MgF_2$ output window defining a downstream surface, said unit being elongated enough to permit neutral divergence of the output beam to increase the beam cross-section sufficiently to reduce the pulse energy density enough to avoid surface damage on the downstream surface of the output chamber window.

54. The system as in claim 1 wherein said crystal fluoride optical component is polished using polishing compounds, polishing forces and polishing tools to reduce defects and roughness on crystal surfaces sufficiently to avoid surface damage.

55. The system as in claim 1 wherein said at least one crystal fluoride optical component comprises a two prism $CaF_2$ beam expander for expanding the beam cross-section by a factor of four.

56. The system as in claim 1 and further comprising relay optics comprising at least one TIR prism and at least one TIR beam reverser.

57. The system as in claim 21 wherein said relay optics comprise at least two TIR prism and at least one TIR beam reverser.

58. The system as in claim 57 wherein both of said at least two TIR prisms are adjustable in tip and tilt for alignment of the seed beam.

59. The system as in claim 57 wherein at least one of said TIR prisms is tilted with respect to an incident beam by approximately 1 degree.

60. The system as in claim 1 and also comprising a beam delivery unit comprising an enclosed beam path to a beam input port of a production line machine.

61. The system as in claim 60 wherein said production line machine is lithography machine that is a part of integrated circuit production line.

62. The system as in claim 60 wherein said production line machine is a scanner machine.

63. The system as in claim 60 wherein said beam delivery unit comprises two beam pointing mirror units comprising controls for controlling mirror position in tilt and tip.

64. The system as in claim 63 wherein said controls comprise for each mirror at least one piezoelectric drive unit.

65. The system as in claim 64 wherein said controls for each of said two beam pointing mirrors also comprise a pico motor steering unit.

66. The system as in claim 64 wherein each of said piezoelectric drive unit is mounted within a metal casing having a flecture cut in walls of said casing.

67. The system as in claim 64 wherein said beam delivery unit also comprises a beam stabilization module located near said beam input port of said production line machine, and said beam stabilization module comprises at least one photodiode array for monitoring horizontal angle, vertical angle, horizontal position, vertical position of the laser beam at a location at or near said input port.

68. The system as in claim 65 wherein said at least one photodiode array is four separate photodiode arrays.

69. The system as in claim 67 wherein signals from said beam stabilization module provide feedback information to said controls for said beam pointing mirror units.

70. The system as in claim 60 wherein the laser beam defines a polarization direction at all locations downstream of the first discharge chamber and all mirrors in said pulse stretcher and said beam delivery unit are oriented so that an s-polarization direction of each mirror corresponds to the polarization direction of the beam indident on the mirror.

71. The system as in claim 1 wherein said system comprises at least one $CaF_2$ crystal window cut so that laser light traverses said window along a <100>, <010>, or <001> direction and that the window is clocked so that the polarization plane is parallel with one of the <100>, <010>, or <001> directions.

72. The system as in claim 1 wherein all $CaF_2$ and $MgF_2$ optics utilized to manipulate the laser beam exiting said first discharge region is clocked to determine its birefringence as a function of clock position prior to installation and installed in a position chosen to minimize polarization rotation of the laser beam.

73. The system as in claim 1 and further comprising at least one TIR turning prism and at least one beam reversing prism each oriented so that laser beams traverse each of the at least one TIR turning prism and the beam reversing prism in two directions along a crystal axis in directions of <100>, <010>, or <001>.

74. The system as in claim 1 wherein said first discharge chamber comprises a window comprised of C-cut $MgF_2$ which is clocked to determine a clock position which produces minimum polarization rotation.

75. The system as in claim 1 and further comprising at least one uniaxial birefringent crystal prism with a C-axis of the prism oriented such that the incident beam direction is perpendicular to the C-axis and the polarization state of the incident beam is either p-or-s polarized with respect to an incident surface of the prism.

76. The system as in claim 1 and further comprising a high-speed, water-cooled shutter, energy detector module comprising a water-cooled energy detector having detector fins and a high-speed shutter having shutter fins and controls:
 a) for placing the detector in a path of a laser beam to monitor energy of the laser beams and,
 b) for placing said shutter in a path of a laser beam to block the laser beam, with the shutter fins interlaced with said detector fins to provide heat transfer from said shutter to cooling water that is cooling said detector.

77. The system as in claim 1 and further comprising an attenuator means for reducing substantially output energy of said laser beams early in laser system life with the degree of reduction generally decreasing throughout laser system life so as to provide approximately constant energy output over many billions of laser pulses.

78. The system as in claim 1 and further comprising an impurity intentionally added to said laser gas to reduce pulse energy of output beams of said laser system.

79. The system as in claim 60 and further comprising a beam path purge system for purging said sealed enclosed beam path with one or more purge gasses.

80. The system as in claim 79 wherein said purge gases comprise nitrogen.

81. The system as in claim 80 and further comprising a plurality of exhaust lines leading to a sealed manifold comprising a check valve through which purge gases are exhausted to ensure a continuous purge over pressure.

82. The system as in claim 80 and further comprising alignment means for making beam alignments without losing the purge overpressure.

83. The system as in claim 79 and further comprising a beam path monitor for monitoring laser beam absorbers.

84. A system as in claim 1 and also comprising a beam profile flipping means for reducing laser beam coherence.

85. A system as in claim 1 wherein at least one of said crystal fluoride optical component comprises a UV opaque protective coating applied to a surface in contact with degradable material subject to UV degradation wherein said protective coating protects said degradable material from UV radiation.

86. A system as in claim 85 wherein said protective coating is chosen from a group consisting of $Al_2O_3$, $ScO_2$ and said degradable material is either an epoxy or an o-ring.

87. A system as in claim 1 and further comprising an optics monitor comprising a thermocouple attached to an optical element for detecting optical element failure by sensing an unusual temperature rise in said optic.

* * * * *

UNITED STATES PATENT AND TRADEMARK OFFICE
CERTIFICATE OF CORRECTION

PATENT NO. : 6,904,073 B2  Page 1 of 1
APPLICATION NO. : 10/384967
DATED : June 7, 2005
INVENTOR(S) : Yager et al.

It is certified that error appears in the above-identified patent and that said Letters Patent is hereby corrected as shown below:

Title Page; item (75);
On the page 1 of the patent, please correct the following inventors' names:

"William N. Partio" is incorrect and should read --William N. Partlo--
Inventor's named "Richard G. Morton" and "Richard C. Ujazdowski" should be deleted since Applicants timely filed a Petition to Correct Inventorship on October 11, 2004 and the United States Patent Office granted the Petition on March 9, 2005.

In column 39, line 28, delete "rm", insert --nm--
In column 39, line 46, delete "1x10-6", insert --1x10$^6$--
In column 39, line 53, delete "25x10-6", insert --25x10$^6$--
In column 40, line 23, after "4F.HF", insert --4F,--
In column 40, line 27, after "SiF$_4$", delete "in", insert --is--
In column 41, line 44, after "wherein", insert --said--
In column 41, lines 48, 49, after "system is", insert --a--
In column 42, line 15, delete "claim 48", insert --claim 49--
In column 42, line 51, delete "claim 21", insert --claim 56--
In column 42, line 64, after "machine is", insert --a--
In column 43, line 19, delete "claim 65", insert --claim 67--
In column 43, line 29, delete "indident", insert --incident--
In column 44, line 47, delete "ScO2-$_2$", insert --SiO$_2$--

Signed and Sealed this

Twenty-seventh Day of May, 2008

JON W. DUDAS
*Director of the United States Patent and Trademark Office*